United States Patent
Noureldin

(10) Patent No.: US 8,150,559 B2
(45) Date of Patent: Apr. 3, 2012

(54) SYSTEMS AND PROGRAM PRODUCT FOR HEAT EXCHANGER NETWORK ENERGY EFFICIENCY ASSESSMENT AND LIFETIME RETROFIT

(75) Inventor: Mahmoud Bahy Noureldin, Dhahran Hills (SA)

(73) Assignee: Saudi Arabian Oil Company, Uhahran (SA)

( * ) Notice: Subject to any disclaimer, the term of this patent is extended or adjusted under 35 U.S.C. 154(b) by 0 days.

(21) Appl. No.: 13/041,057

(22) Filed: Mar. 4, 2011

(65) Prior Publication Data
US 2011/0178835 A1 Jul. 21, 2011

Related U.S. Application Data

(63) Continuation-in-part of application No. 12/898,475, filed on Oct. 5, 2010, and a continuation-in-part of application No. 12/715,255, filed on Mar. 1, 2010, now Pat. No. 7,873,443, which is a continuation of application No. 11/768,084, filed on Jun. 25, 2007, now Pat. No. 7,698,022, application No. 13/041,057, which is a continuation-in-part of application No. 12/767,315, filed on Apr. 26, 2010.

(60) Provisional application No. 61/356,900, filed on Jun. 21, 2010, provisional application No. 61/256,754, filed on Oct. 30, 2009, provisional application No. 60/816,234, filed on Jun. 23, 2006.

(51) Int. Cl.
*G06F 19/00* (2011.01)
(52) U.S. Cl. ........ 700/299; 700/300; 165/101; 165/203; 165/279
(58) Field of Classification Search .................. 700/299, 700/300; 165/101, 203, 279
See application file for complete search history.

(56) References Cited

U.S. PATENT DOCUMENTS
4,142,108 A 2/1979 Matthews
4,449,571 A 5/1984 Kramert
(Continued)

FOREIGN PATENT DOCUMENTS
CN 101206754 A 6/2008
(Continued)

OTHER PUBLICATIONS

"Keeping down the cost of revamp investment", Martin et al, Revamps and Shutdowns, Petroleum Technology Quarterly, Summer 1999, pp. 99-107.*

(Continued)

*Primary Examiner* — Michael D Masinick
(74) *Attorney, Agent, or Firm* — Bracewell & Giuliani LLP

(57) ABSTRACT

Systems and program product for managing/assessing heat exchanger network energy efficiency and retrofit for an industrial facility, are provided. An embodiment of a system can include a heat exchanger network analysis and design computer and heat exchange network analysis and design program product configured to cause the heat exchange network analysis and design computer to perform various operations including those for determining an optimal heat exchanger network retrofit projects sequence extending between a current heat exchanger network retrofit project satisfying a current desired waste energy recovery goal and a future heat exchanger network retrofit project satisfying the final waste energy recovery goal. The heat exchanger network retrofit projects sequence can be configured so that each subsequent project within the heat exchanger network retrofit projects sequence does not contradict any of the previous projects within the heat exchanger network retrofit projects sequence.

31 Claims, 69 Drawing Sheets

U.S. PATENT DOCUMENTS

| | | | |
|---|---|---|---|
| 5,269,135 | A | 12/1993 | Vermejan et al. |
| 5,517,428 | A | 5/1996 | Williams |
| 5,824,888 | A * | 10/1998 | Dhole .................. 73/112.03 |
| 6,785,633 | B2 | 8/2004 | Patanian et al. |
| 7,103,452 | B2 | 9/2006 | Retsina |
| 7,125,540 | B1 | 10/2006 | Wegeng et al. |
| 7,356,383 | B2 | 4/2008 | Pechtl et al. |
| 7,698,022 | B2 | 4/2010 | Noureldin et al. |
| 7,729,809 | B2 | 6/2010 | Noureldin |
| 7,873,443 | B2 | 1/2011 | Noureldin et al. |
| 2002/0134542 | A1 | 9/2002 | Unsworth |
| 2006/0036417 | A1 | 2/2006 | Wu et al. |
| 2006/0048920 | A1 | 3/2006 | Helleur |
| 2007/0061049 | A1 | 3/2007 | Masuda et al. |
| 2008/0140376 | A1 | 6/2008 | Elgue et al. |
| 2008/0163625 | A1 | 7/2008 | O'Brien |
| 2009/0151321 | A1 | 6/2009 | Jarmon et al. |

FOREIGN PATENT DOCUMENTS

| | | |
|---|---|---|
| JP | 2003016113 | 7/2001 |
| JP | 2002122005 A | 4/2002 |
| JP | 2004272347 A | 9/2004 |
| NZ | 527244 | 7/2003 |
| WO | 0108054 A2 | 2/2001 |
| WO | 2005010783 A1 | 2/2005 |

OTHER PUBLICATIONS

Gundersen et al.; "The Synthesis of Cost Optimal Heat Exchanger Networks"; Computers and Chemical Engineering; vol. 12, No. 6, pp. 503-530 (1988) (28 pages).

Furman et al; "A Critical Review and Annotated Bibliography for Heat Exchanger Network Synthesis in the 20th Century"; Industrial Engineering & Chemistry Research, vol. 41, pp. 2335-2370 (2002) (18 pages).

Canmet Energy Technology Center; "Pinch Analysis: For the Efficient Use of Energy, Water & Hydrogen", Oil Refining Industry—Example of Pinch Application, http://canmetenergy-canmetenergie.nrcan.gc.ca/eng/industriaLprocesseslindustrial_sys (no date) (17 pages).

Aspentech; "Understanding Process and Design Interactions", Sep. 2002 (6 pages).

March, L.; "Introduction to Pinch"; Date unknown (65 pages).

Ravagnani, M.A.S.S., Silva, A.P., Arroyo, P.A., Constantino, A.A.; "Heat Exchanger Network Synthesis and Optimization Using Genetic Algorithm"; Applied Thermal Engineering 25; Jun. 20, 2004; pp. 1003-1017 (15 pages).

De Ruyck et al., "Broadening the Capabilities of Pinch Analysis Through Virtual Heat Exchanger Networks", 44 Energy Conserv. & Mgmt (2003), pp. 2321-2329 (9 pages).

Lagaros et al, "Multi-objective Design Optimization Using Cascade Evolutionary Computations", 194 Comput. Methods Appl. Mech. Eng. (2005), pp. 3496-3515 (20 pages).

Petchers, Neil; "An Integrated Approach to Energy Resource Optimization"; Chapter 8, Combined Heating, Cooling & Power Handbook; Technologies and Applications, The Fairmont Press, Inc., Lilburn, GA (2003) (23 pages).

Serna et al., "An Area Targeting Algorithm for the Synthesis of Heat Exchanger Networks", 59 Chem Eng. Sci. (2004), pp. 2517-2520 (4 pages).

Press, W. H., et al; "Minimization or Maximization of Functions", Ch. 10, Numerical Recipes in Pascal Art of Scientific Computing; Cambridge Univ. Press, G.; Jan. 1, 1989; pp. 274-334 (61 pages).

Lakshmanan et al., "Pinch Location and Minimum Temperature Approach for Discontinuous Composite Curves", 26 (6) Computers & Chem Eng (2002). pp. 779-783 (11 pages).

Matijaseviae et al., "Energy Recovery by Pinch Technology", 22 Appl. Therm Eng. (2002), pp. 477-484 (53 pages).

"Optimization Application: Pinch Technology Analysis". Ch. 9, Optimum Design and Design Strategy (no date), pp. 414-433 (20 pages).

Yeramsetty et al.. "Synthesis of Cost-Optimal Heat Exchanger Networks Using Differential Evolution". 32 Computers & Chem. Eng. (2008). pp. 1861-1876 (16 pages).

Saboo, Alok and Saboo, Mridul; "Optimization of CHP Systems Using Pinch Technology"; SRM University, Chennai India, date not known (20 pages).

Partial File History of U.S. Appl. No. 12/767,217, filed Apr. 26, 2010 (294 pages).

Partial File History of U.S. Appl. No. 12/767,275, filed Apr. 26, 2010 (174 pages).

Partial File History of U.S. Appl. No. 12/767,315, filed Apr. 26, 2010 (167 pages).

* cited by examiner

Utility Flows

| Active | ID | Row Name | Type | Temp. In | Temp. Out | FCP | Enthalpy Min | Enthalpy Max |
|---|---|---|---|---|---|---|---|---|
| Active | 0 | h1 | Hot | 145.00:145.00 | 105.00:105.00 | 0.50:0.50 | 20.00 | 20.00 |
| Active | 1 | h2 | Hot | 195.00:195.00 | 145.00:145.00 | 0.50:0.50 | 20.00 | 20.00 |
| Active | 2 | h3 | Hot | 145.00:145.00 | 115.00:115.00 | 4.67:4.67 | 140.10 | 140.10 |
| Active | 3 | h4 | Hot | 195.00:195.00 | 125.00:125.00 | 1.00:1.00 | 70.00 | 70.00 |
| Active | 4 | c1 | Cold | 100.00:100.00 | 190.00:190.00 | 4.00:4.00 | 360.00 | 360.00 |

UTILITIES WITHOUT INTEGRATION
HEATING 360.00:360.00

UTILITIES WITH INTEGRATION
HEATING 110.00:110.00

COOLING 250.10:250.10

COOLING 0.10:0.10

NETWORK VARIABLES
INTERVAL: 1.00
DELTA T: 0.00

ROMC
MIN. 145.00
MAX. 145.00

Fig. 25

SYSTEMS AND PROGRAM PRODUCT FOR HEAT EXCHANGER NETWORK ENERGY EFFICIENCY ASSESSMENT AND LIFETIME RETROFIT

RELATED APPLICATIONS

This patent application is a continuation-in-part of U.S. patent application Ser. No. 12/898,475, filed Oct. 5, 2010, titled "Systems, Program Product, and Methods For Synthesizing Heat Exchanger Networks That Account For Future Higher Levels of Disturbances and Uncertainty and Identifying Optimal Topology For Future Retrofit," which claims priority to the benefit of U.S. Provisional Patent Application No. 61/356,900, filed Jun. 21, 2010, titled "Systematic Synthesis Method and Program Product For Heat Exchanger Network Life-Cycle Switchability and Flexibility Under All Possible Combinations of Process Variations" and U.S. Provisional Application No. 61/256,754, filed Oct. 30, 2009, titled "System, Method, and Program Product for Synthesizing Non-Constrained and Constrained Heat Exchanger Networks and Identifying Optimal Topoloy for Future Retrofit," and which is a continuation-in-part of U.S. patent application Ser. No. 12/715,255, filed Mar. 1, 2010, now U.S. Pat. No. 7,873,443 titled "System, Method, and Program Product for Targeting and Optimal Driving Force Distribution in Energy Recovery Systems" which is a continuation of U.S. patent application Ser. No. 11/768,084, filed on Jun. 25, 2007, now U.S. Pat. No. 7,698,022, titled "System, Method, and Program Product for Targeting and Optimal Driving Force Distribution in Energy Recovery Systems," which claims priority to and the benefit of U.S. Provisional Patent Application No. 60/816,234, filed Jun. 23, 2006, titled "Method and Program Product for Targeting and Optimal Driving Force Distribution in Energy Recovery Systems," U.S. patent application Ser. No. 12/767,217, filed Apr. 26, 2010, titled "System, Method, and Program Product for Synthesizing Non-Constrained and Constrained Heat Exchanger Networks," U.S. patent application Ser. No. 12/767,275, filed Apr. 26, 2010, titled "System, Method, and Program Product for Synthesizing Non-Thermodynamically Constrained Heat Exchanger Networks," and U.S. patent application Ser. No. 12/767,315, filed Apr. 26, 2010, titled "System, Method, and Program Product for Synthesizing Heat Exchanger Networks and Identifying Optimal Topology for Future Retrofit," and U.S. patent application Ser. No. 12/575,743, filed Oct. 8, 2009, titled "System, Method, and Program Product for Targeting and Identification of Optimal Process Variables in Constrained Energy Recovery Systems; and is a continuation-in-part of U.S. patent application Ser. No. 12/767,315, filed Apr. 26, 2010, titled "System, Method, and Program Product for Synthesizing Heat Exchanger Networks and Identifying Optimal Topology for Future Retrofit," which claims priority to U.S. Provisional Patent Application No. 61/256,754, filed Oct. 30, 2009, titled "System, Method, and Program Product for Synthesizing Non-Constrained and Constrained Heat Exchanger Networks and Identifying Optimal Topology for Future Retrofit; and is related to U.S. patent application Ser. No. 12/480,415, filed Jun. 8, 2009, titled "System, Program Product, and Related Methods for Global Targeting of Process Utilities Under Varying Conditions" and U.S. patent application Ser. No. 13/041,087, filed Mar. 4, 2011, titled "Methods for Heat Exchanger Network Energy Efficiency Assessment and Lifetime Retrofit," each incorporated herein by reference in its entirety.

BACKGROUND OF THE INVENTION

1. Field of the Invention

The present invention relates in general to the field of energy recovery systems, and in particular, to systems, program product, and methods related to energy efficiency assessments of single and multiple utilities, grass-roots new and existing heat exchanger network designs, and current and future retrofit modifications.

2. Description of the Related Art

Many different types of processes consume multiple steam levels and electricity to obtain an output result, or to produce a required product or compound. For large-scale processes that, for example, consume significant amounts of fuel and steam, it is preferable to optimize the consumption of energy through careful operation, design or reconfiguration of the plant and the equipment used. Further, in some industrial manufacturing processes, specific streams of material flows need to be supplied to different types of equipment and machinery at specific temperatures. These material flows may need to be heated or cooled from an original starting or supply temperature to a target temperature. This, in turn, requires the consumption of steam to heat specific streams and consumption of water, for example, to cool down specific streams.

The total energy employed or consumed by the industrial manufacturing processes can be optimized to a global minimal level, for example, through careful placement and configuration of specific material streams with respect to one another. There may be, for example, the potential for hot streams that require cooling to be placed in proximity with cold streams that require heating. Streams having thermal energy already present that need to be removed (waste heat) or streams that need to have heat added can be associated with one another to optimize the energy consumption of the process. A network of heat exchangers (HENS) can be synthesized to provide a medium for utilizing this waste heat to provide heat to those streams that need to have heat added. This heat exchanger network can be a very important subsystem in any new plant.

HEN designs face a high level of operational changes along their lifetime. These changes can be short-term, such as, for example, as a result of process disturbances and/or uncertainty in feed stock conditions and product demand, and can be long-term such as, for example, as a result of the need to process more raw materials that warrants the debottlenecking of components of the facility including the HEN to increase its capacity. Nowadays, and since late seventies of the last century, another important long-term factor has been the continuous escalation in energy prices in a rate that is higher than the rate of increase of plant energy system equipment costs. This relatively continuous escalation in energy costs has prompted a need to periodically modify the facility's HEN to increase the facility's HEN waste energy (quantity and quality) recovery along the lifetime of the facility which can reach 30 or more years.

In such cases, the HEN retrofit objective/task is to produce a practically implementable cost effective HEN design modification that satisfies the new process objective and its new operating constraints. The inventor has recognized that there are many possible modifications for an existing HEN to retrofit the original design to the new objective. They can include one or more of the following: process operating and design conditions modifications, existing HEN topological/structural modifications, and existing HEN unit design modifications and parametric modifications including heat transfer enhancements to improve heat transfer (U), etc.

Theoretically such problem can be solved using optimization, where we have an objective to minimize total cost of the existing HEN modifications and the rest of the plant's process units design and operation modifications minus the realized energy cost saving. Accordingly, the inventor has recognized that it will be very beneficial to the world's waste heat recovery efforts to have systematic process steps that use or employ all possible degrees of freedom identified above to enhance waste heat recovery of any industrial facility, which can be automatically converted to a percentage of debottlenecking in the plant's energy system.

Also recognized by the inventor is that it will also be very beneficial to any industrial facility to have systematic process steps that can use or employ all possible combinations of available degrees of freedom to improve the current efficiency of any facility's HEN now, two years from now, five years from now and so on till the end of the plant lifetime without compromising any retrofit effort done at earlier time. In other words, there is a need for a cost effective way for plant owners to be able to assess and retrofit their HEN at today's energy prices to obtain present energy cost savings, and to do so in such a manner that when decision-makers want to assess and perform another retrofit to save on energy costs, two to three years later due to another increase in energy prices, they can do so without contradicting the actions done in the previous retrofit projects.

Accordingly, recognized is the need for systematic methods, systems, and program product that enable industrial facilities to have the ability to continue modifying their HEN, yet not be handicapped with a situation in which they have no options or only very expensive/unrealistic and/or contradictory retrofit options to be able to capture more waste heat in their production facilities.

Further, recognized is the need for an abstract process that can test the results of any other retrofit method existing today or in the future including the results of mathematical programming models and that can assess its results from both a number of units added and waste energy recovered perspective and to determine whether the HEN has a healthy topology that can allow more retrofit projects in the future. In other words, there is a need for a new systematic method, system, and program product for retrofit-now-with-future-retrofits-in-sight that renders structures capable of continual plant lifetime retrofit for waste heat recovery purposes.

Conventional methods for HEN retrofit use either: the pinch technique and its modifications, the network pinch technique and its enhancements, or mathematical programming techniques. The methods of HEN retrofit that use the pinch design method and its modifications consists of an ad hoc targeting stage followed by a design modification stage. In the ad hoc targeting stage a global $\Delta t\_min$ is assumed and used to set an energy target, and the network is then drawn using a grid diagram. The relative positions of the heat exchangers to an "assumed to be fixed" pinch point resulting from the assumed global $\Delta t\_min$ value is then examined to identify HE units that exchange heat across this "factiously fixed" pinch point (location). In the design modification phase, the heat exchangers and their associated heaters/coolers are relocated semi-systematically/manually relative to the factiously fixed pinch location so that they no longer exchange heat across the location of the factiously fixed pinch point.

In the conventional heuristics-based HEN retrofit methods using pinch technology alone or in combination with mathematical programming model, a pay-back period for a "one-time retrofit" project without future retrofit projects in mind/sight, e.g., two years, is first selected. Next, the required energy to be saved and new heating or cooling loads is determined from composite curves using a global $\Delta T\_min$ that coincides with the location of the process pinch point. The existing network is drawn on what is referred to as a grid diagram where the units working across the process pinch temperature are highlighted. The designer then uses his/her experience to correct the situation of violating the process pinch temperature, relying on an assumption that such changes will not change the pinch location.

Being that the starting of problem/initialization is based upon heuristics, it proceeds without future retrofit projects in mind/sight to a retrofit solution. Using a different starting point, however, will likely result in a completely different network structure retrofit solution. Hence, as many alternative designs of similar performance are possible, it is mandatory to start the retrofit project with the so called "right" initialization global $\Delta T\_min$ value. It is known to one of ordinary skill in the art experienced in the field, that different values of $\Delta T\_min$ will produce different pinch locations which will lead to different network structures. As such, if one starts with the wrong $\Delta T\_min$, the wrong structure will be obtained, and evolutionary heuristics and optimization techniques (NLP) will not lead to the best results since radical moves/changes from one structure to another are not feasible or possible. While this retrofit solution finding is based upon the first law of thermodynamics, it is not conducted in a systematic way to reach the originally defined targets, rather it is an all-at-once-approach (one-time retrofit package). That is, if the designer cannot accept the entire solution structure for one reason or another (e.g., capital needed and/or time for implementation, affect on other process units, etc.) the package will have to be rejected. This can be troublesome as the targets defined for area and investment costs are not rigorous and very crude.

The methods of HEN retrofit that use the network pinch based methods employ procedures to determine the maximum possible waste heat recovery in the network via exploitation of only the network utility path(s)—e.g., through the addition of more HE unit surface area. It is an evolutionary method that repeats the pinching of the network via iteratively minimizing $\Delta T\_min$ between streams in each process-to a process HE unit to zero, to create what is known as a new "assumed fixed" network pinch that does not change its location with process and/or structural modifications. Then using same rules of the pinch technology, HE units that exchange heat across the new factiously fixed network pinch are relocated. Commercial software are currently using such methods complemented by mathematical programming techniques, in form of LP, NLP and MILP to select streams matches, optimize branches flows in the base design networks, and/or help find minimum cost topology modifications to the existing network.

In the network pinch method that uses a mix of mathematical programming models and the network pinch concept, the existing network streams are first forced to pinch the cold composite curve using composite curve or mathematical programming models to locate the so called network pinch. The method then uses the pinch technology rules to find topological modifications such as re-sequencing, introduction of new heat exchangers, streams splits, etc., followed by or interlaced with the employment of a network optimization model for loads/branches flow using NLP techniques. The use of pinch technology rules to find topological modifications in the existing HENs to overcome the so called network pinch, however, is not rigorous since it is based upon the assumption that the network pinch and the process pinch are not going to change its location due to the taken topological modification.

As the assumption is not correct, topological modifications can have counter effects on each other to the extent that they may completely negate the possibility of doing future retrofit projects. That is, it may become impossible to employ a certain retrofit project due its counter effect on the previous projects, and so on, making the retrofit projects in sustainable.

For example, if the current HEN retrofit process is conducted using pinch technology concept including the evolutionary network pinch method, and then if in at least one time at any future network retrofit process a different pinch point location arises, e.g., due to process parametric and/or structural modifications, and if the different pinch point location indicates a need for a lesser minimum number of units than the one used in previous HEN retrofit project, the result may be a wasting of some of the HE units already added in the previous HEN retrofit.

Accordingly, recognized by the inventor is that it would be beneficial to the facility to have a process whereby if the pinch, point for a retrofit project changes its location due to the current and future network retrofit project solutions (including changes to process parametric and structural modifications), such situation would not detrimentally affect the network's topology retrofit. That is, there would be no significant effect on streams matching and/or change in minimum number of units needs previously completed or to be completed in the future, with the exception of the need for enhancing the current network UA as part of the upcoming network retrofit project and the future ones.

Acceptance of the pinch technology method and its modifications has been attributed to the interaction that exists between the designer and the evolving retrofit solution. Such existence of the designer in-the-loop enables him/her to perform an in-depth cost estimation, accepting or rejecting a solution aspect as desired. It also provides a crude targeting phase which can help inform plant managers about the merits of conducting HEN retrofit project before starting the retrofit exercise, and it can accommodate many degrees of freedom for the retrofit solution, which are generally too expensive to be practically considered in the mathematical programming approach (e.g., using the MINLP model) especially for an industrial size problem.

Acceptance of the network pinch method, adopted in commercial software such as SPRINT, has been attributed to its ability to enable the user to search for the possible retrofit action automatically to determine the required topology modification. Further, using mathematical programming models, the software employing the network pinch method conducts an optimization stage for fixed topology to exploit utility path(s), best load allocation on existing units, and branches flow distribution. It employs an evolutionary approach to retrofit the HEN using several mathematical programming models, and the network pinch concept to guide the search for retrofit solutions. Such use, however, is crude, based upon heuristics, and is not rigorous (repeatably accurate).

Although, as noted previously, most commercial software are currently using mathematical programming techniques to complement other methodologies, pure mathematical programming techniques have been less well received, particularly in the industry community. Mathematical programming techniques are typically conducted in one stage using MINLP or in two stages using MILP followed by NLP using a superstructure that embeds "all possible solutions" with a cost-based objective function consisting of cost correlations to identify the retrofit solution. Mathematical programming techniques use a deterministic search method and heuristic/approximating search methods employing, for example, Genetic Algorithms, Tabu search, simulated annealing algorithms and hybrid methods to find the global solution of the retrofit problem. It is expected that if accurately embedded in the problem superstructure, the mathematical programming technique can provide for the simultaneous consideration of "all possible modifications."

Such methods above are referenced in the following papers: Tjaan N. Tjoe and Bodo Linnhoff, "Using pinch technology for process retrofit", Chemical engineering, pp 47-60, April (1986); N. Asante and X. X. Zhu, "An automated and interactive approach for heat exchanger network retrofit", Transactions of Institution of Chemical Engineers, vol. 75, part a, pp. 349-360, (1997); Amy Ciric and Christodoulos Floudas, "A mixed integer non-linear programming model for retrofitting heat exchanger networks", Industrial & Engineering Chemistry Research, vol. 29, pp. 239-251, (1990); T. Gundersen and L. Naess, "The synthesis of cost optimal heat exchanger networks", Computers and Chemical Engineering, vol. 12, pp. 503-530 (1988); Kevin C. Furman and Nikolaos v. Sahinidi, "A critical review and annotated bibliography for heat exchanger network synthesis in the $20^{th}$ century", Industrial & Engineering Chemistry Research, vol. 41, pp. 2335-2370 (2002); R. Smith, M. Jobson and I. Chen, "Recent development in the retrofit of heat exchanger networks", Chemical Engineering Transactions, vol. 18, pp 27-32 (2009); E. Rezaei and S. Shafiei, "Heat exchanger networks retrofit by coupling genetic algorithm with NLP and ILP methods", computers and chemical engineering, vol. 33, pp 1451-1459, 2009; and R. Smith, M. Jobson and I. Chen, "Recent development in the retrofit of heat exchanger networks", Applied Thermal Engineering, vol. 30, pp 2281-2289 (2010).

Each of the above described existing methods have some significant disadvantages. For example, in the most widely used pinch technology method and its modifications, the method is non-systematic and involves heuristics that produce solutions whose quality depends entirely on the designer experience in applying such heuristics—i.e., the global $\Delta T\_min$ should be used in determining the location of the pinch for an assumed best global $\Delta T\_min$. However, as the value of assumed best global $\Delta T\_min$ changes, the location of the pinch point changes, and therefore, the assessment of which HE units transfer heat across the pinch also changes, making the proper selection critical. The same also applies with respect to process changes that result in the same output. Further, retrofit is provided as a one package solution that has no consideration for step-by-step modifications and practicality for future retrofit projects. Employment of a heat exchanger(s) having a larger surface area during a later retrofit to reduce $\Delta T\_min$ can result in a network having one or more heat transfers which cross the pinch.

Accordingly, the inventor has recognized that such methodology is not systematic, requiring iteration, and that pinch method initialization using an assumed best global $\Delta T\_min$ is ad hoc, and thus, such methodology could not be used as a standard method for plant-lifetime retrofit. The inventor has also recognized, through analysis of designs provided by the network pinch method, for example, that the network pinch method can also result in a network having one or more heat transfers which cross the pinch during a later retrofit. This is because the method incorrectly assumes that changes in topology of a process HEN will not affect the process pinch and that any topology change which only creates an opportunity to load the network pinch will not increase the R_max. In fact, through detailed analysis, the inventor has found that both parameters can change. Accordingly, such methodology could also not be used as a standard method for plant-lifetime retrofit.

The mathematical programming-based methods also have significant disadvantages. For example, the mathematical programming-based methods provide little or almost no scope for user interaction. Although it is currently possible to solve larger problems than before utilizing such methods, the current capacity is still not to the scale needed in many industrial applications. The problem of the HEN retrofit is mathematically considered to be NP-hard. As such, the inventor has recognized that including all possible process design modifications, different types and configurations of HE units and so on in the superstructure is impractical and will make the problem harder, intractable and impossible to solve.

In addition, the MINLP model cost objective function needs comprehensive data for the model solution to be realistic. The required information/data, however, is normally not available during the conceptual phase of the retrofit project, especially in a typical de-centralized engineering environment where projects cost control depends entirely on rigorous cost calculations, which typically, if not always, are made after the retrofit project basic engineering, and which are carried out at different departments, at least in most of the companies. Further, it would be neither practical nor logical to assume with high fidelity all possible retrofit solutions that could potentially be implemented for a given plot plan of a facility or to rigorously develop cost correlations to each before running the mathematical program—especially when there is always more than one option to carry out a designated retrofit modification. As such, the inventor has recognized that mathematical programming techniques will often lead to designs which include heat exchange across the pinch, which would be almost impossible to correct in future retrofits to recover extra heat.

Accordingly, recognized by the inventor is that neither one of these methods (pinch technology, network pinch and mathematical programming) can rigorously assess the existing network; rigorously target for the solution before the go ahead of the retrofit project for practically attainable waste heat recovery and/or minimum number of units that need to be added to reach desired energy consumption targets or part of it, and to systematically render solutions that can be implemented in phases with a guarantee that the solution implemented today (in phase one) will not become an obstacle, or need to be demolished, for a tomorrow retrofit solution to be implemented at later time in the future in phases two, three and so on. Also recognized is that the methods existing today do not employ all possible combinations of process changes that not only include the HEN, but also the rest of the plant design and operating conditions, for finding the best HEN retrofit solutions. Correspondingly, recognized is the need for methods, systems, and program product for managing heat exchanger network energy efficiency and retrofits for an industrial facility, which provide the above features.

SUMMARY OF THE INVENTION

In view of the foregoing, various embodiments of the present invention advantageously include systems, program product, and methods for managing heat exchanger network energy efficiency and retrofits for an industrial facility, which can rigorously assess the existing network, rigorously target for the solution before the go ahead of the retrofit project for practically attainable waste energy (heat and/or work) recovery and/or minimum number of units that need to be added to reach desired energy consumption targets or part of it, and to systematically render solutions that can be implemented in phases with a guarantee that the solution implemented today (in phase one) will not become an obstacle, or need to be demolished, for a tomorrow retrofit solution to be implemented at later time in the future in phases two, three and so on. Various embodiments of the present invention also include systems, program product, and methods which employ process steps whereby if the pinch point for a retrofit project changes its location due to the current and future network retrofit project solutions, including process parametric and structural modifications, such situation would not detrimentally affect the network's topology.

Various embodiments of the present invention advantageously provide systems, program product, and methods that introduce improved systematic user friendly procedures for performing energy efficiency assessments of single and multiple utilities grassroots new plant's HEN designs and old plant's HEN retrofit projects designed or retrofitted by any means. Various embodiments of the present invention advantageously provide systems, program product, and methods that introduce new evolutionary and revolutionary procedures for HEN lifetime retrofit for any industrial facility or cluster of industrial facilities using all possible combinations of HEN retrofit modifications to include possible process units design and operating conditions modifications. Advantageously, application of such procedures can render a list of HEN retrofit projects for implementation now and in the future along the lifetime of the facility where the retrofit project of today does not contradict with retrofit project of tomorrow and after tomorrow and so on for all future retrofit projects along the entire time span of the facility.

More specifically, an example of an embodiment of a system to manage/access heat exchanger network energy efficiency and retrofits for an industrial facility can include a heat exchanger network analysis and design computer having a processor and memory coupled to the processor to store software and database records therein, and a database stored in the memory (volatile or nonvolatile, internal or external) of or otherwise accessible to the heat exchanger network analysis and design computer. The database can include a plurality of sets of values each separately defining a potential range of values for each operational attribute for each of a plurality of hot process streams and a plurality of sets of values each separately defining a potential range of values for each operational attribute for each of a plurality of cold process streams. Such attributes can include, for example, a lower and an upper boundary value for a supply temperature (Ts) of each of the hot process streams and each of the cold process streams, a lower and an upper boundary value for a target temperature (Tt) of each of the hot process streams and each of the cold process streams, and/or a lower and an upper boundary value for a heat capacity flow rate (FCp) of each of the hot process streams and each of the cold process streams. The attributes also include capital costs of various HEN equipment for the industrial facility according to the received streams conditions, along with one or more sets of stream-specific minimum temperature approach values between streams ($\Delta T\_min\_i$), streams initial types, streams matching constraints, global utility consumption values [Qh], [Qc] where the "[ ]" denotes interval values. The attributes can also include the interval and/or discrete locations of the pinch regions often referred to as a "pinch point" which describe a "region of minimum choice lower and upper temperature boundaries" at least for each pinch point controlling process stream/stream temperature, identification of the streams that control the pinch locations, data linking the pinch points define a map or maps of the pinch locations according to a progressive change in ΔT_min_i or process conditions, and the minimum number of HE units required for a network condition at each pinch location, among others.

The system can also include heat exchanger network analysis and design program product stored in memory of the heat exchanger network analysis and design computer and/or has a stand-alone deliverable. According to an exemplary configuration, the program product provides systematic synthesis of heat exchanger networks to manage heat exchanger network energy efficiency and retrofits with future retrofit in mind for an industrial process or cluster of processes using a plurality of resource streams. The program product can include instructions that when executed by a computer such as, for example, the heat exchanger network analysis and design computer, cause the computer to perform various operations including the operation of receiving various input data indicating a current heat transfer structure of an existing heat exchanger network for an industrial facility. Such data can include a plurality of data points indicating potential ranges of values for operational attributes for each of a plurality of process streams, a set of lower and upper stream-specific minimum temperature approach boundary values between streams, streams initial types, streams matching constraints, at least one interval global utility consumption value, among others.

According to an embodiment of the present invention, the operations can also include graphically displaying the current heat transfer structure of the existing heat exchanger network. The graphical display can include a pinch point location temperature line identifying the pinch point for the heat exchanger network and one or more connection lines indicating heat transfer between a corresponding one or more hot process streams and one or more cold process streams above, below, and across the pinch point location line to provide ready identification of each heat exchanger in the heat exchanger network exchanging heat properly and/or improperly across the pinch point temperature. Each of the one or more connection lines can provide a linear graphical illustration of heat exchange across the pinch point location temperature line, extending between a respective hot process stream-cold process stream combination to enhance visual identification of such condition. The unique graphical representation can also enhance visual identification of process streams that primarily control pinch point location, the discrete pinch point locations, and the range of values for the pinch point locations, among others.

The operations can also include identifying one or more process streams that primarily control the pinch point location for the existing heat exchanger network, and identifying a set of one or more hot process streams having a highest impact on waste energy recovery upon reducing its respective stream specific minimum temperature approach value. The operations can also include receiving data providing indicia of a maximum desired waste heat/energy recovery goal anticipated over a life of the heat exchanger network defining a final waste heat/energy recovery goal, and determining an optimal heat exchanger network retrofit projects sequence identifying a plurality of heat exchanger network retrofit projects sequentially to allow for incremental waste heat/energy recovery improvements, for example, due to incremental increases in utility energy costs over that of capital costs.

According to the exemplary configuration, the heat exchanger network retrofit projects sequence extends between a current heat exchanger network retrofit project satisfying a current desired waste heat/energy recovery goal and a future heat exchanger network retrofit project satisfying the final waste heat/energy recovery goal. Further, the heat exchanger network retrofit projects sequence can be configured so that each subsequent project within the heat exchanger network retrofit projects sequence does not contradict any of the previous projects within the heat exchanger network retrofit projects sequence.

That is, according to the exemplary configuration, the operation of determining an optimal heat exchanger network retrofit projects sequence can include establishing a continuum of a plurality of sequential retrofit plans based upon an increase in utility costs exceeding a corresponding increase in capital expenditures to increase energy efficiency which do not conflict with each respective prior retrofit plans within the sequence. The continuum of the plurality of sequential retrofit plans extending between a current retrofit plan can describe a currently desired level of waste heat/energy recovery energy efficiency and a projected desired level of waste heat/energy recovery energy efficiency associated with a time at or near an end of a service life of the facility.

The operation of determining an optimal heat exchanger network retrofit projects sequence can also or alternatively include determining a continuum of a plurality of prospective incremental pinch point location moves for a corresponding plurality of heat exchanger network retrofit design variations, whereby the plurality of possible incremental pinch point location moves is associated with an incremental decrease in stream specific minimum temperature approach values applied to one or more of the plurality of hot process streams. The continuum extends between a pinch point location associated with a heat exchanger network retrofit design satisfying the current desired waste heat/energy recovery goal and a heat exchanger network retrofit design satisfying the final desired waste heat/energy recovery goal requiring a larger amount of waste heat/energy recovery than the current desired waste heat/energy recovery goal, with each of the corresponding plurality of heat exchanger network retrofit designs providing a progressively larger amount waste heat/energy recovery.

The operation of determining an optimal heat exchanger network retrofit projects sequence can also or alternatively include determining a pinch point location map providing an ordered description of a plurality of prospective incremental pinch point location moves associated with a corresponding plurality of heat exchanger network retrofit design variations. The plurality of incremental pinch point location moves typically result from an incremental decrease in stream specific minimum temperature approach values applied to one or more of the plurality of hot process streams. The pinch point location moves can extend between a pinch point location associated with a heat exchanger network retrofit design satisfying the current desired waste heat/energy recovery goal and a heat exchanger network retrofit design satisfying the final desired waste heat/energy recovery goal with the final desired energy recovery goal requiring a larger amount of waste heat/energy recovery than the current desired waste heat/energy recovery goal, with each of the plurality of incremental pinch point location moves associated with a corresponding heat exchanger network retrofit design providing a progressively larger amount of waste heat/energy recovery. The pinch point location map provides a heat exchanger network retrofit projects sequence identifying a plurality of heat exchanger network retrofit projects sequentially to define the optimal heat exchanger network retrofit projects sequence, whereby each subsequent heat exchanger network retrofit project is configured so as to not contradict any previous projects in the heat exchanger network retrofit projects sequence.

The operation of determining an optimal heat exchanger network retrofit projects sequence can also or alternatively include receiving minimum temperature approach value data indicating an upper and a lower range of a set of stream-specific minimum temperature approach values. The upper range of stream-specific minimum temperature approach values is normally assigned a value attainable according to a current structure of the existing heat exchanger network. The lower range of stream-specific minimum temperature approach values is normally assigned a lower bound set associated with a last retrofit project to be conducted at a future date at an end of the serviceable life of the heat exchanger network for the facility defining the future heat exchanger network retrofit project. Further lower bound set, a number such as 2° F., 5° F., or some theoretical minimum based on future advances in HE unit technology. The operation can also include determining a process pinch range interval identifying a ranges of process pinch locations for all anticipated combinations of process conditions and heat exchanger network design modifications (e.g., due to conditions changes) responsive to the minimum temperature approach value data.

According to an exemplary configuration, the operations can also include identifying one or more of the plurality of process streams that control one or more pinch point location moves associated with a current heat exchanger network design that satisfies a desired increase in waste heat/energy recovery prior to constructing a corresponding prospective heat exchanger network design that satisfies the desired waste heat/energy recovery, and identifying each of one or more streams specific turning point temperatures associated with the one or more pinch point location moves. These features can be particularly advantageous, as they provide the designer the ability to locate an optimal pinch point location with future retrofit in mind prior to expending significant resources in the design process, and to identify process conditions and/or characteristics to achieve the optimal pinch point location.

According to an exemplary configuration, the operations can also include incrementally decreasing stream specific minimum temperature approach values applied to one or more of the plurality of hot process streams to identify a plurality of incremental pinch point location moves defining a plurality of different pinch point locations to thereby define a plurality of heat exchanger network retrofit design variations for a heat exchanger network design problem. The operations can also include determining a minimum number of required heat exchanger units associated with each separate one of the plurality of heat exchanger network retrofit design variations having corresponding different pinch point locations, and determining an optimal pinch point location that provides the minimum number of heat exchanger units.

According to an exemplary configuration, the operations can also include incrementally decreasing stream specific minimum temperature approach values applied to one or more of the plurality of hot process streams to identify a plurality of incremental pinch point location moves defining a plurality of different pinch point locations, and determining an optimal pinch point location that provides the maximum waste heat/energy recovery for a given set of process conditions.

According to an exemplary configuration, the operations can also include determining a minimum number of required heat exchanger units in a certain heat exchanger network design, determining an impact on waste heat/energy recovery of using less than a minimum number of required heat exchanger units, determining the impact on waste heat/energy recovery of wrong matches between one or more of the plurality of hot process streams and one or more of the plurality of cold process streams according to the certain heat exchanger network design, and/or determining the impact on waste heat/energy recovery of heat exchanger units having a less than optimal heat exchanger unit surface area for the certain heat exchanger network design with respect to capital costs. The operations can also include determining a minimum number of heat exchanger units that need to be added to a certain heat exchanger network design to attain a current waste heat/energy recovery capability under existing process conditions and stream specific minimum temperature approach values.

According to an exemplary configuration, the operations can also include moving a pinch point location for a certain heat exchanger network design through process condition modification of one or more process streams identified as controlling the pinch point location, and moving the pinch point location through minimum temperature approach value modification of the one or more process streams identified as controlling the pinch point location.

Advantageously, embodiments of the present invention also include a method of managing heat exchanger network energy efficiency and retrofits foreign industrial facility having a plurality of process streams. Various examples of methods include steps to implement the above described operations and those described in the following detailed description. For example, according to an embodiment of a method, the method can include the steps of identifying one or more process streams that primarily control a pinch point location for an existing heat exchanger network, determining an optimal pinch point location that provides a maximum waste heat/energy recovery and/or a minimum number of required heat exchanger units for a given set of process conditions, and determining an optimal heat exchanger network retrofit projects sequence extending between a current heat exchanger network retrofit project satisfying a current desired waste heat/energy recovery goal and a future heat exchanger network retrofit project satisfying the final waste heat/energy recovery goal.

Various steps can also include graphically displaying the current and proposed heat transfer structures according to a new and unique graphical methodology. The steps can also include selecting an optimal pinch point location from an energy point of view, minimum number of units to be added point of view, or both, and calculating the minimum number of HE units. The steps that also include employing a marching technique to discover/calculate rigorous new retrofit targets upon $\{\Delta T\_min\_i\}$ systematic reduction and/or process condition changes, marking cross the pinch and utility violators, discovering and correcting wrong matching via creating new utilities path(s) to include eliminating lost-in-topology energy due to using less than the minimum number of HE units and due to wrong matching.

Various embodiments of the present invention advantageously exhibit several folds of uniqueness, such as, for example, in the methodology of representing the existing HEN, in the methodology of testing and analyzing the existing HEN from "energy-efficiency" point of view, in the energy consumption and number of units targeting phase, and finally in the systematic finding of the retrofit solutions, which is evolutionary in implementation but revolutionary in thinking as it serves the novel concept of plant lifetime retrofit-ability without contradiction between past and future retrofits and without losing the opportunities of continuing more retrofit projects due to either physical impracticality (inability to make the desired structural modifications) or economic impracticality (the situation in which more desirable retrofit actions became too expensive to be justified). Various embodiments of the present invention also advantageously address the retrofit of both single and multiple-utilities HEN for waste energy quality recovery, and can employ all possible combinations of process changes that not only include the HEN, but also the rest of the plant design and operating conditions, for finding the best heat exchanger networks retrofit solutions.

Various embodiments of the present invention also advantageously function to identify the ultimate goal pinch point/final retrofit stop station and can depict a roadmap to take to perform the retrofit projects that result in: optimal waste energy recovery and plant's energy system components debottlenecking, optimal minimum addition of new units, and both. Such embodiments enable the designer to decide the number of units needed to reach the desired energy targets and to decide his/her optimal trade-off between energy saving and number of units to be added (capital cost expenditures), performed ahead of working on the retrofit project solution.

As noted previously, in the current pinch-based methods (process and network), the pinch point location will be changing upon performing modifications. Hence, sequential modifications will likely become conflicting and lead to mediocre solution. Accordingly, embodiments of the present invention provide solutions which use interval inclusion methods for all possible pinch points. Various embodiments of the present invention advantageously also facilitate the identification of the hot stream(s) and/or the cold stream(s) that controls the pinch point location. Knowing such stream(s) ahead of deciding any modification can be considered a priori for any successful modification in both process conditions and HEN topology. The locating of the problem process pinch map is also useful to complete the picture of the process pinch interval especially when there is no process pinch as in threshold applications and we have only utility pinch(s) and in cases like CDU in which there are non-process-pinch points. The stream(s) having highest impact on energy recovery upon reducing its $\Delta T\_min\_i$ can be located and/or re-located on utility path(s), via re-matching.

According to various embodiments of the present invention, advantageously, the HEN retrofit can be conducted under all possible combinations of process parametric and structural modifications, as described, for example, in U.S. patent application Ser. No. 11/768,084, filed Jun. 25, 2007, now U.S. Pat. No. 7,698,022, titled "System, Method and Program Product for Targeting and Optimal Driving Force Distribution in Energy Recovery Systems," U.S. patent application Ser. No. 12/898,475, filed Oct. 5, 2010, titled "Systems, Program Product, and Methods For Synthesizing Heat Exchanger Networks That Account For Future Higher Levels of Disturbances and Uncertainty and Identifying Optimal Topology For Future Retrofit," and U.S. patent application Ser. No. 12/767,315, filed Apr. 26, 2010, titled "System, Method, and Program Product for Synthesizing Heat Exchanger Networks and Identifying Optimal Topology for Future Retrofit."

Various embodiments of the present invention provide clear advantages over conventional methods used for plants lifetime heat exchangers retrofit, in general, and the pinch technology and network pinch methods, in particular, which although providing the designer some ability to manage the outcome, have significant disadvantages. For example, pinching the network using mathematical programming in network pinch method does not create overall insights about the problem's next step needed for finding a solution, and provides no guidance when encountering threshold problems and problems without a utility path. Solution space used is not inclusive. Such methodologies use today's crude cost estimation in advance of unknown potential solution details and let such estimation control the final outlook of the plant lifetime retrofit needs. Finding solutions are sequential and provide no guarantee that the step-by-step actions used are not conflicting with each other or that, in the long run, the solution is heading in the right direction for best retrofit. Such methodologies simply do not have provisions to retrofit with more retrofit in mind. Nor do they target for energy Lost-in-Topology (due to wrong matching practices), target for energy Lost-in-Number-of-Units (due to the failure to utilize the minimum number of units required), target systematically for energy Lost-in-Surface-Area decision (capital versus energy trade-off). Nor do they optimize $\{\Delta T\_min\_i\}$ set values using a marching or other technique, simultaneously optimize process conditions and HEN network retrofit actions, identify a process pinch interval that includes all possible process pinch points under all possible combinations of process and HEN conditions changes, or identify or specify the pinch point controlling stream(s) to enlightened the search for solutions that can withstand the time test. Such methodologies also cannot render a one-by-one modification on the right direction for lifetime implementation. Various embodiments of the present invention advantageously provide such features. Nor do such methodologies provide a self-explanatory representation of the existing HEN or utilize the number of degrees of freedom in finding retrofit solutions as described herein.

The degrees of freedom include, for example, heat exchanger unit conditions (overall heat transfer condition (U) including heat transfer enhancements, fouling reduction, etc.), $\{\Delta T\_min\_i\}$ set (surface area), stream(s) split ratio, number of units, streams matching, process design and operating conditions, and a combination of all of the above. Note, the process design and operating conditions include operating pressure of units, streams flowrate, supply and target temperatures of all hot streams to be cooled and cold streams to be heated, the existence or non-existence of pumparounds/intercoolers and inter-heater and its flowrate and supply and target temperatures, columns reflux ratio (those that can normally be utilized/changed in a HEN retrofit project), and catalyst type, activity and selectivity, tray/packing efficiency, number of trays and stages in multistage units, separation network sequence, etc.

As the conventional methods, not just the pinch-base and network pinch methods, fail to use all possible degrees of freedom either simultaneously or sequentially or upon using some of them, provide a process that is systematic, provide a hypothesis that extends behind what would be considered myopic, or take into consideration future retrofit projects, such methodologies cannot guarantee that the action taken today is going to remain in the next retrofit project or today's action is not going to become an obstacle to future actions. Various embodiments of the present invention, not being subject to such limitations, can provide such guarantees. Accordingly, it is anticipated that such embodiments will become very beneficial to the energy efficiency optimization community as they open new avenues for more waste heat/energy recovery.

BRIEF DESCRIPTION OF THE DRAWINGS

So that the manner in which the features and advantages of the invention, as well as others which will become apparent, may be understood in more detail, a more particular description of the invention briefly summarized above may be had by reference to the embodiments thereof which are illustrated in the appended drawings, which form a part of this specification. It is to be noted, however, that the drawings illustrate only various embodiments of the invention and are therefore not to be considered limiting of the invention's scope as it may include other effective embodiments as well.

FIG. 25 is a graphical depiction of a data entry page for the network described in FIG. 15 according to an embodiment of the present invention;

DETAILED DESCRIPTION

Figure 1:
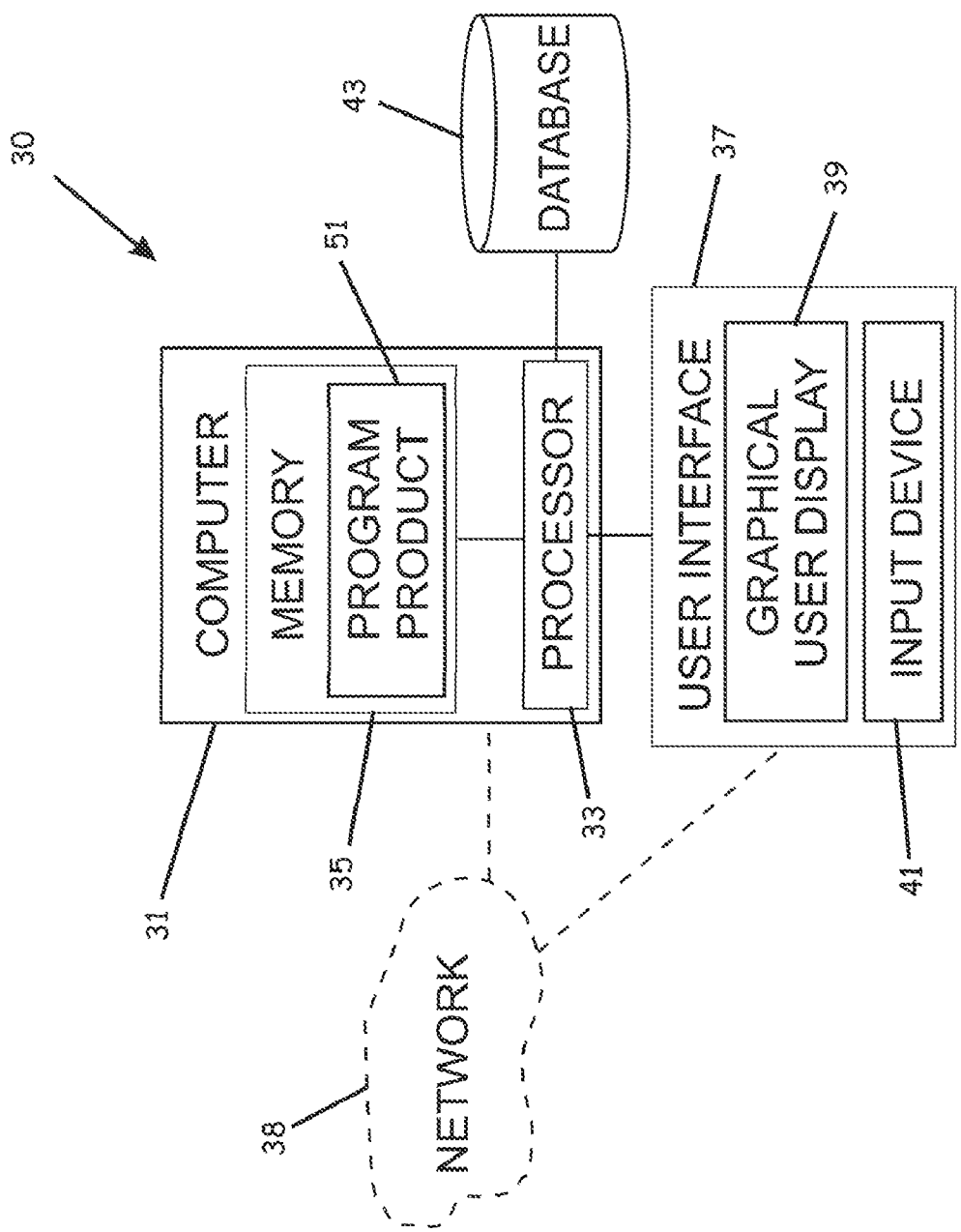
FIG. 1 is a schematic diagram of a general system architecture of a system for managing heat exchanger network (HEN) energy efficiency and retrofits for an industrial facility according to an embodiment of the present invention.

The present invention will now be described more fully hereinafter with reference to the accompanying drawings, which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout. Prime notation, if used, indicates similar elements in alternative embodiments.

Many different types of processes consume multiple steam levels and electricity to obtain an output result, or to produce a required product or compound. With large scale processes which consume significant amounts of steam for instance, it is preferable to optimize the steam and power system where possible. Heat exchanger network retrofit for waste energy recovery under all possible combinations of process variations can be a very important sub-system in any new plant. Today's retrofit project resulting from an increase in energy utility costs could, however, potentially conflict with tomorrow's retrofit project, causing an excessive capital expenditure that would not have been otherwise required by today's retrofit project not been performed.

Various embodiments of the present invention provide various new and/or improved options for heat exchanger network retrofit that can be conducted sequentially and/or simultaneously, which do not cause such conflict. Such options can include, for example, {$\Delta T\_min\_i$} optimization using marching techniques and guided with the optimal combinations to accelerate such search, addressed for example, in U.S. Pat. No. 7,698,022, titled "System, Method, and Program Product for Targeting and Optimal Driving Force Distribution in Energy Recovery Systems." Such options can also or alternatively include re-sequencing; process parametric modifications such as, for example, changing flow supply temperature and/or target temperature, adding of new streams, changing operating pressures, and can include structural modifications such as, for example, exploiting existing utility paths, increasing the number of units at the same match via inserting heat exchanger (HE) units and/or via identifying and performing new matches to create new utility paths using cold and hot streams splits, changing/correcting matches to change utility path, including those addressed in U.S. patent application Ser. No. 12/767,217, filed Apr. 26, 2010, titled "System, Method, and Program Product for Synthesizing Non-Constrained and Constrained Heat Exchanger Networks." The structural modifications can also or alternatively include removing coolers above the process pinch, heaters below it, and any process heat exchanger units crossing the process pinch. NLP can be used to optimize branches and Q allocations, after fixing the topology of the HEN to minimize total additional HEN area for HEN designs under variations and uncertainty that minimizes total area at given HEN topology, for instance, as described, for example, in U.S. patent application Ser. No. 12/898,475, filed Oct. 5, 2010, titled "Systems, Program Product, and Methods For Synthesizing Heat Exchanger Networks That Account For Future Higher Levels of Disturbances and Uncertainty and Identifying Optimal Topology For Future Retrofit." Note, HEN flexibility can provide for different small changes/disturbances and uncertainty due to, for example, ambient temperature changes, fouling in exchangers, catalyst deactivation, heat, mass and momentum transfer coefficients uncertainty, reaction kinetics parameters uncertainty (activation energy and frequency factor), equilibrium constants uncertainty, degradation in equipment thermodynamic efficiency, and so on.

Various options according to exemplary embodiments of the present invention are described below. Specifically, FIG. 1 illustrates a system 30 to manage heat exchanger network energy efficiency and retrofits for waste energy recovery under all possible combinations of process variations for an industrial facility (individual or cluster of industrial facilities). The system 30 can include a heat exchanger network analysis and design computer 31 having a processor 33, memory 35 coupled to the processor 33 to store software and database records therein, and a user interface 37 which can include a graphical display 39 for displaying graphical images, and a user input device 41 as known to those skilled in the art, to provide a user access to manipulate the software and database records. Note, the computer 31 can be in the form of a personal computer or in the form of a server or server farm serving multiple user interfaces 37 or other configuration known to those skilled in the art. Accordingly, the user interface 37 can be either directly connected to the computer 31 or through a network 38 as known to those skilled in the art.

The system 30 can also include a database 43 stored in the memory 35 (internal or external) of heat exchanger network analysis and design computer 31 and having a plurality of sets of values each separately defining a potential range of values for each operational attribute for each of a plurality of hot process streams and a plurality of sets of values each separately defining a potential range of values for each operational attribute for each of a plurality of cold process streams. Such attributes can include, for example, a lower and an upper boundary value for a supply temperature (Ts) of each of the hot process streams and each of the cold process streams, a lower and an upper boundary value for a target temperature (Tt) of each of the hot process streams and each of the cold process streams, and/or a lower and an upper boundary value for a heat capacity flow rate (FCp) of each of the hot process streams and each of the cold process streams, capital costs of various HEN equipment for the industrial facility according to the received streams conditions, along with one or more sets of stream-specific minimum temperature approach values between streams ($\Delta T\_min\_i$), streams initial types, streams matching constraints, global utility consumption values [Qh], [Qc] where the "[ ]" denotes interval values, as well as the interval and/or discrete locations of the pinch regions often referred to as a "pinch point" which describe a "region of minimum choice lower and upper temperature boundaries" at least for each pinch point controlling process stream/stream temperature, identification of the streams that control the pinch locations, data linking the pinch points define a map or maps of the pinch locations according to a progressive change in $\Delta T\_min\_i$ or process conditions, and the minimum number of HE units required for a network condition at each pinch location, among others.

The system 30 can also include heat exchanger network analysis and design program product 51 stored in memory 35 of the heat exchanger network analysis and design computer 31 and adapted to provide systematic process which includes various unique phases of analysis and design, which provide a revolutionary solution approach with decoupled evolutionary modifications steps. The analysis and design phases according to the systematic process includes an "assessment phase" which provides for establishing a base network design case of an existing HEN contemplating retrofit and facilitates assessment of the existing HEN through to the development of a lab test analysis report which provides testing and analysis from an "energy-efficiency" point of view—aided through the graphical representation of the existing HEN according to a new and unique methodology. The analysis and design phases also include an "insights and objective selection phase" which provides for and conducts targeting consumption and energy selection and determining the minimum number of HE units needed to meet the energy objectives. The analysis and design phases also include a "find solution phase" which provides a systematic process for finding retrofit solutions that is evolutionary in implementation but revolutionary in thinking. The systematic process serves the novel concept of plant lifetime retrofit-ability without contradiction between past and future retrofits and without losing the opportunities of continuing more retrofit projects because of either impracticality or the situation in which more (future) retrofit actions became too expensive to be justified. It also addresses the retrofit of a single and multiple-utilities HEN for waste energy quality recovery. The analysis and design phases can also include an "evaluation phase" which facilitates utilization of mathematical programming techniques to evaluate the HEN solution, and a "prescription phase" which facilitates development and implementation of an actual implementation strategy.

Note, the heat exchanger network analysis and design program product 51 can be in the form of microcode, programs, routines, and symbolic languages that provide a specific set for sets of ordered operations that control the functioning of the hardware and direct its operation, as known and understood by those skilled in the art. Note also, the heat exchanger network analysis and design program product 51, according to an embodiment of the present invention, need not reside in its entirety in volatile memory, but can be selectively loaded, as necessary, according to various methodologies as known and understood by those skilled in the art.

Figure 2:
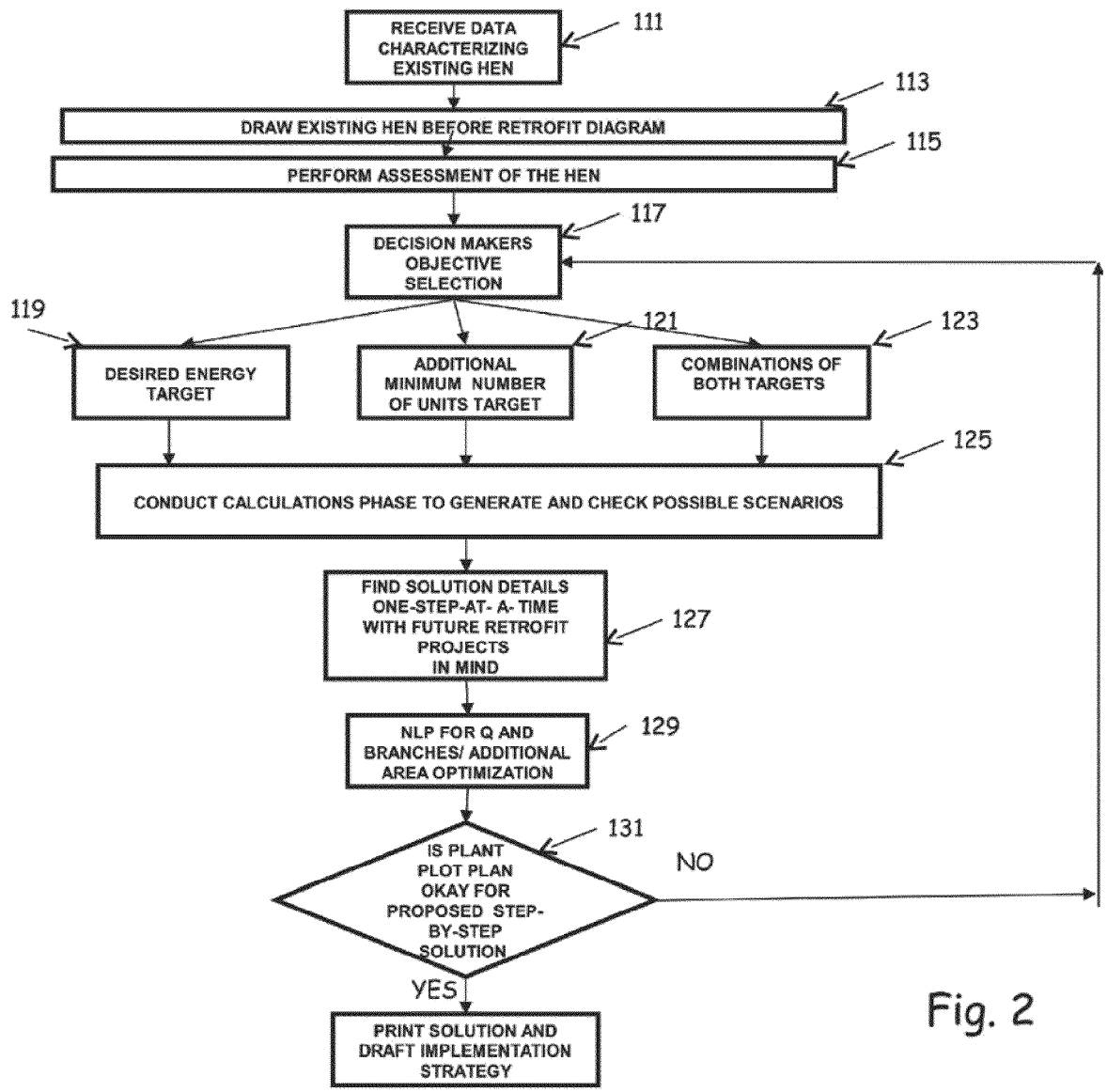
FIG. 2 is a schematic block flow diagram illustrating steps for managing HEN energy efficiency and retrofits for an industrial facility according to an embodiment of the present invention.

FIG. 2 provides a high-level flow diagram illustrating operation of the heat exchanger network analysis and design program product 51 and/or associated method steps according to an embodiment of the present invention. As shown in block 111, the steps/operations include receiving input data which can include data indicating potential ranges of values for operational attributes for each of a plurality of process streams of an existing HEN to be retrofitted (see, e.g., FIG. 4), a set of stream-specific minimum temperature approach boundary values $\Delta T\_min\_i$ between streams, streams initial types, streams matching constraints, one or more interval global utility consumption values [Qh], [Qc], indicia of the existing HEN design structure, and a set of lower and upper stream-specific minimum temperature approach boundary values {ΔT_min_i [L:U]} between streams for producing a retrofit diagram. Note, FIG. 4 illustrates a conventional representation of a HEN problem using a network pinch method provided by way of example.

Figure 4:
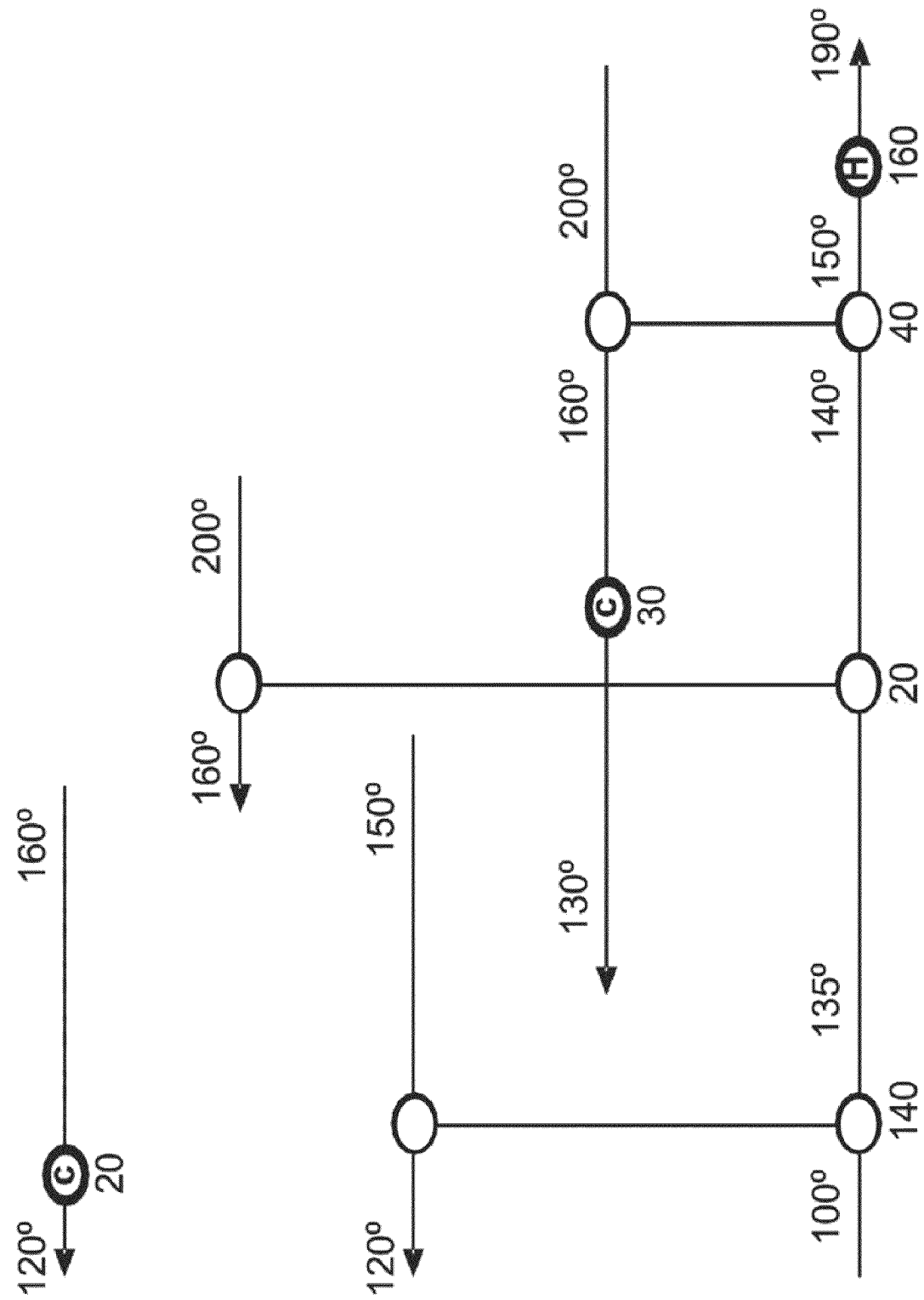
FIG. 4 is a schematic diagram of an existing HEN.
Figure 5:
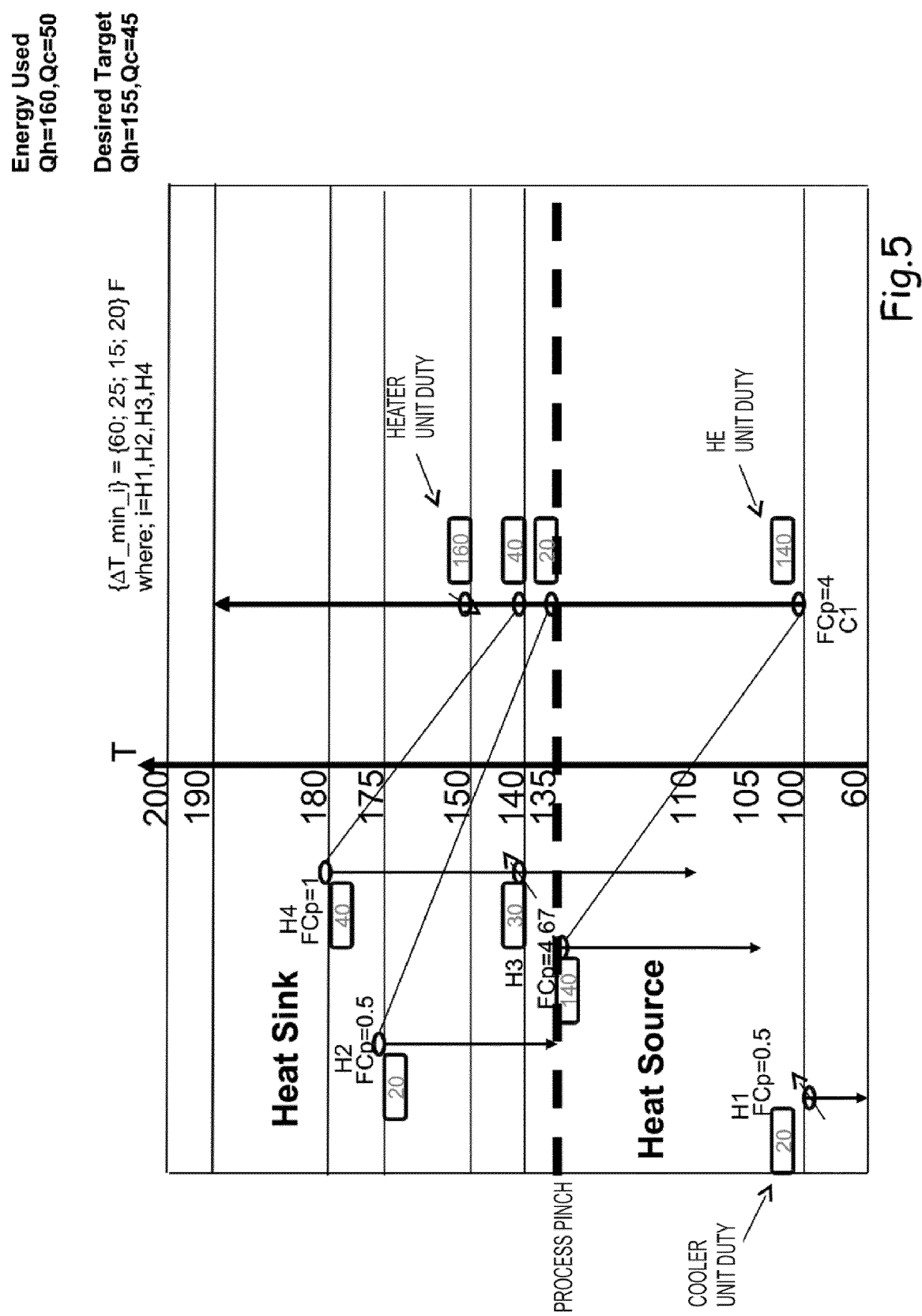
FIG. 5 is a schematic diagram illustrating a graphical representation of the HEN of FIG. 4 according to an embodiment of the present invention.
Figure 6:
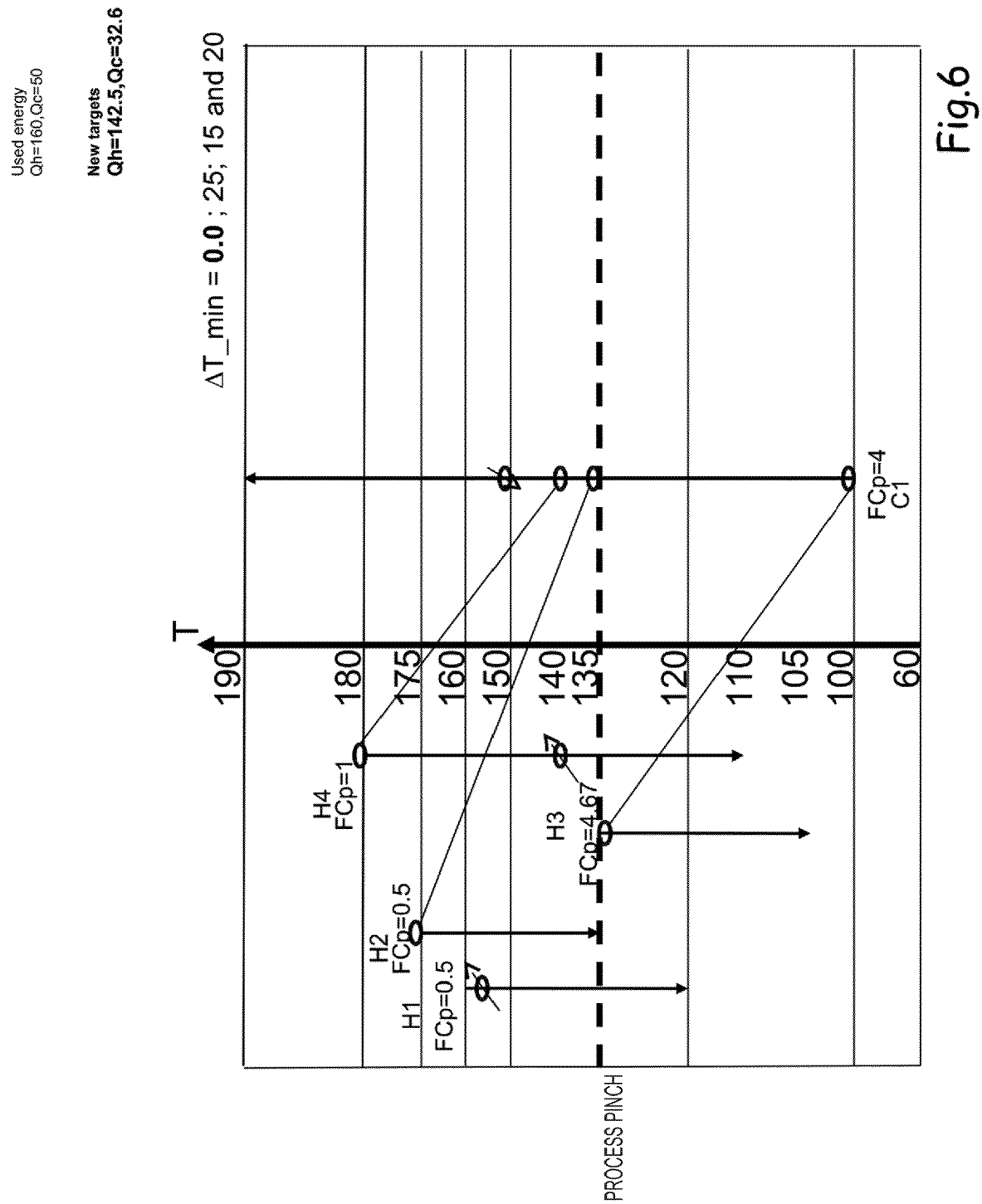
FIGS. 6-9 are a set of schematic diagrams illustrating portions of a systematic technique of assessment and lab testing according to an embodiment of the present invention.
Figure 7:
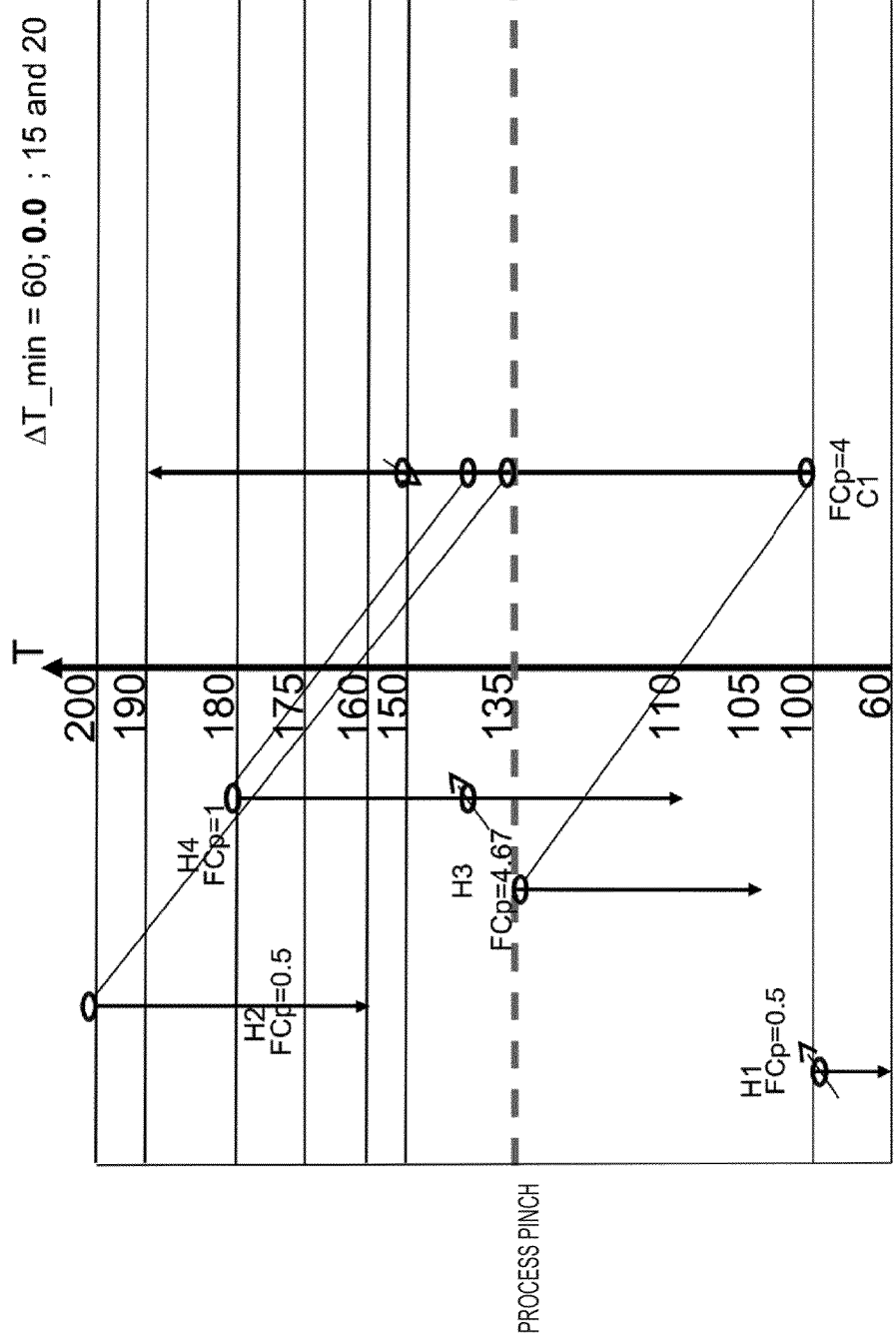
Figure 8:
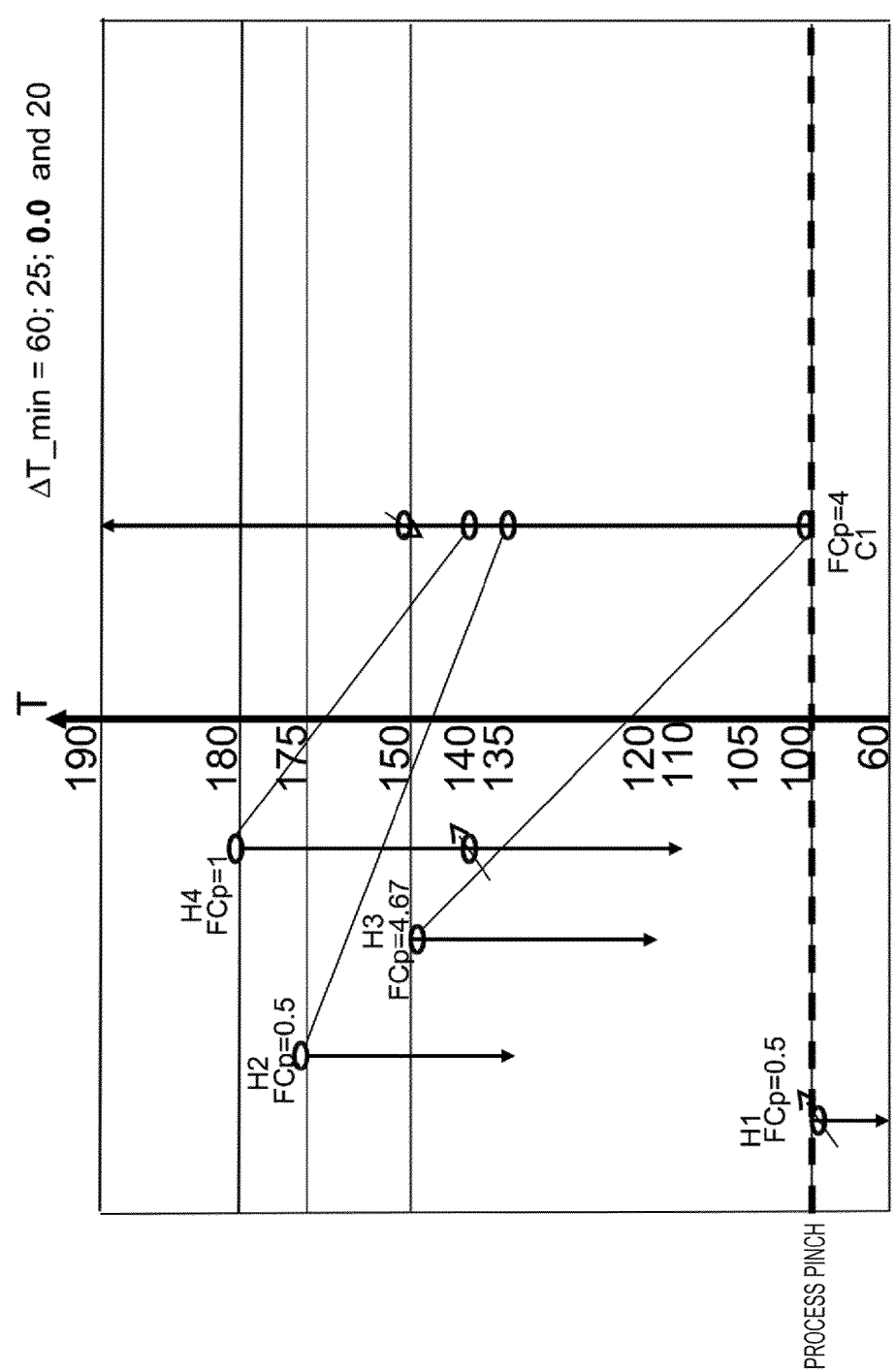
Figure 9:
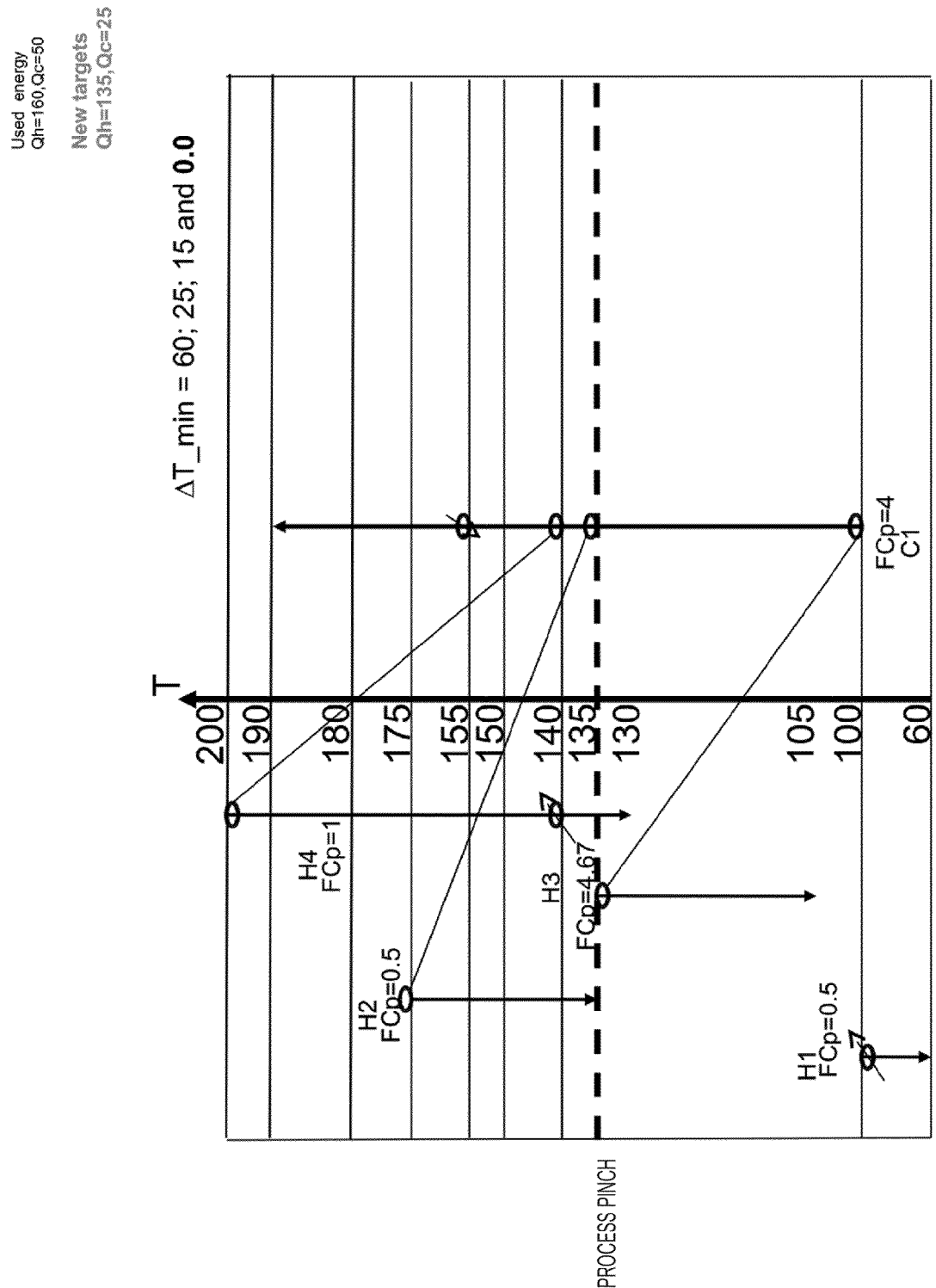

As shown in block 113, the steps/operations can include drawing the existing HEN shown in FIG. 4 in accordance with a systematic new graphical representation method as illustrated, for example, in FIG. 5. Note, the network at the existing conditions exhibits an extra 5 MW of heating utility and 5 MW of cooling utility lost-in-topology energy. At the current process and {ΔT_min_i} conditions, there is no heat crossing from the process sink section (portion above the pinch) to process source section, there is no use of a hot utility in the process source section (portion below the pinch), and a wrong cooling activity is seen in the process sink section. The current network design uses 6 HE units. Hot process streams H3, H2, and H4 are serviced by process-to-process units, H1 and H4 are serviced by a cooler, and cold process stream C1 is serviced by a heater.

Figure 3:
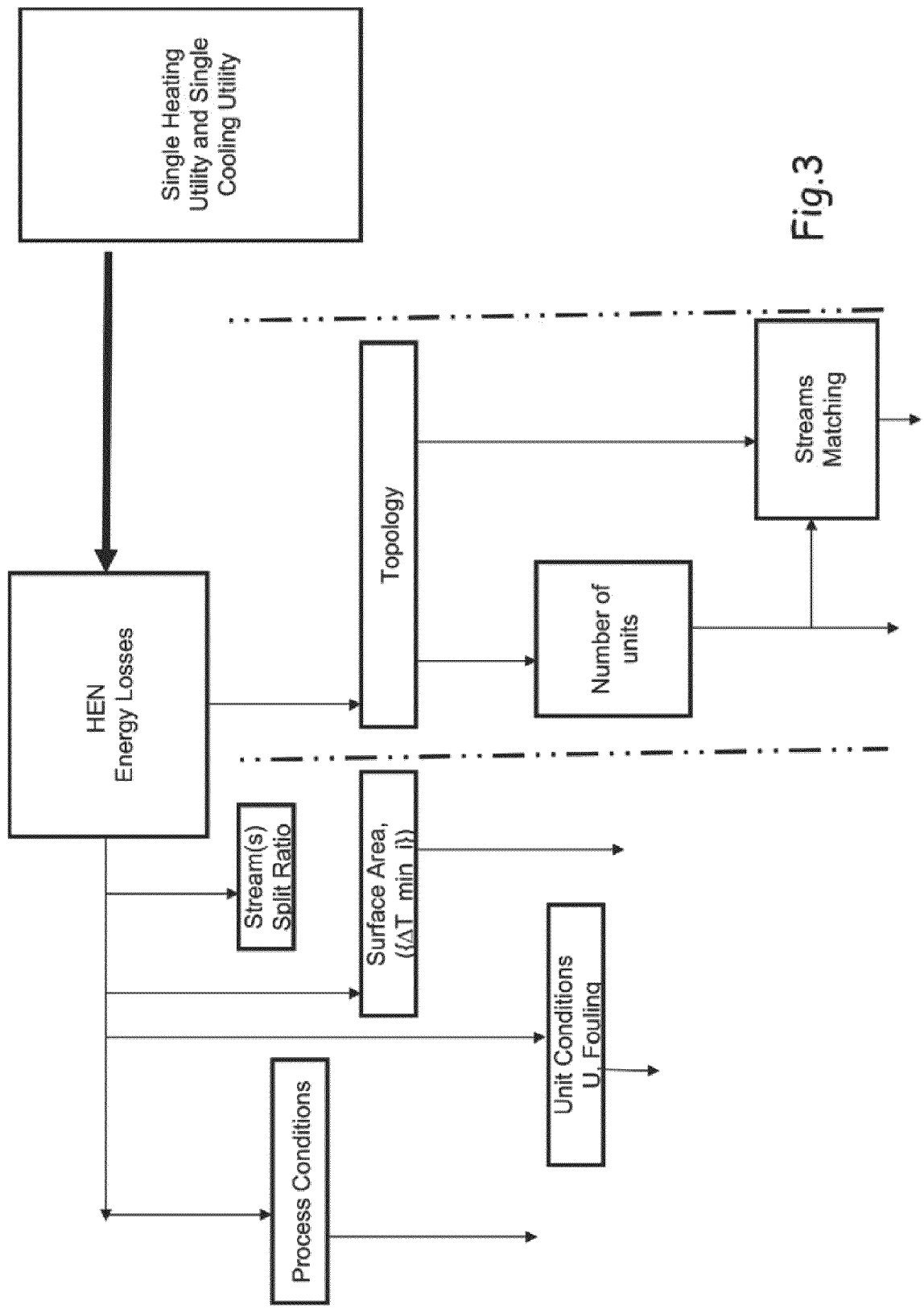
FIG. 3 is a schematic block diagram illustrating the energy loss anatomy for an existing single utility HEN according to an embodiment of the present invention.

As shown in block 115, the steps/operations include performing a systematic assessment including what is referred to as "lab test results." The method procedures for the assessment/test typically includes: defining the process pinch point at the current {ΔT_min_i}, defining the process pinch interval, identifying the "implicit" pinch point, if needed, as in threshold problem applications, calculating the minimum number of units at each case, identifying the optimal pinch point location from both number of units and energy consumption points of view, and drawing the physical process pinches. FIGS. 6-9 illustrate a one-by-one reduction of the minimum approach temperature values for each of the hot streams H1-H4 to zero ({ΔT_min_i}=0.0). The combinations of {ΔT_min_i}=0.0 provides insights about the process streams with the highest impact on energy recovery and what to do to obtain the best possible targets. The modified network conditions can be compared with the actual network to identify the lost-in-topology energy due wrong matching practices (energy lost in matching) and due to use of less than the minimum number of HE units (energy lost in number of units), and lost-in-area energy/{ΔT_min_i} selection (capital-energy trade-off), and energy lost in process conditions. Note, FIG. 3 illustrates the energy loss anatomy for an existing single utility HEN.

The lost-in-topology calculation can give the designer the "pinching matches" impact on the HEN waste heat recovery efficiency under the used actual {ΔT_min_i}, and the location of such matches' network pinch for all pinching matches. Repeating this calculation for each new {ΔT_min_i} renders lost-in-topology energy target at each new {ΔT_min_i} for all pinching streams, simultaneously. The data provides an input to isolate the surface area impact, number of units impact, process conditions impact, to determine the wrong-matching impact, and to identify the pinch points interval, described below.

As shown in blocks 117, 119, 121, 123, and 125, the steps/operations include those for conducting targeting and objective selection. At block 117, the objective selection input from a decision maker, which includes the decision maker's desired plants lifetime retrofit objectives, is received. At blocks 119, 121, at 123, desired energy target, additional minimum number of units target, and/or a combination of both are formulated. At block 125, possible scenarios are generated and checked. Targeting consumption, energy selection, and analysis of the various insights to include determining the minimum number of HE units needed to meet the energy objectives provided by the decision maker, and to define an optimal pinch point location that renders the decision makers plant lifetime retrofit desired objectives, is performed.

By applying a ΔT_min_i marching technique such as, for example, the marching technique described in U.S. Pat. No. 7,698,022, the following information can be generated: optimal ΔT_min_i values, corresponding energy targets, the pinch points interval, stream(s) that control pinch location(s), minimum number of units interval, and minimum number of units required at each combination of hot streams {ΔT_min_i} values, along with the stream(s) having the highest impact on waste heat recovery can be readily identified.

Figure 10:
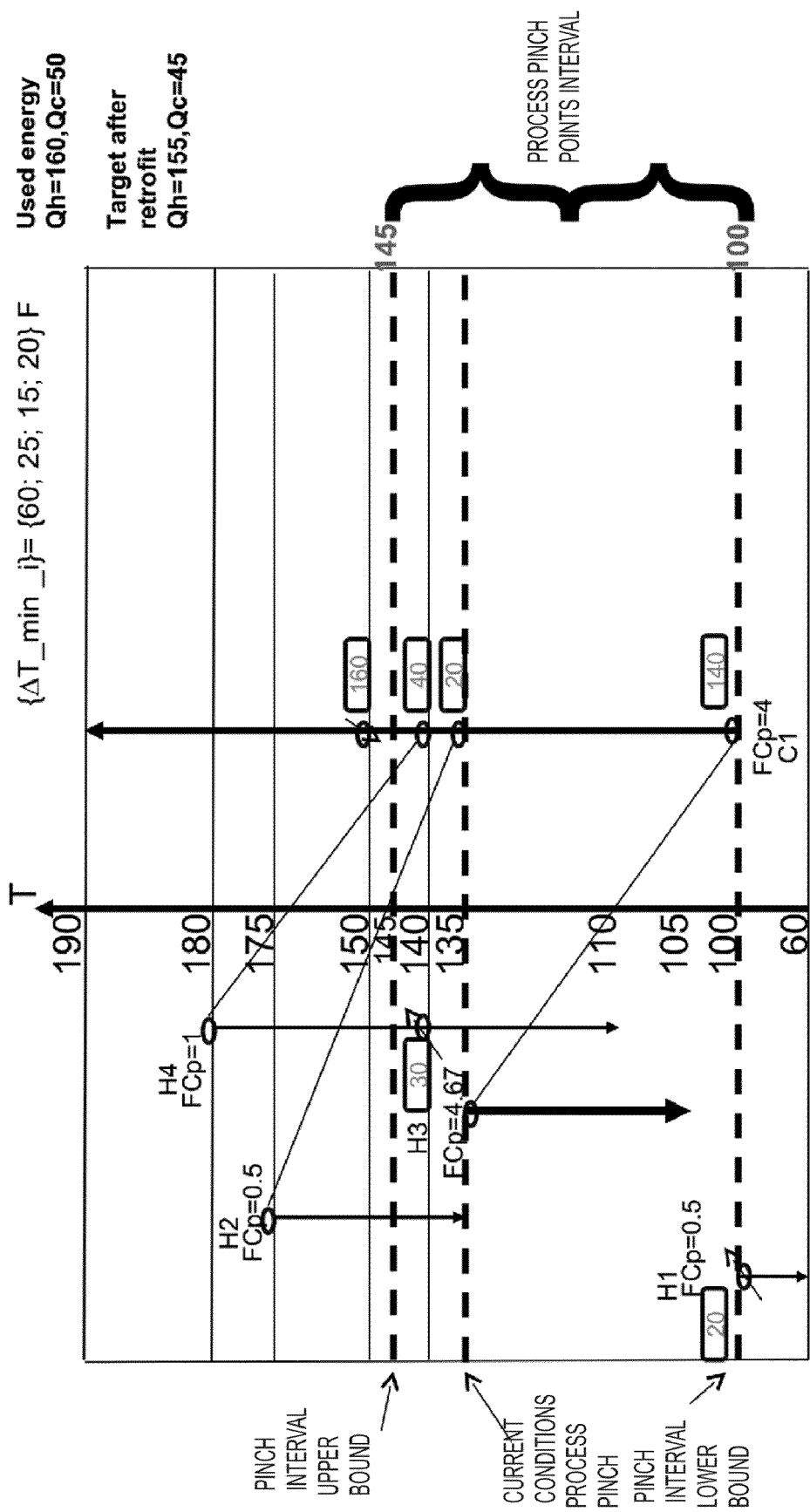
FIG. 10 is a schematic diagram illustrating portions of a systematic technique for insights creation and targeting according to an embodiment of the present invention.

In the example shown in FIG. 10, through application of the marching technique, the following information was determined: The Pinch-interval equals [100:145]° F. H3 defines the pinch point location upper bound and C1 defines the pinch point location lower bound. H3 is controlling the pinch point location till its ΔT_min_H3=5° F., below that value, e.g., ΔT_min_H3=45° F., C1 controls the pinch point location, and at a global ΔT_min=6° F., the problem becomes threshold. The minimum number of units interval=[5:9]. For the example using the examples parameters, the minimum number of units required above pinch is 3 and the minimum of units below pinch are 4 using pinch rule (using a formula according to an embodiment of the invention). As such, the total number of HE units used is one unit less than the minimum number of units required—resulting in the existence of energy lost-in-no.-of-units-used.

As shown in block 127, the steps/operations can include application of systematic procedures to find solutions and solution details that serve HEN retrofit projects now and in the future, for example, performed one-step-at-a-time with future retrofit projects in mind to find the route that ultimately leads to the desired objective through step-by-step modifications. Further, as shown in blocks 129 and 131, the steps/operations can include applying nonlinear programming (NPL) for Q and branches and/or additional area optimization. Details of the various steps are described in more detail later.

Figure 11:
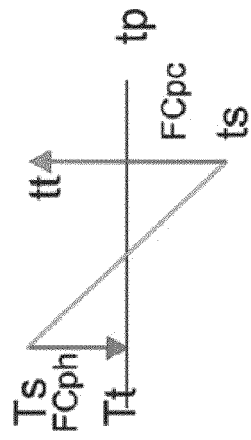
FIGS. 11-14 are a set of schematic diagrams illustrating different types of pinch crossing problems according to an embodiment of the present invention.

FIG. 11 illustrates a scenario where no stream is extended across the pinch. New matches will be needed to recover the waste heating load above the pinch (Q_h_waste) and waste cooling load below the pinch (Q_c_waste). In this scenario, Q_lost_heating is equal to Q_lost_cooling. This waste "heating load" above the pinch and waste "cooling load" below the pinch are equal to Q_lost=FCph*(Ts−Tt), whereby the temperatures shown in the figure are unit specific where Tt>=tp and tp>=tt (using cold scale temperature as a reference and existing {ΔT_min_i}).

In this scenario, at least one new HE unit is required. If the Q_lost*$/MMBtu saved in both heating and cooling utilities does not justify adding any new unit, stop this leg of the process. Otherwise, the process should then or instead use the existing HE unit for matching the hot stream load above the pinch with new cold stream(s) load or cold stream split above the pinch. Insert the new match with an existing cold stream, if driving force allows it, otherwise re-sequence the units on such cold stream to allow the insertion.

Where FCph<=FCpc_new, the cold stream and/or the cold split shall be lying at a utility path/heater path and cold stream split is (lying at the pinch or above the pinch) is less than or equal to the hot stream Tt. If these conditions are met only one new match above the pinch is required, otherwise more than one new match above the pinch will be needed. If the Q_lost*$/MMBtu, savings in both heating and cooling utilities does not justify adding more than one unit, stop this leg of the process.

According to an exemplary configuration, it is considered mandatory for any cold stream to be a candidate match above the pinch to be lying on a utility heater path if Tt=tp. If ΣFCph is also greater than ΣFCpc, change the driving force distribution on the utility path or heater loading at the pinch above the pinch of the existing network, via modifying process conditions (streams inlet temperature) and/or the ΔT_min_i of the pinch-point-location controlling stream to move/tailor the pinch point location to a new desired temperature (tp) that overcomes this constraint. If ΣFCph is less than ΣFCpc with the utility path at the pinch below the pinch of the existing network, execute the same steps as above. After this modification, check the type of the problem in hand to determine if it is still a no-heat exchange across pinch problem or if it has become a heat exchange across pinch problem.

Otherwise, rematch of cold streams and hot streams above the pinch will be needed to have a better utility path or heater loading, or to create new ones. Split the hot stream load FCph above the pinch if such desired cold stream matching conditions are not possible and repeat the procedures above.

Below the pinch the cooling load lost that is also equal to Q_lost=FCph*(Ts−Tt) shall be inserted to a hot stream lying at a utility path/cooler path and the same procedures used in the situation above the pinch is applied via changing the roles between the hot stream and the cold stream used above the pinch. Note, the existing HE unit can be reused as applicable (regarding space, piping, topology, etc.). In this scenario, both are equal in heat load and candidate users of the existing HE unit in their match. The UA of the new match shall define the allocation of the existing HE unit along with other process constraints.

Figure 12:
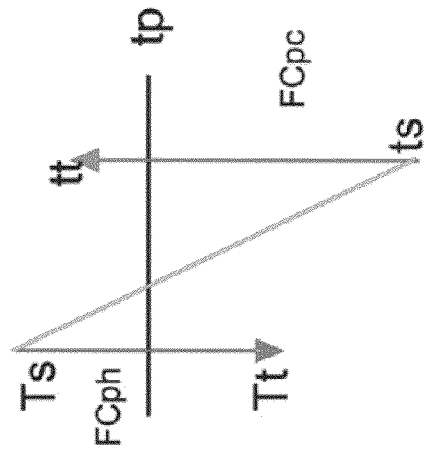

FIG. 12 illustrates a scenario where one stream (a cold stream) is extended across the pinch. New matches will be needed to recover the waste heating load above the pinch (Q_h_waste) and waste cooling load below the pinch (Q_c_waste). Where Q_lost_heating is equal to Q_lost_cooling, this waste "heating load" above the pinch and waste "cooling load" below the pinch are equal to Q_lost_heating=FCph*(Ts−Tt)−FCpc*(tt−tp). If the Q_lost*$/MMBtu saved in both heating and cooling utilities does not justify adding two new units, stop this leg of the process. Otherwise, use the existing unit for matching the hot stream load above the pinch with new cold stream(s) load or cold stream split above the pinch, and insert the new match with an existing cold stream lying at the pinch, if the driving force allows it. Otherwise re-sequence the units on such cold stream to allow the insertion. Where FCph<=FCpc_new, the cold stream and/or the cold split shall be lying at a utility path/heater path, the cold stream split ts, lying at the pinch and its FCph_branch, is equal to Qlost/(Ts−Tt).

According to the exemplary configuration, it is required that for any cold stream to be a candidate match above the pinch, it should be lying on a utility heater path. If ΣFCph is greater than ΣFCpc, with the utility path at the pinch above the pinch of the existing network, change the driving force distribution via modifying process conditions (streams inlet temperature) and/or the ΔT_min_i of the pinch-point-location controlling stream to move/tailor the pinch point location to new desired temperature (tp) that overcomes this constraint. If ΣFCph is less than ΣFCpc with the utility path at the pinch below the pinch of the existing network, the same steps are performed as above. After this modification, check the type of the problem in hand to see if it is still a "single stream across the pinch"-type problem, or if it has become a "two streams across the pinch"-type problem, for example.

Otherwise, the rematch of cold streams and hot streams above the pinch will be needed to have better utility path or heater loading, or to create new ones. Split the hot stream load FCph above the pinch if such desired cold stream matching conditions are not possible and repeat the procedures above.

Below the pinch, the cooling load lost that is equal to Q_lost_cooling=FCpc*(tp−ts) should be connected to a hot stream lying both at a utility path/cooler path and at the pinch, or matched with a hot stream split/branch from a hot stream lying at the pinch and again with the utility path. Note, the existing HE unit can be reused as applicable (regarding space, piping, topology, etc.).

Figure 13:
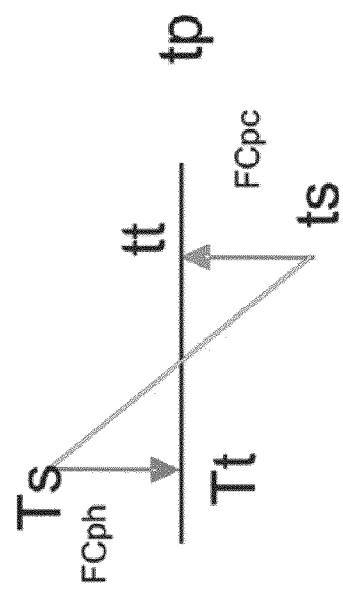

FIG. 13 illustrates a scenario where one stream (e.g., a hot stream) is extended across the pinch. New matches will be needed to recover the waste heating load above the pinch (Q_h_waste) and waste cooling load below the pinch (Q_c_waste) and Q_lost_heating is equal to Q_lost_cooling. In this scenario, this waste "heating load" above the pinch and waste "cooling load" below the pinch are equal to Q_lost=FCph*(Ts−tp), where the temperatures shown in the graph are unit specific, and where tp>=tt (using cold scale temperature as a reference and existing {ΔT_min_i}).

If the Q_lost*$/MMBtu saved in both heating and cooling utilities does not justify adding two new units, stop this leg of the process. Otherwise, use the existing HE unit for matching the hot stream load above the pinch with new cold stream(s) load or cold stream split above the pinch. Specifically, insert the new match with an existing cold stream lying at the pinch, if driving force allows it, otherwise re-sequence the units on such cold stream to allow the insertion, whereby FCph<=FCpc_new. The cold stream and/or the cold split should be lying at a utility path/heater path, and the cold stream split is should be lying at the pinch.

According to the exemplary configuration, it is required that for any cold stream to be a candidate match above the pinch, it should be lying on a utility heater path. If ΣFCph is greater than ΣFCpc with the utility path at the pinch above the pinch of the existing network, change the driving force distribution via modifying process conditions (streams inlet temperature) and/or the ΔT_min_i of the pinch-point-location controlling stream to move/tailor the pinch point location to new desired temperature (tp) that overcomes this constraint. If ΣFCph is less than ΣFCpc with the utility path at the pinch below the pinch of the existing network, repeat the same steps as above. After this modification check the type of the problem in hand, is it still a single hot stream crossing problem, or if it has become a two stream crossing problem, for example.

Otherwise, the rematch of cold streams and hot streams above the pinch will be needed to have better utility path/ heater load or to create new ones. Split the hot stream load FCph above the pinch if such desired cold stream matching conditions are not possible and repeat the procedures above.

Below the pinch, the cooling load lost that is also equal to Q_lost=FCph*(Ts−tp) should be inserted to a hot stream lying at a utility path/cooler path and the same procedures used in the situation above the pinch is applied via exchanging the roles used above the pinch between the hot stream and the cold stream. Note, the existing HE unit can be reused as applicable (regarding space, piping, topology, etc.).

Figure 14:
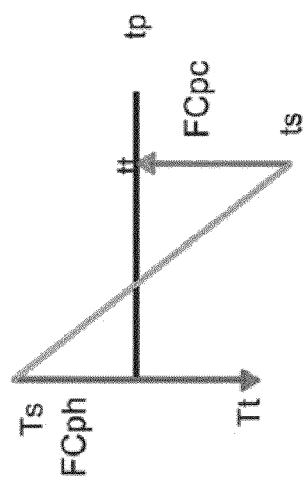

FIG. 14 illustrates a scenario where two streams (e.g., a hot stream and a cold stream) are extended across the pinch. New matches will be needed to recover the waste heating load above the pinch (Q_h_waste) and waste cooling load below the pinch (Q_c_waste). This waste "heating load" above the pinch (Q_lost_heating) and waste "cooling load" below the pinch (Q_lost_cooling) are both equal to Q_lost=FCph*(Ts-tp)-FCpc(tt-tp).

If the Q_lost*S/MMBtu saved in both heating and cooling utilities does not justify adding 3 new units, stop this leg of the process. Otherwise, according to the exemplary configuration, it is required that for any cold stream to be a candidate match above the pinch, it should be lying on a utility heater path. If $\Sigma$FCph is greater than $\Sigma$FCpc at the pinch above the pinch of the existing network, change the driving force distribution via modifying process conditions (streams inlet temperature) and/or the $\Delta T\_min\_i$ of the pinch-point-location controlling stream to move/tailor the pinch point location to new desired temperature (tp) that overcomes this constraint. If $\Sigma$FCph is less than $\Sigma$FCpc at the pinch below the pinch of the existing network, repeat the procedures as above. After this modification, check the type of the problem in hand to verify that it is still a two-stream crossing problem.

Otherwise, a rematch of cold streams and hot streams above the pinch may be needed to have a better utility path/heater load or to create new ones. Split the hot stream load FCph above the pinch if such desired cold stream matching conditions are not possible and repeat the procedures above. Reduce the Q_lost_heating={FCph*(Ts-tp)-FCpc(tt-tp)} load from the existing HE unit and split the hot stream to get new branch FCph=Q_lost/Ts-tp. Match this branch with a cold stream above the pinch at the pinch where FCph_branch<=FCpc so that this cold stream lies at a utility path/heater path. Note, the existing HE unit can be reused as applicable (regarding space, piping, topology, etc.).

The rules mentioned in previous cases apply. Below the pinch, the cooling load lost that is also equal to Q_lost_cooling={FCpc*(tp-ts)-FCph(tp-Tt)} is matched with a hot stream lying at a utility path/cooler path at the pinch via the split of the cold stream portion to render FCp_branch, where FCpc_branch=Q_lost_cooling/(tp-ts).

Figure 15:
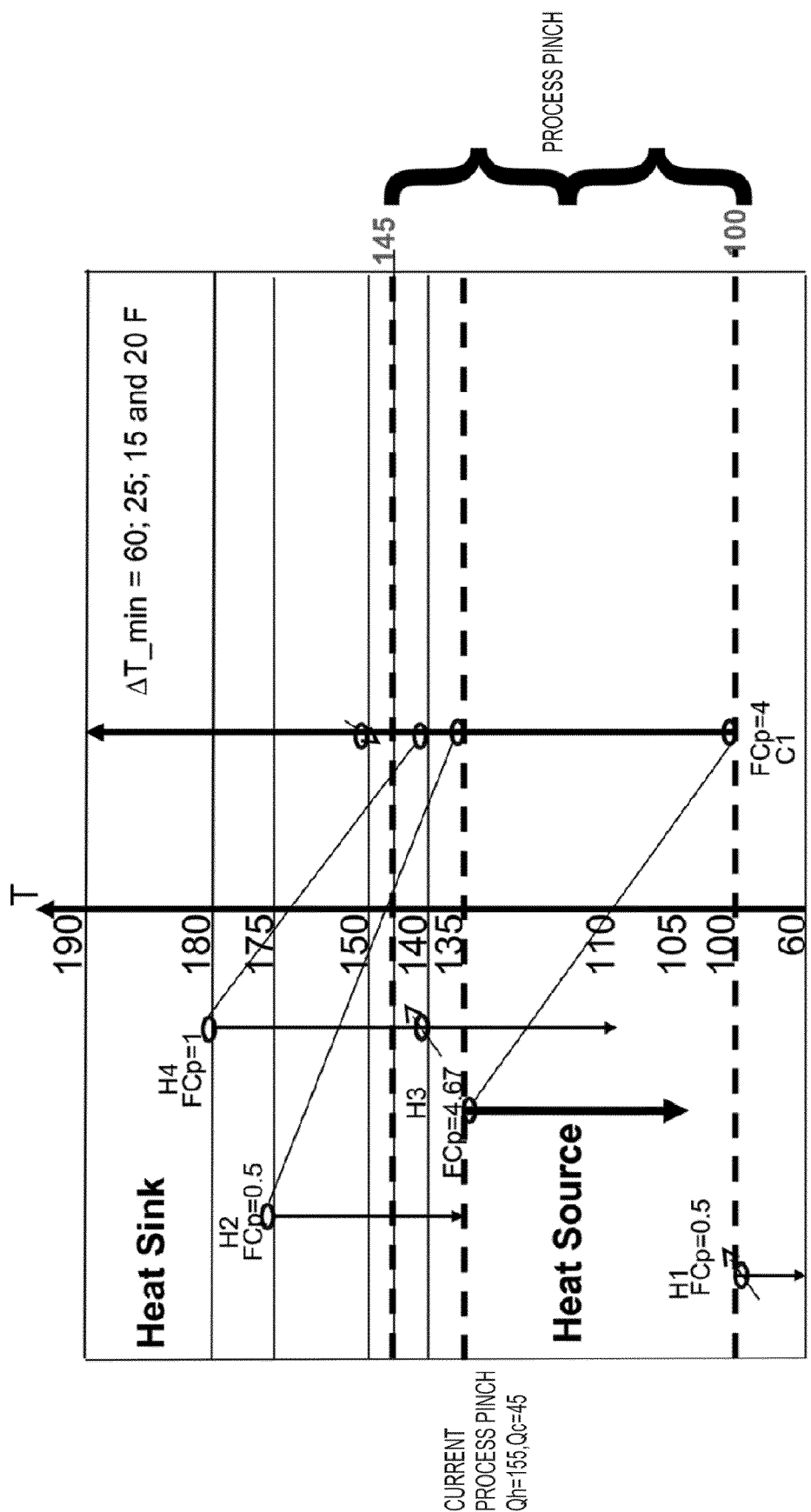
FIGS. 15-24 are a set of schematic diagrams illustrating systematic techniques for finding retrofit solutions according to an embodiment of the present invention.

FIGS. 15-24 illustrate an example of a systematic technique for implementing the "find solutions" phase. As shown in FIG. 15, at the current conditions, none of the heat exchangers cross the pinch, there is no use of a hot utility below pinch. Further, it can be seen that H3 is controlling the pinch point location till its $\Delta T\_min\_H3=5$, and below that (e.g., $\Delta T\_min\_H3=4$), C1 controls the pinch. Upon the decision maker's selection of optimal pinch location for lifetime retrofit, the heat flow from problem sink to source shall be corrected, use of the hot utility in the process source section shall be corrected, use of cold utility in process sink section shall be corrected, the minimum number of units shall be used, and the $\{\Delta T\_min\_i\}$ set values shall be reduced one-by-one to reach desired targets.

Figure 16:
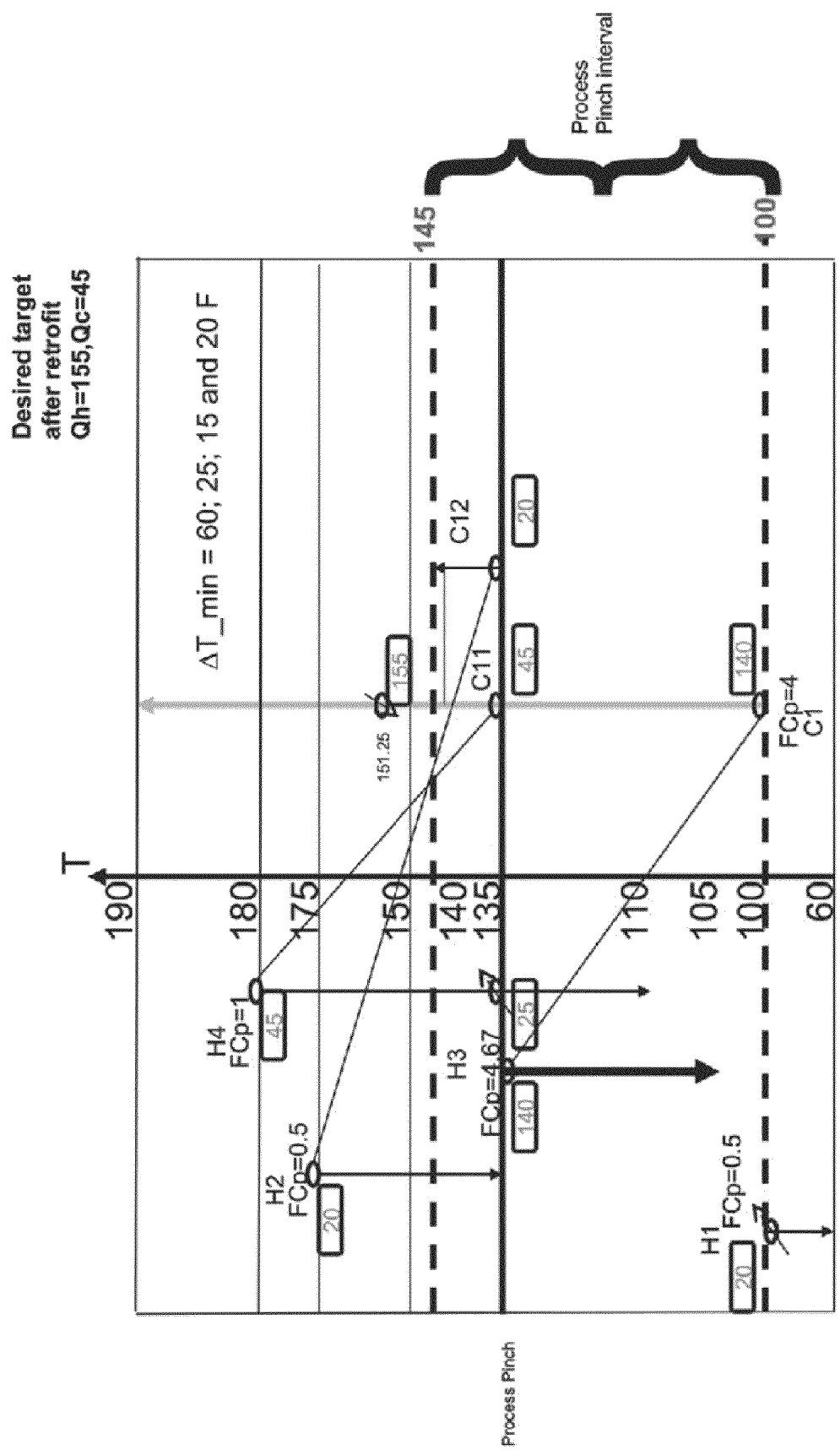

In this example, as shown in FIG. 16, to correct the lost-in-topology energy, split C1 above the current pinch (135° F.) and move the H4 cooler below the current pinch. The result is that now there is no cross pinch heat exchange or inappropriate use of utilities. The desired target after retrofit with this design, however, is Qh=155, Qc=45. Additional savings may be possible. Further, it would be expected that as energy costs increase, decision-makers would request more/next retrofit project(s), possibly after some or many years from now. In order to prepare for such requests, the analysis shown in FIGS. 17-23 includes an examination of the effect of reducing $\{\Delta T\_min\_i\}$ values with future retrofit project still in sight, performed via evolutionary steps but with reference to an optimal pinch that we want to reach (e.g., selected by the decision maker(s) ahead of any retrofit project from within the process pinch interval).

Figure 17:
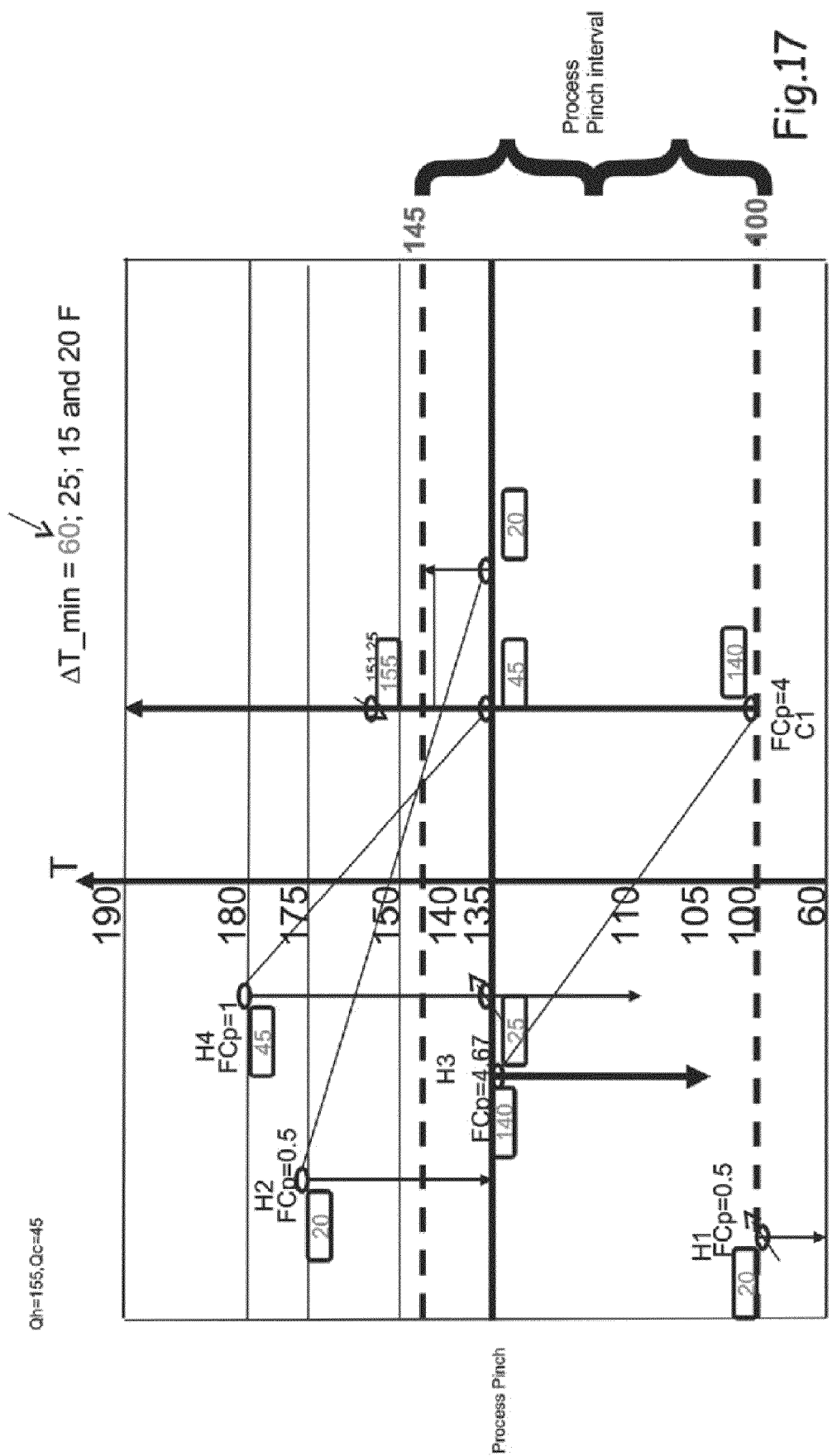
Figure 18:
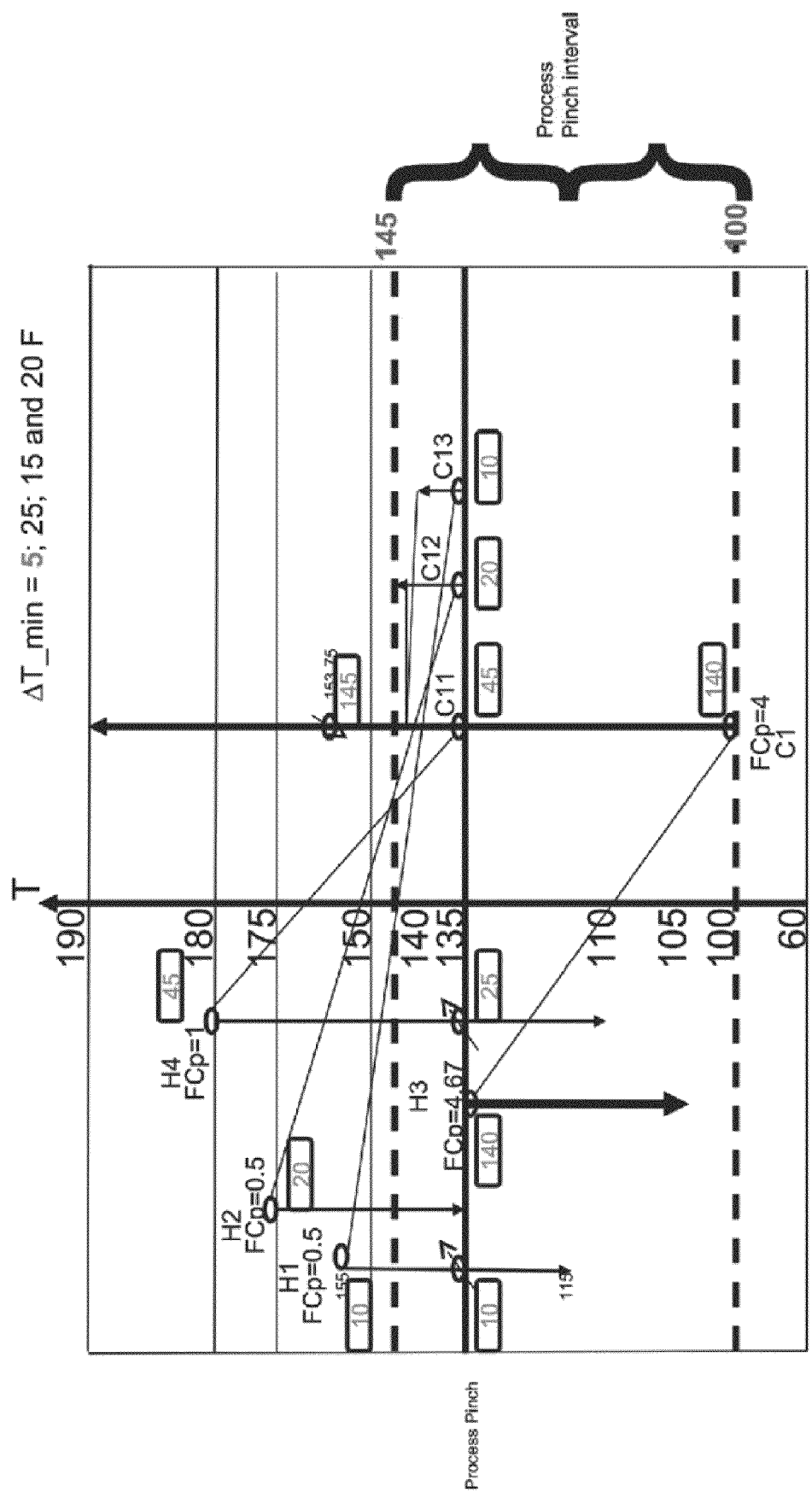

For example, as shown in FIG. 17, $\Delta T\_min\_H1$ is currently at 60° F. As shown in FIG. 18, $\Delta T\_min\_H1$ can be reduced to 5° F., for example, to examine its effect. Note, by starting with H1, the process avoids changing the pinch point location. The change in $\Delta T\_min\_H1$ results in the stream moving above the pinch. In order to utilize the energy above the pinch, C1 can be further split and an additional HE unit can be added (e.g., H1-C13).

Figure 19:
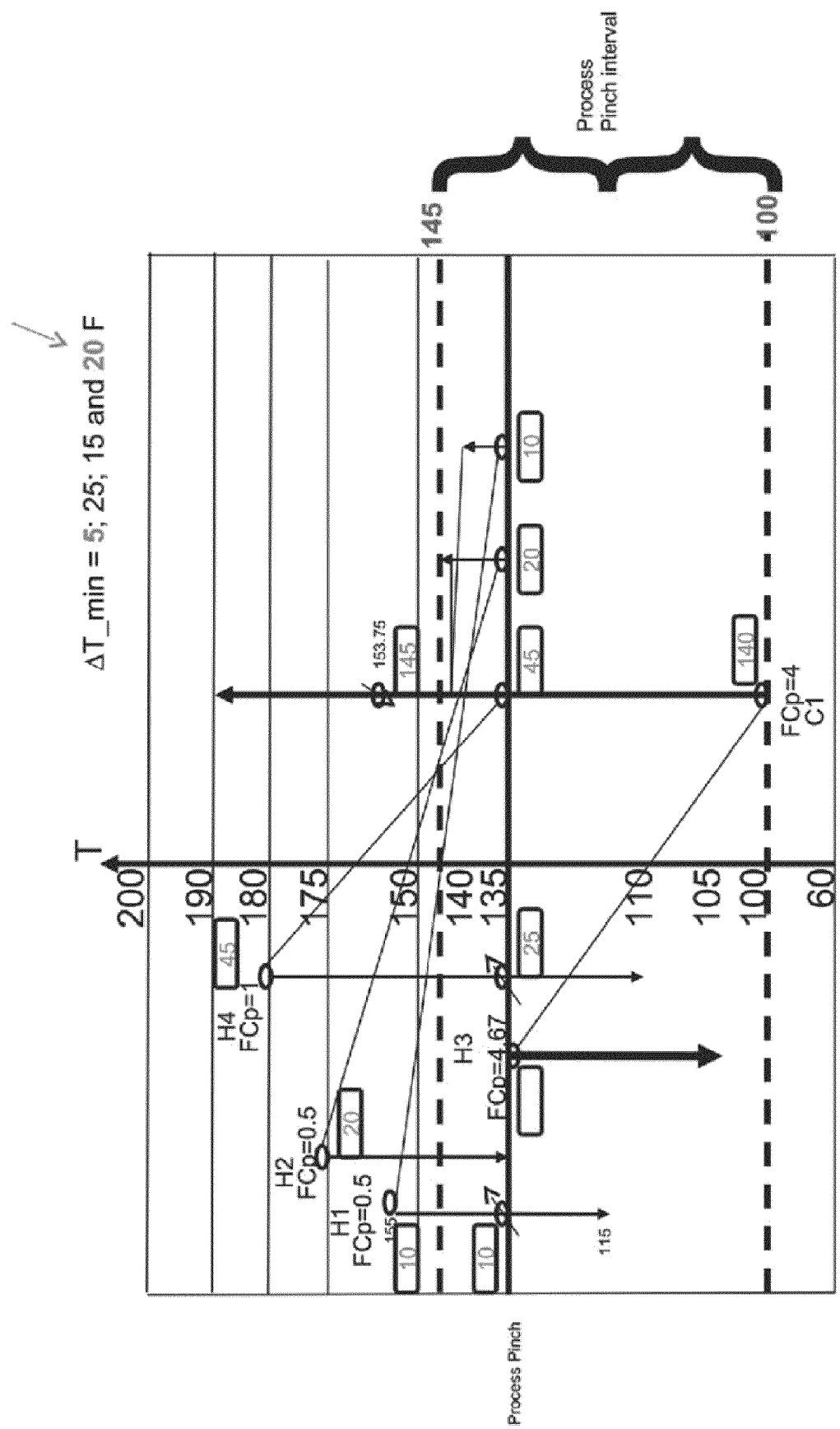
Figure 20:
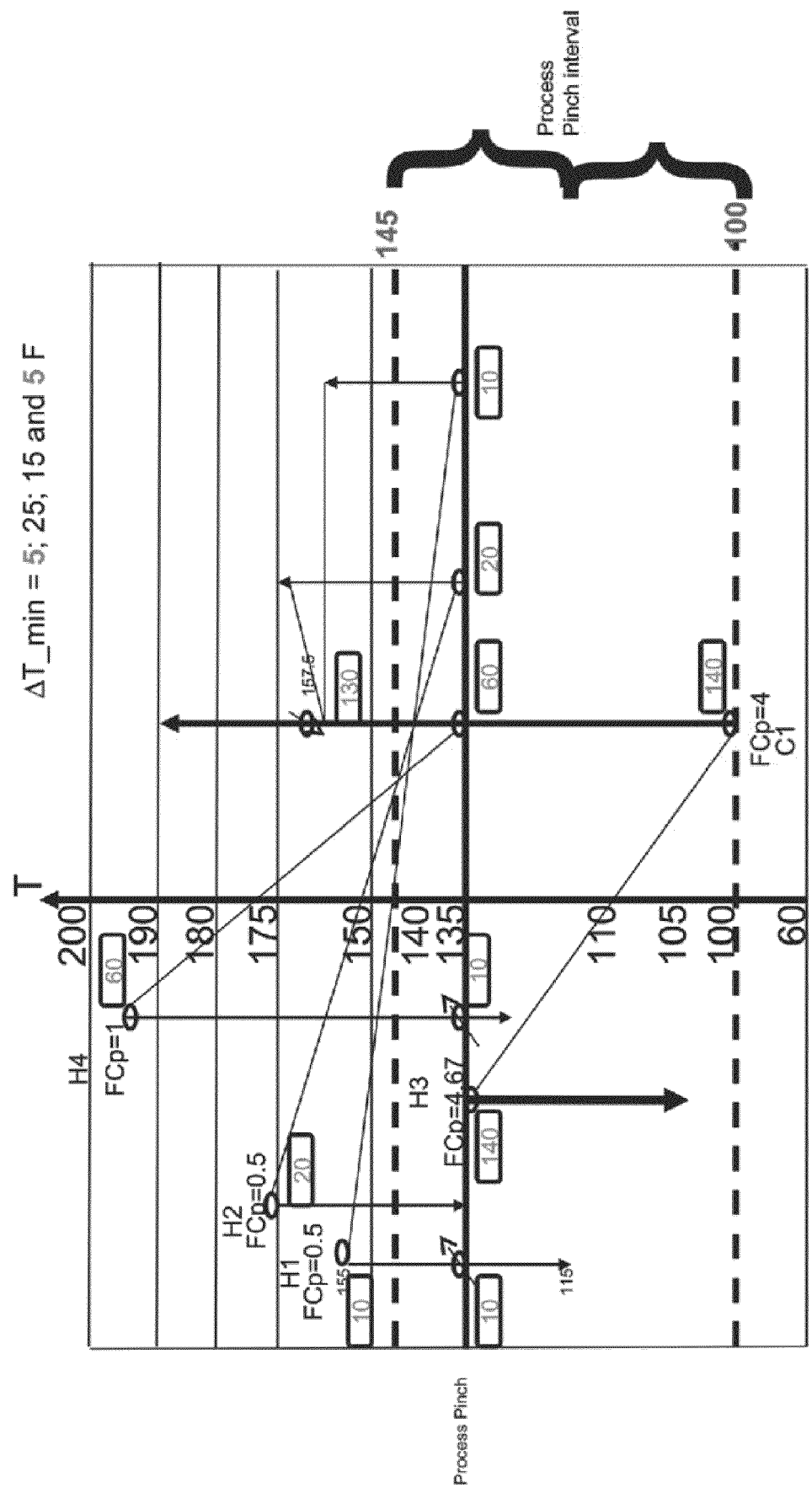

As shown in FIGS. 19 and 20, $\Delta T\_min\_H4$ can be identified and similarly reduced to 5° F., for example, to examine its effect. If these modifications render the previously selected target by the decision maker, using the three sequential retrofit projects over the life span of an old plant, then stop. Note, there is no benefit in reducing $\Delta T\_min\_H2$ because it does not result in a change in waste heat recovery according to the illustrated structure. This is because the whole heating load (Q) of the hot stream H2 has been completely utilized/exchanged in the current structure. Hence no more waste heat/energy is possible/available for further recovery from that stream.

Figure 21:
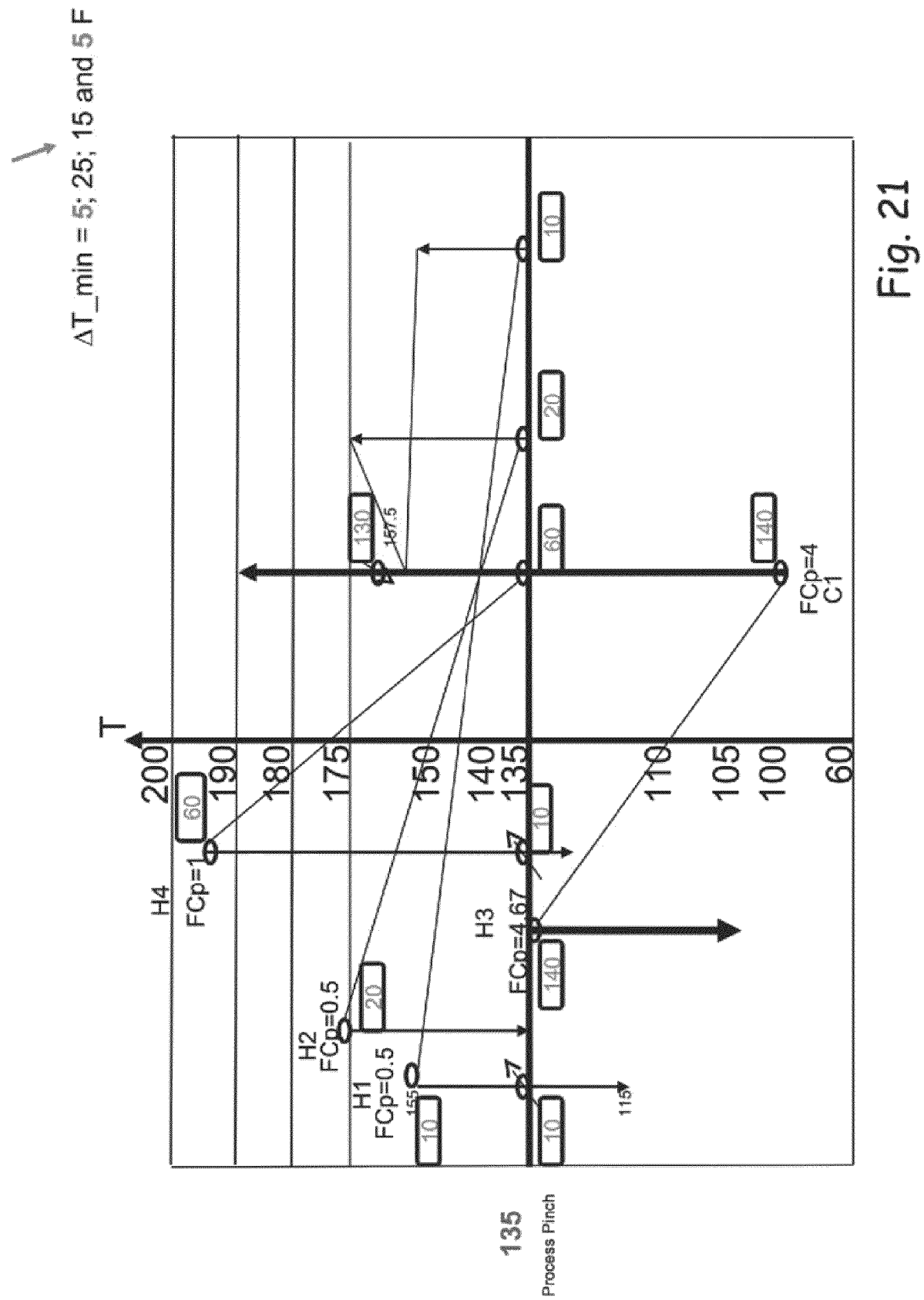
Figure 22:
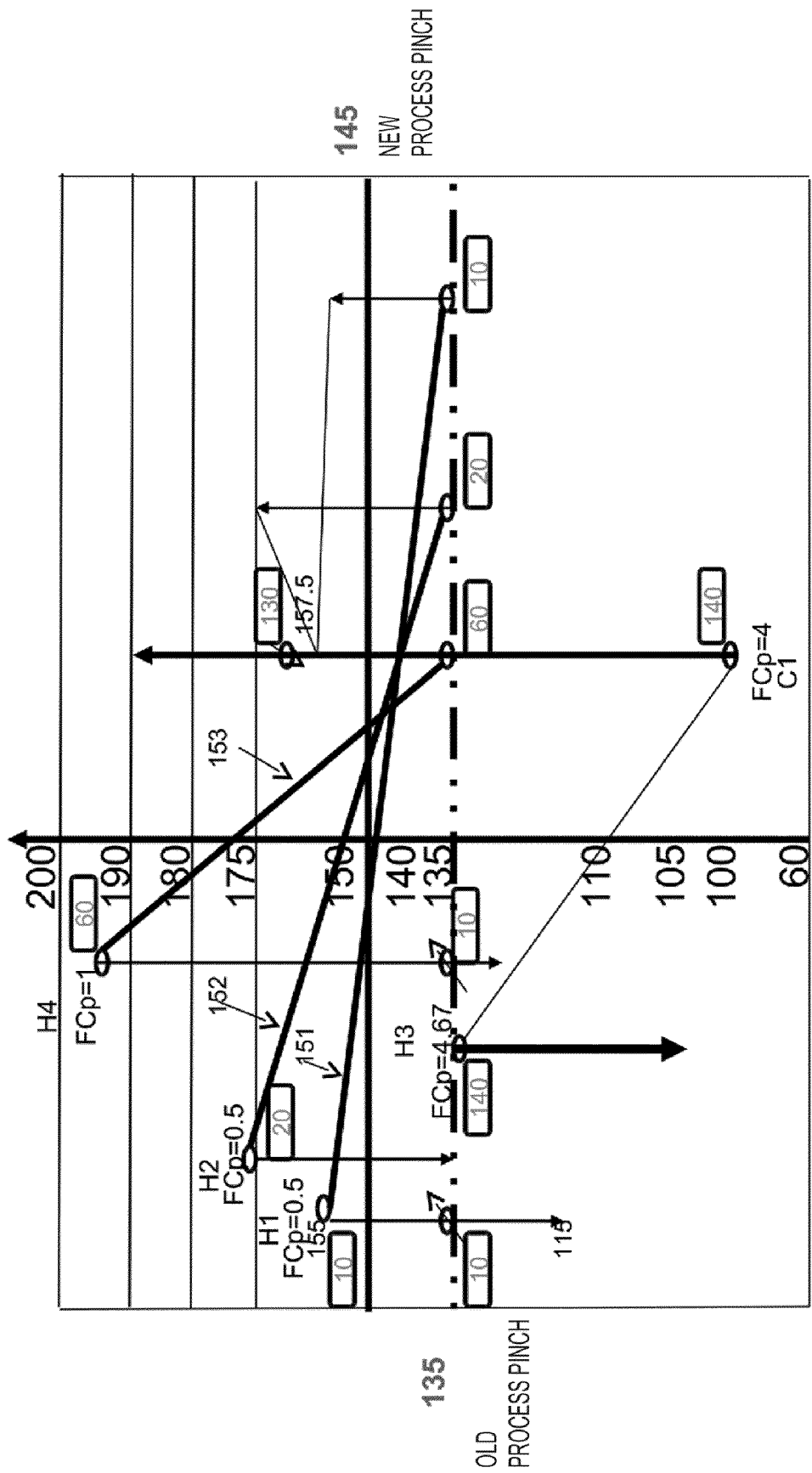
Figure 23:
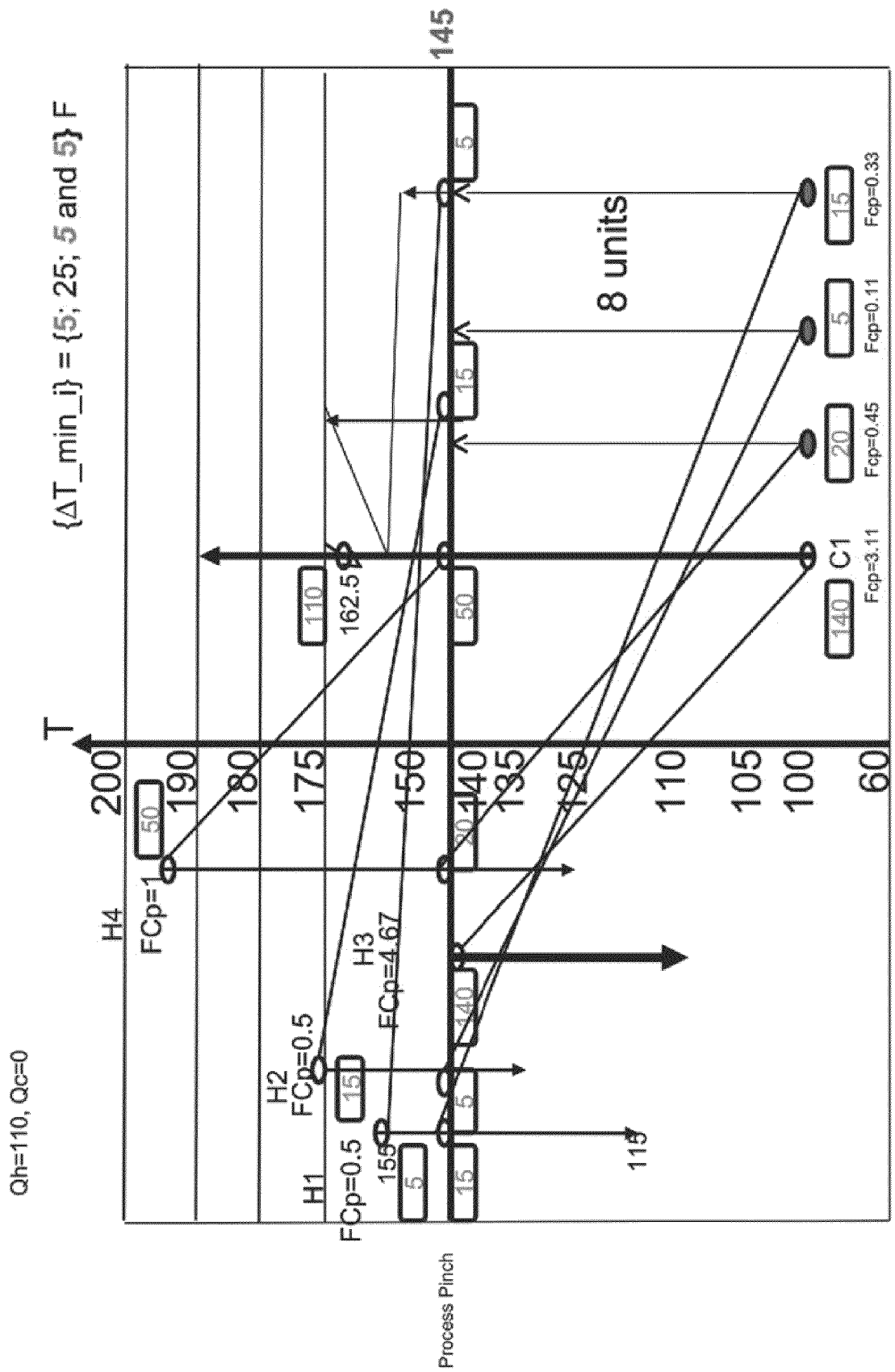

If the decision maker changes his/her mind now and wants to pursue a new retrofit project after 3 to 5 years or he/she did not consider future retrofit projects during the first project, as is the case now in current state-of-art methods, then as shown in FIGS. 21-23, he/she will face a problem initiating the new retrofit project. To initiate the new retrofit project, one examines the current state of a network. If there is no pinch crossing or inappropriate use of utilities then we can only add surface area and/or enhance existing HE units to recover more waste heat.

For example, assume the decision maker wishes later to reduce the energy targets for the structure shown in FIG. 21 to Qh=110, Qc=0, e.g., through a reduction in $\Delta T\_min\_H3$ to 5° F. As shown in FIG. 22, this would cause the pinch point (temperature) to move to a new location at 145° F., resulting in new cross pinch heat transfers shown at 151-153 (thick lines) and jeopardizing the previous action taken in old retrofit projects some years ago (in previous projects).

As shown in FIG. 23, to tackle this new situation and reach the desired energy targets by the decisions maker(s), three more matches HE units in the process source region can be added to reach the desired targets. Such option, however, might not only become expensive, but also impractical due to the plant's plot plan constraints.

Figure 24:
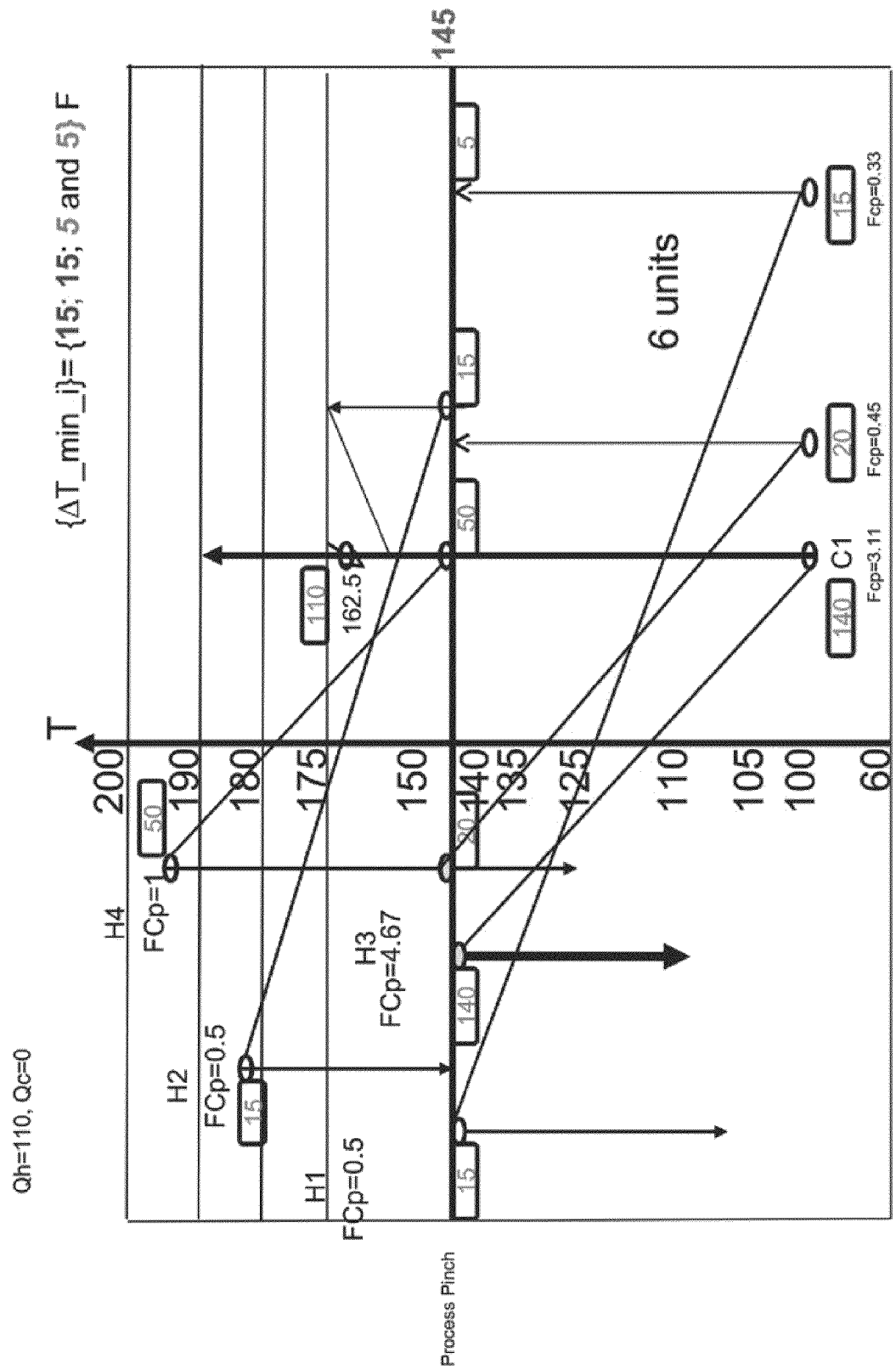

FIG. 24 illustrates that a more favorable outcome can be had in scenarios where, according to various embodiments of the present invention, the decision maker(s) select the plant lifetime or life cycle retrofit projects targets and identify the optimal pinch point location (e.g., 145° F.) ahead of all retrofit projects that are going to be implemented along the plant lifetime. As illustrated in the figure, the previously discussed ambitious energy targets can be obtained using less number of units (e.g., six HE units total), and thus, is more likely that the decision maker would be able to obtain approval on his/her project due to overcoming the plant's plot plan constraints. In other words, he/she can continue performing retrofit projects without having to stop in the middle of the road.

Figure 26:
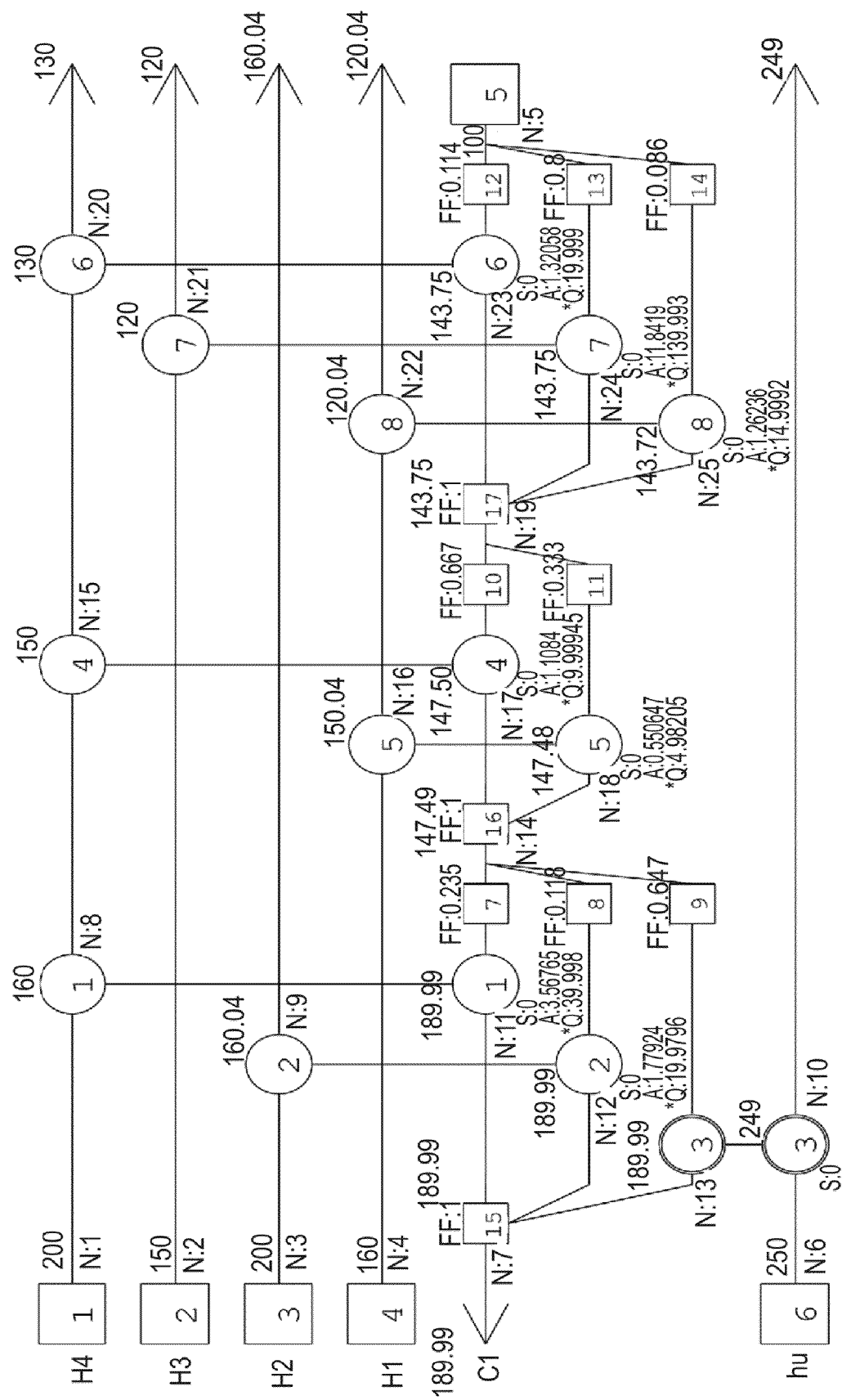
FIG. 26 is a schematic diagram of an existing HEN according to a software application using pinch technology.

FIG. 25 illustrates a data entry page for the network described in FIG. 15 but with energy targets for the structure set as follows: Qh=110, Qc=0. For purposes of comparison to illustrate the benefit of various embodiments of the present invention, FIG. 26 illustrates a resulting network configuration according to a commercial software application using pinch technology. Notably, the figure illustrates that even if allowed to re-design the whole network from scratch to reach desired energy recovery objective, using the state-of-the-art application, the produced solution still requires 8 HE units.

Figure 27:
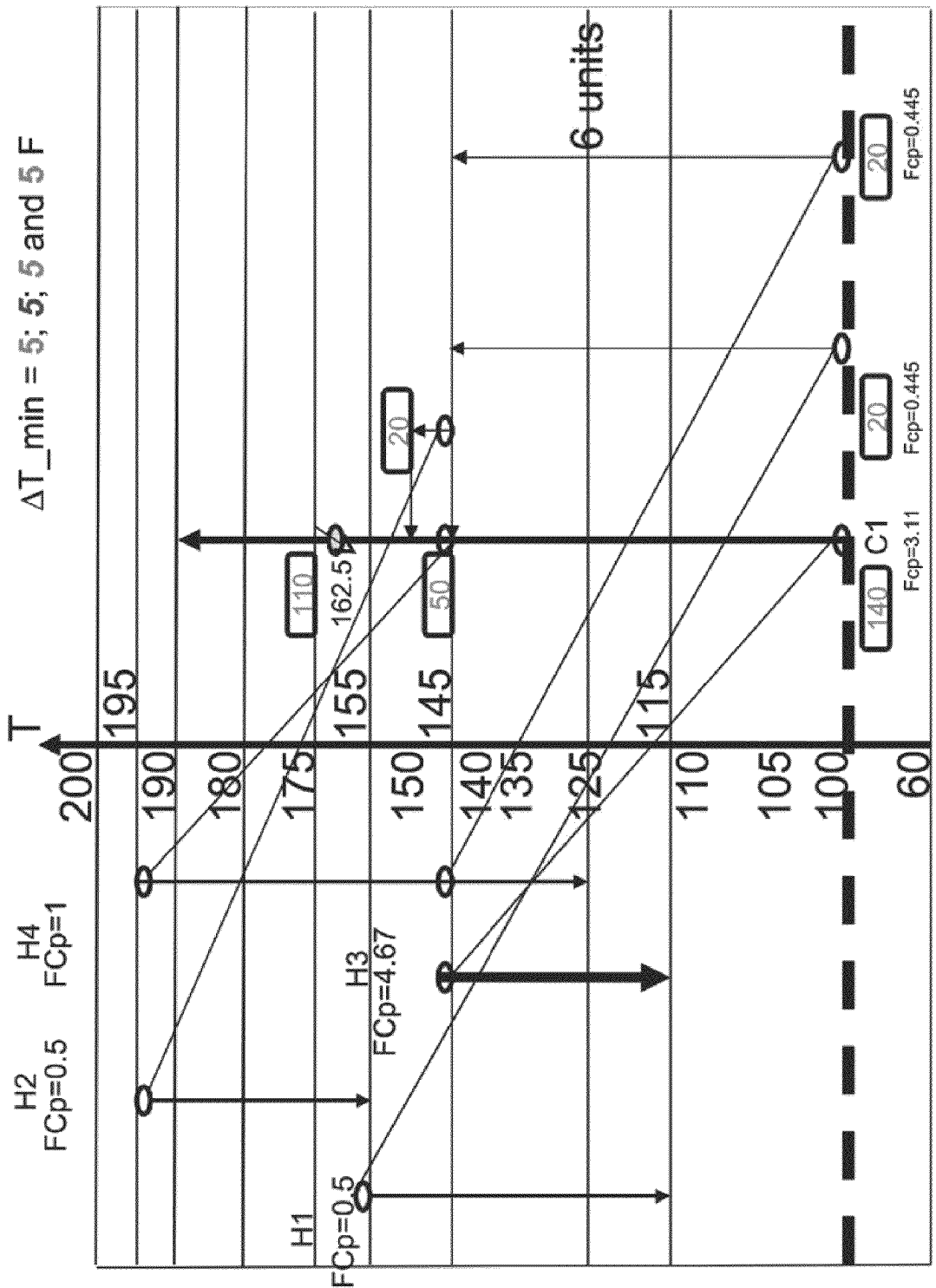
FIG. 27 is a schematic diagram illustrating a graphical representation of results of a systematic technique for lifetime retrofit solution example performed on the HEN of FIG. 26 according to an embodiment of the present invention.

In contrast, for illustrative purposes, FIG. 27 shows the results of a systematic technique for lifetime retrofit solution example. According to an embodiment of the present invention, if the decision maker(s) decides to select the pinch location at the lower end of the pinch interval (e.g., 100° F. line) which is controlled by stream C1 as his/her final stop in his/her retrofit projects journey, the problem becomes threshold, where there is no conventional systematic method which includes the engineer in the loop according to the state-of-the-art. However, the process described above in conjunction with the various processes described in U.S. Provisional Application No. 61/256,754, filed Oct. 30, 2009, titled "System, Method, and Program Product for Synthesizing Non-Constrained and Constrained Heat Exchanger Networks and Identifying Optimal Topoloy for Future Retrofit" and its progeny, for example, can provide the design shown in the figure.

Figure 28:
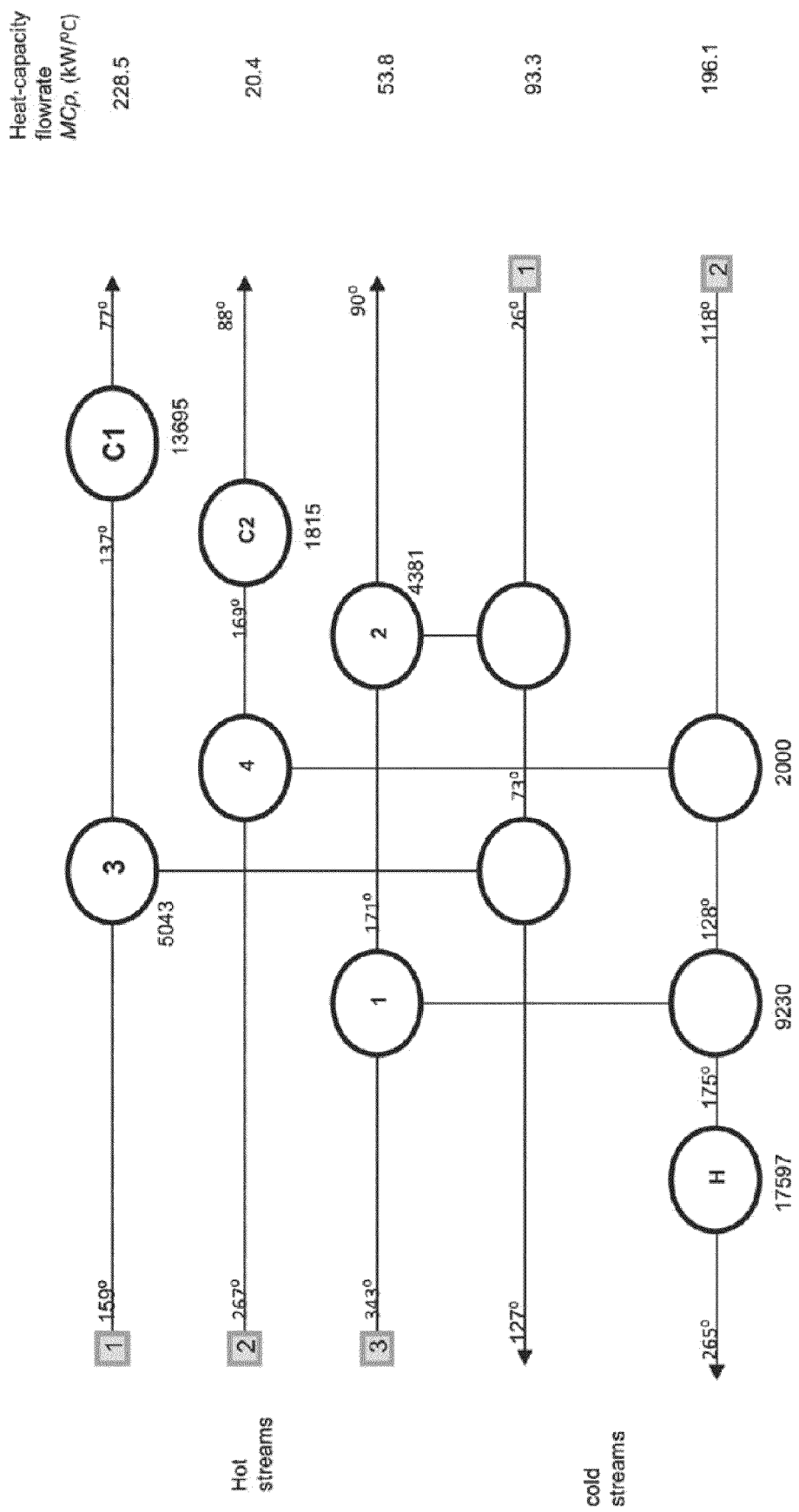
FIG. 28 is a schematic diagram of an existing HEN according to a software application using pinch technology.
Figure 29:
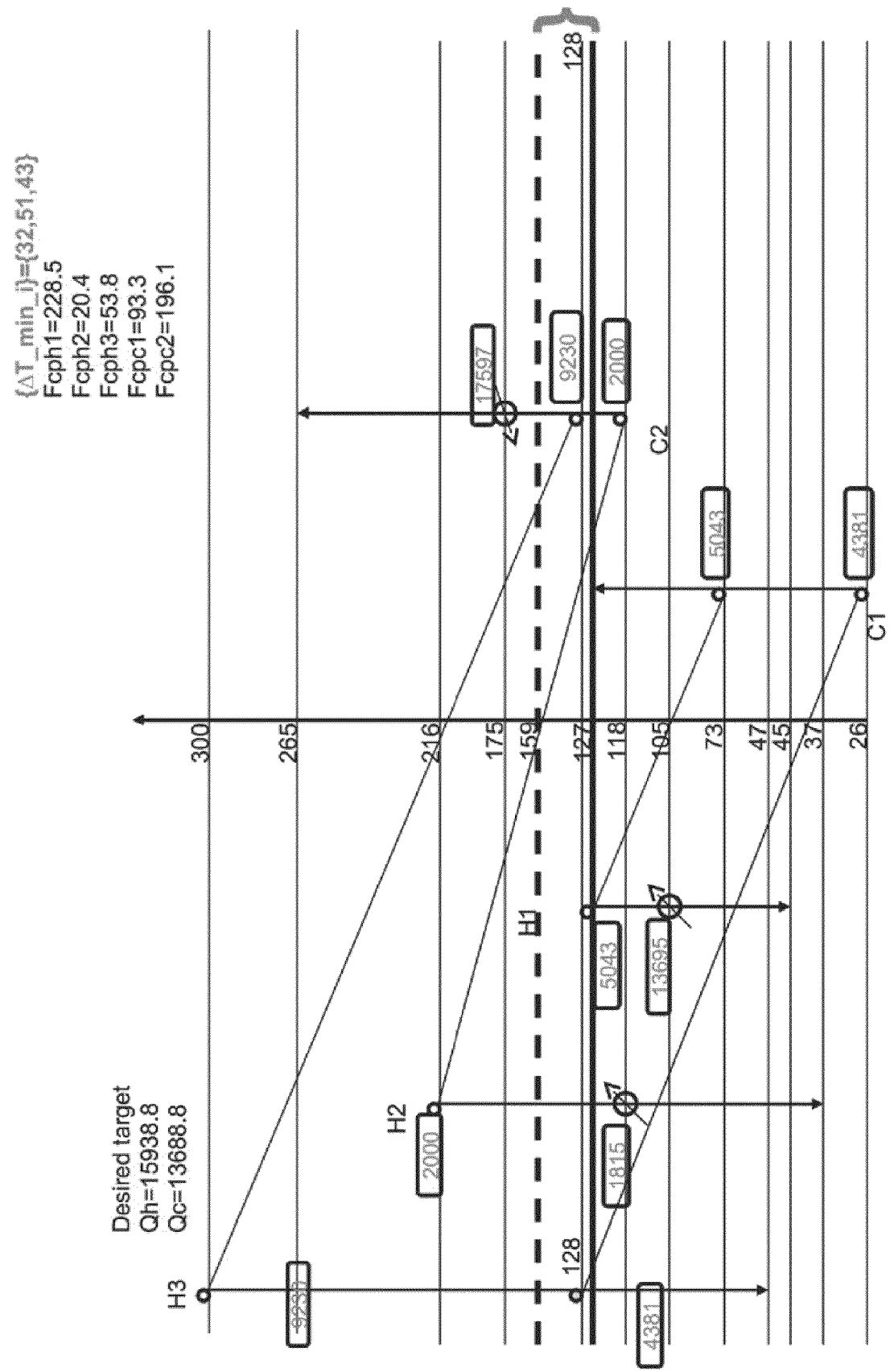
FIG. 29 is a schematic diagram illustrating a graphical representation of the HEN of FIG. 28 according to an embodiment of the present invention.

FIG. 28 illustrates a conventional representation (Linnhoff et al.) of a simple example of an industrial process. For comparative purposes, FIG. 29 illustrates a representation according to an embodiment of the present invention. Such improved representation beneficially assists decision-makers in visualizing design errors and in determining controlling streams, the existence of cross-pinch heat exchange units, etc. In the illustrated industrial process, H1 controls the pinch location and has the highest impact on the energy recovery. Notably, the pinch point at 127° F. is never obtained via reducing the "global" $\Delta T\_min$.

Figure 30:
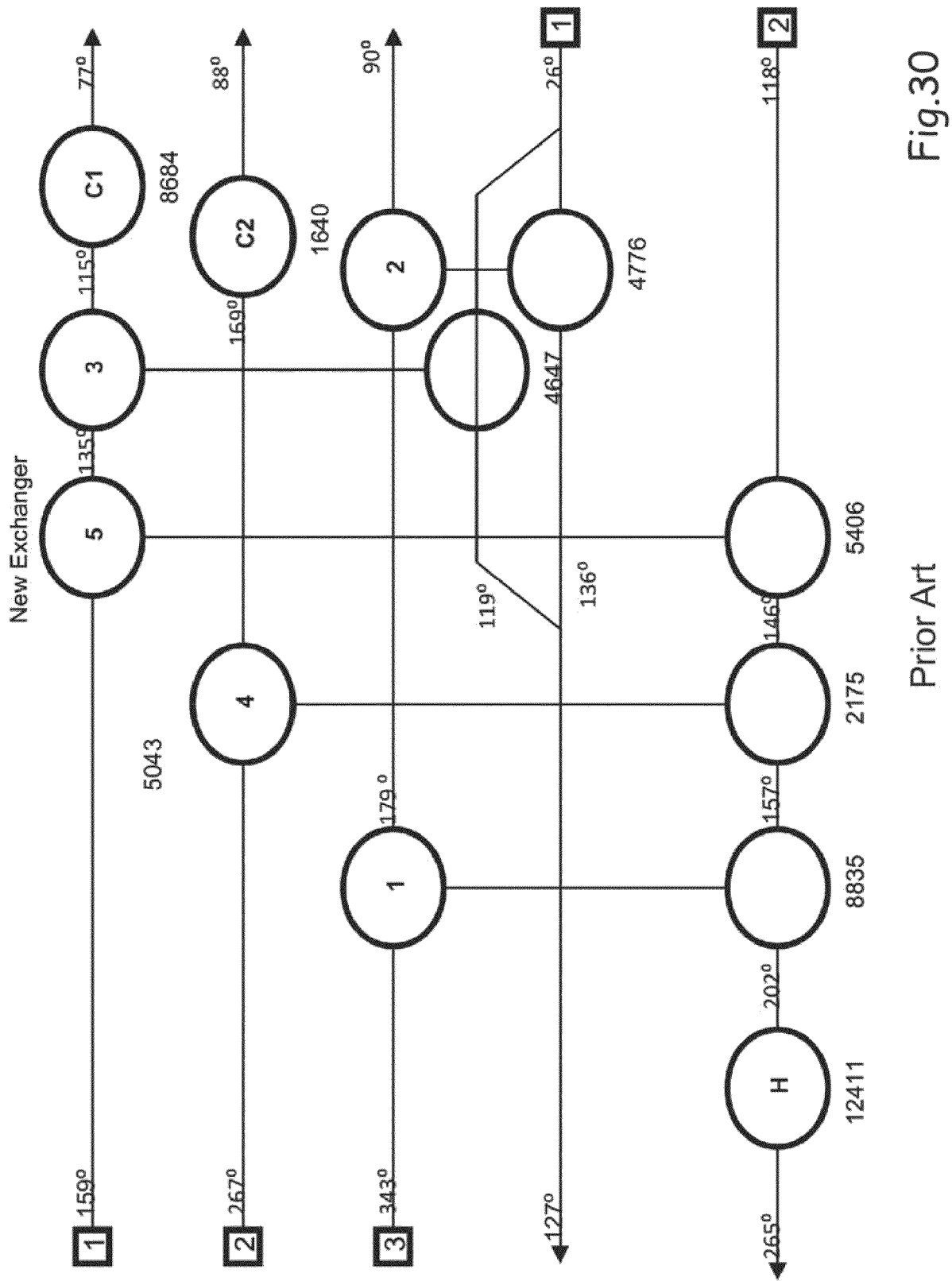
FIG. 30 is a schematic diagram illustrating a graphical representation of a retrofit of a HEN according to a software application using pinch technology.
Figure 31:
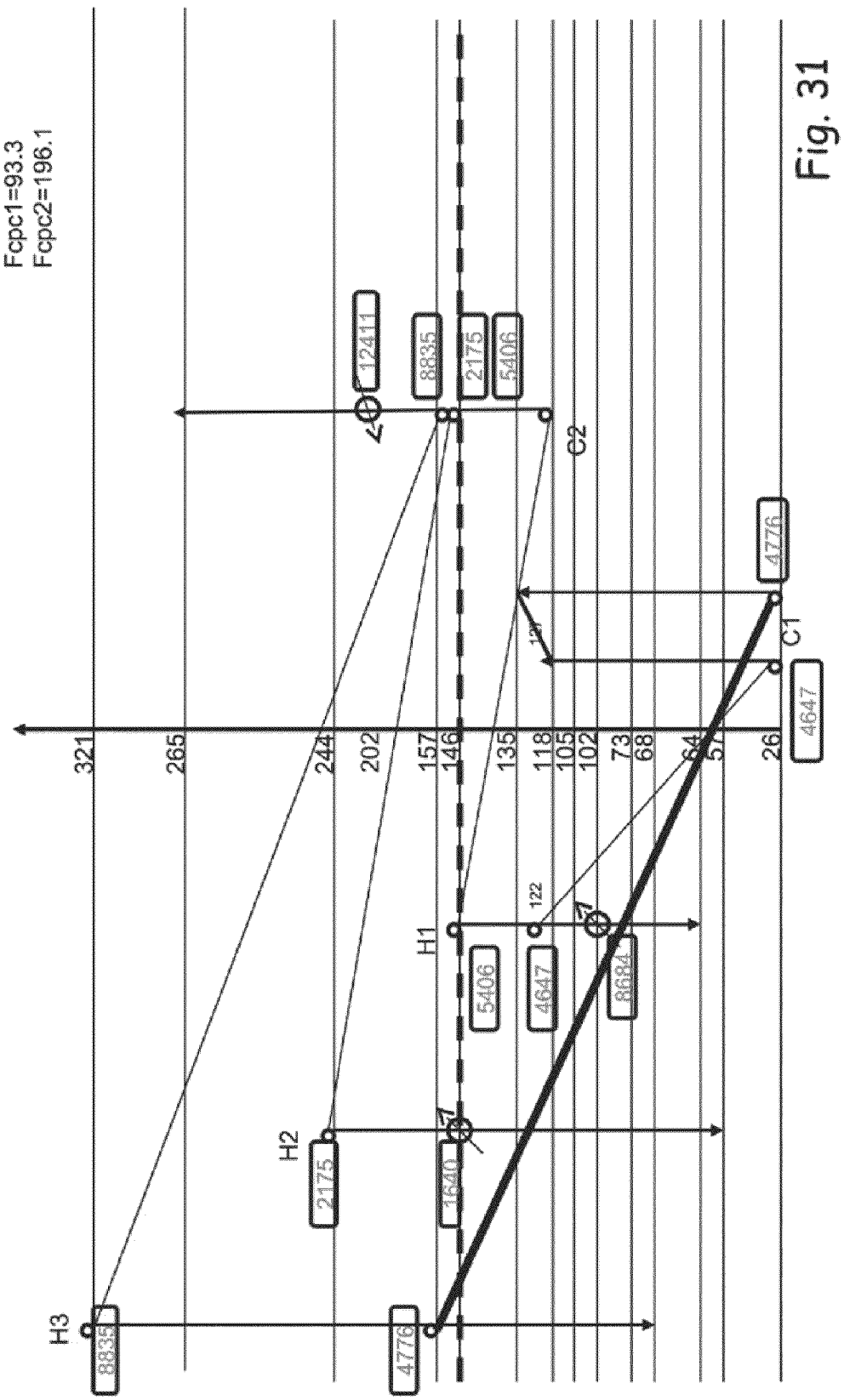
FIG. 31 is a schematic diagram illustrating a graphical representation of a retrofit solution test on the HEN of FIG. 30 according to an embodiment of the present invention.

FIG. 30 illustrates another conventional representation of the industrial process showing the addition of a new HE unit between H1 and C2. For comparative purposes, FIG. 31 illustrates a representation according to an embodiment of the present invention. Notably, an ad hoc global $\Delta Tmin=19°$ F. is used to locate arbitrary pinch point and find new waste heat recovery targets. In this example, after the HEN retrofit project design is completed, a global $\Delta Tmin=15°$ F. not $19°$ F. is instead used and, as shown in FIG. 31, the network after retrofit still exhibits cross pinch heat transfer. Note, the Linnhoff et al. example is not systematic, needs iteration, requires initialization that is ad hoc and cannot be used as a standard plant-life-time retrofit methodology.

The table below provides a high-level summary of "procedures for retrofit project solutions finding" according to an example of an embodiment of the present invention:

| Step | Description |
| --- | --- |
| Step #0: | Identify structure of current HEN (see, e.g., FIG. 32). |
| Step #1: | Present in the problem using the new linear-based graphical retrofit diagram (see, e.g., FIG. 33). |
| Step #2: | Use interval-based concept for [{$\Delta T\_min\_i$}] as a starting point to synthesize the retrofitable topology via finding first retrofit energy targets and selecting desired ultimate energy goal targets. Depict the problem at two {$\Delta T\_min\_i$} sets, one is the actual one and the second where {$\Delta T\_min\_i$} = {0.0, 1, or 5}. |
| Step #3: | Calculate minimum number of HE units interval. Calculate minimum number of units at the two cases using the n − 1 pinch technology heuristic. |
| Step #4: | Identify pinch point locations interval - i.e., range of pinch location changes due to all potential anticipated future variations in process conditions and/or {$\Delta T\_min\_i$}. |
| Step #5: | Calculate total energy lost-in-topology (no of units and wrong matching) energy for the existing topology {$\Delta T\_min\_i$}. |
| Step #6: | Identify the lost-in-constraints energy components: lost-in-wrong-matching; lost-in-area constraint (lost-in-{$\Delta T\_min\_i$}); and lost-in-number-of-units constraint. Note, the lost-in-wrong-matching constraint is likely to be the controlling constraint if a relaxing of number of units constraint does not lead to the desired waste heat recovery target. |
| Step #6.1: | Calculate lost-in-wrong-matching energy component: add/increase number of HE units till reaching minimum number of units via adding new coolers and heaters as well as new HE units using streams split then calculate lost-in-wrong-matching practices energy units, or manipulate the current topology matching scheme at the current {$\Delta T\_min\_i$} via splitting only. |
| Step #6.2: | For zero lost-in-matching topology, calculate for the lower {$\Delta T\_min\_i$} lost in-area-targets. |
| Step #7: | Select optimal pinch point location from energy point of view, minimum number of units to be added point of view, or both points of view. |
| Step #8: | Exploit and/or correct current utility path and create new ones. |
| Step #9 | Apply wrong matches correction via creating new utilities path(s). disconnect matches across the optimal pinch and rematch as follows: For a cold utility above the pinch, remove cooler and match the hot stream(s) with cold stream that is equal to it or heavier at the same interval or at a lower interval via cold stream split. For hot utility below the pinch, remove heater and match the cold stream(s) with a hot stream that is equal to it or heavier at a higher interval via hot stream split. For streams across the pinch, check for the available cold load at the pinch above the pinch to satisfy the available hot load at the pinch above the pinch for matching via split. If not possible, change utility path (matching) before checking again to realize the energy saving targets and perform the reverse at the pinch below the pinch. Upon need for only one time retrofit (one that gives highest impact on process heat recovery upon putting its $\Delta T\_min\_i = 0.0$ K), move the pinch point (instead of removing the cross matches) to be completely above or below the two matched streams, if possible, using process conditions changes and/or {$\Delta T\_min\_i$} optimization (in the middle of design if necessary). |

-continued

| | |
|---|---|
| Step #10: | Apply surface area correction according to capital-energy trade off. |
| Step #11: | Use marching technique to get rigorous retrofit targets upon $\{\Delta T\_min\_i\}$ systematic reduction.<br>Apply one-by-one $\Delta T\_min\_i$ reduction to be done after lost-in-topology corrections (define optimal pinch point).<br>Find rigorous structure independent of process pinch-interval using two $\{\Delta T\_min\_i\}$ sets, the existing used in the network to be retrofitted and a lower bound one. |
| Step #12: | Apply NLP to optimize additional total area for given topology -- i.e., determine load distribution and streams split using NLP for defined topology to minimize total additional HEN area. |

The steps described above can be further divided into various phases including the "insights phase" which includes generating lab test reports, the "targeting phase," and the "find solutions" phase.

The table below provides a high-level summary of portions of the "insights/lab test" phase according to an example of an embodiment of the present invention:

| | |
|---|---|
| Step # 1: | Define process pinch point at the current $\{\Delta T\_min\_i\}$. |
| Step # 2: | Define process pinch interval. |
| Step # 3: | Identify "implicit" pinch point, if needed, in threshold problem applications. |
| Step # 4: | Calculate minimum number of HE units at each case. |
| Step # 5: | Identify optimal pinch point location from both number of units and energy consumption points of view. |
| Step # 6: | Draw physical process pinches. |

The table below provides a high-level summary of portions of the "targeting" phase according to an example of an embodiment of the present invention:

| | |
|---|---|
| Step # 1: | Find lost-in-typography energy targets:<br>Lost-in-units energy target due to less than optimal number of units used in current structure.<br>Lost-in-wrong matching practices energy target |
| Step # 2: | Find lost-in-area energy target. |

The table below provides a high-level summary of "Find Solution" phase according to an example of an embodiment of the present invention:

| | |
|---|---|
| Step # 0: | Calculate/determine and graphically display structure of current HEN. To find solution, start with stream leading to optimal pinch. Do not treat threshold problem as pinch problem. |
| Step # 1: | Use current process pinch point location as a starting point. |
| Step # 2: | Manipulate $\Delta T\_min\_i$ of the stream controlling pinch location. |
| Step # 3: | Apply minimum number of units correction.<br>Define HE units that renders the optimal pinch point identified in the Lab report |
| Step # 4: | Apply wrong matches correction. |
| Step # 5: | Apply area correction. |
| Step # 6: | Apply one-by-one $\Delta T\_min\_i$ reduction to be done after lost-in-topology corrections.<br>Define $\{\Delta T\_min\_i\}$ set that renders the optimal pinch point identified in the Lab report |
| Step # 7: | Apply NLP to optimize additional total area for given topology -- i.e., determine load distribution and streams split using NLP for defined topology to minimize total additional HEN area. |

The table below provides a high-level summary of "Find Solution General Matching" procedures according to an example of an embodiment of the present invention:

| | |
|---|---|
| Step # 0: | To manage non-exchangeable load in the existing HEN above and below the pinch, disconnect, insert and/or split and add new matches through the following steps: |
| Step # 1: | Look for the current utility path(s) and exploit them. |
| Step # 2: | Reassign new utility path(s)/create new utility path via re-matching. |
| Step # 3: | Perform matching in accordance with the three problem categories: (a) no stream is extended across the pinch; (b) one stream of the matching pair extends across the pinch; or (c) both streams of the matching pair extend across the pinch. Note, the stream target temperature and pinch temperature may or may not coexist together. |
| Step # 4: | Before finding the solution, calculate the "exact loads" to be moved up and down the pinch via splitting and re-matching. |
| Step # 5: | Change driving force distribution via modifying the $\Delta T\_min\_i$ of the pinch-point-location controlling stream to move the pinch point to the new desired temperature (tp). |

-continued

Step # 6: If the non-exchangeable load is going to a cooler above the pinch and/or heater below the pinch, disconnect such utility exchanger(s) and match the heating load with a cold stream load above the pinch where FCpc >= FCph at a utility path and the cooling load below the pinch with a hot stream where FCpc<=FCph at a utility path.

FIGS. 32-42 illustrate an example of a systematic technique for implementing procedures for retrofit project solutions finding using an industrial process example identified in Shenoy, "Heat Exchanger Network Synthesis" (1995), which provides long-term targeting for both energy recovery and number of units to be added, which overcomes conventional process pinch, methods which, for example, use ad hoc global $\Delta T\_min$ and its rules whereby solutions are packaged, not inclusive, do not consider future retrofit, are not robust, and are limited by the fact that each ad hoc change in global $\Delta T\_min$ changes the whole scheme of solutions without no clear connection among solutions.

Figure 32:
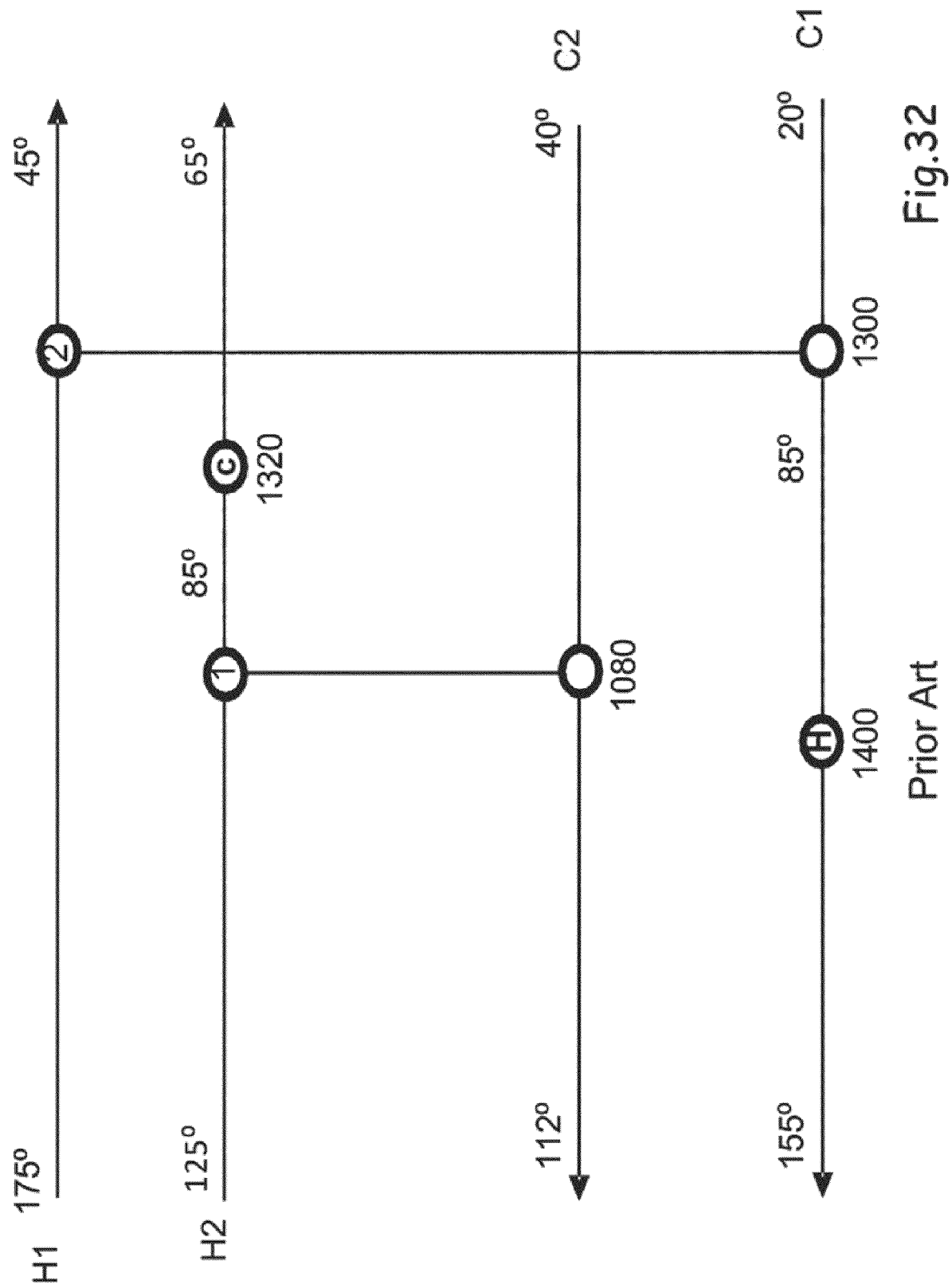
FIG. 32 is a schematic diagram of an existing HEN according to a software application using pinch technology.
Figure 33:
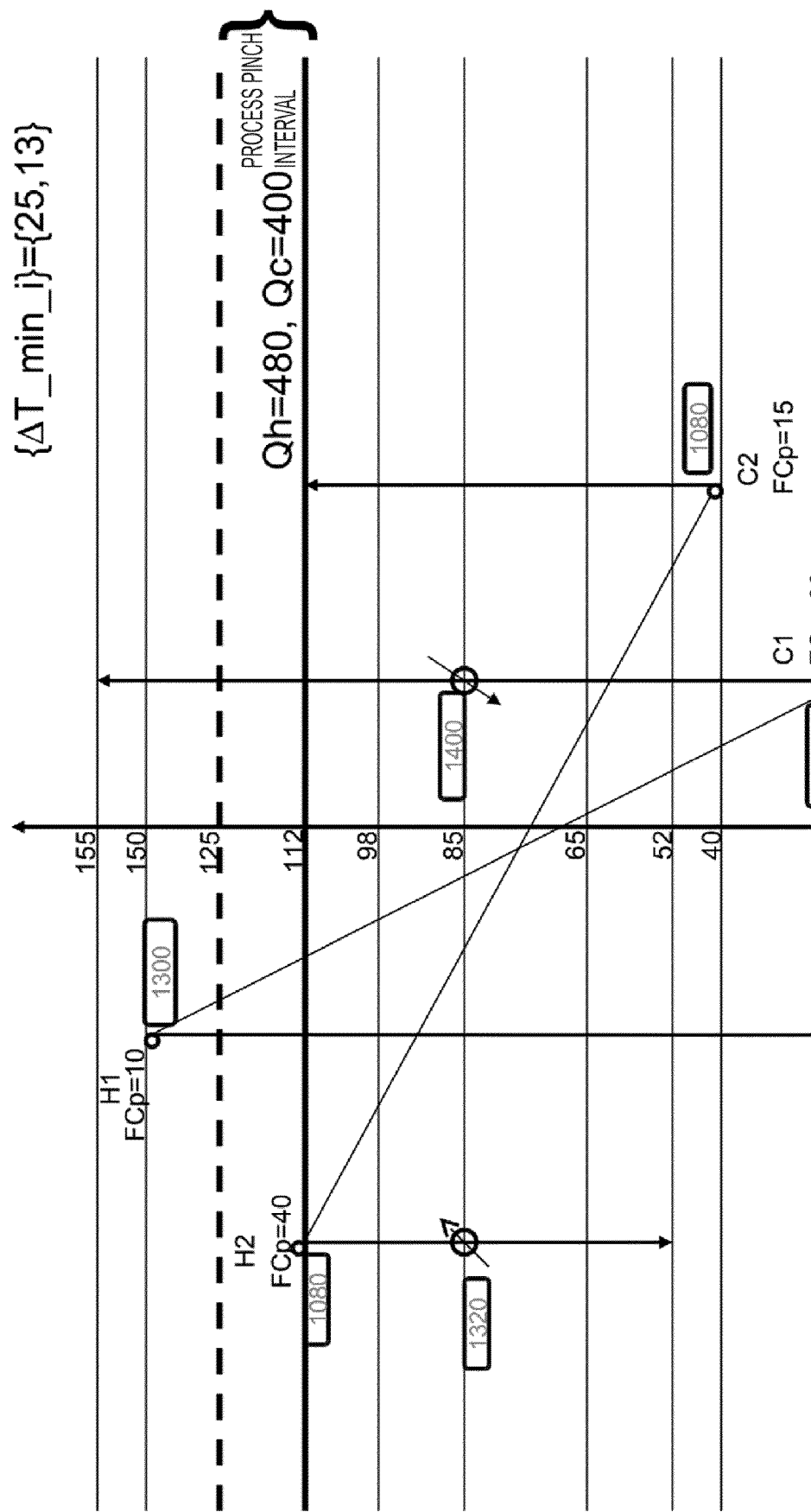
FIGS. 33-41 are a set of schematic diagrams illustrating a HEN retrofit example performed on the HEN of FIG. 32 according to an embodiment of the present invention.

FIG. 32 illustrates a structure as depicted according to conventional techniques. FIG. 33, in contrast, illustrates a graphical depiction according to an embodiment of the present invention that can enable the designer to find retrofit solutions just via inspection.

Figure 34:
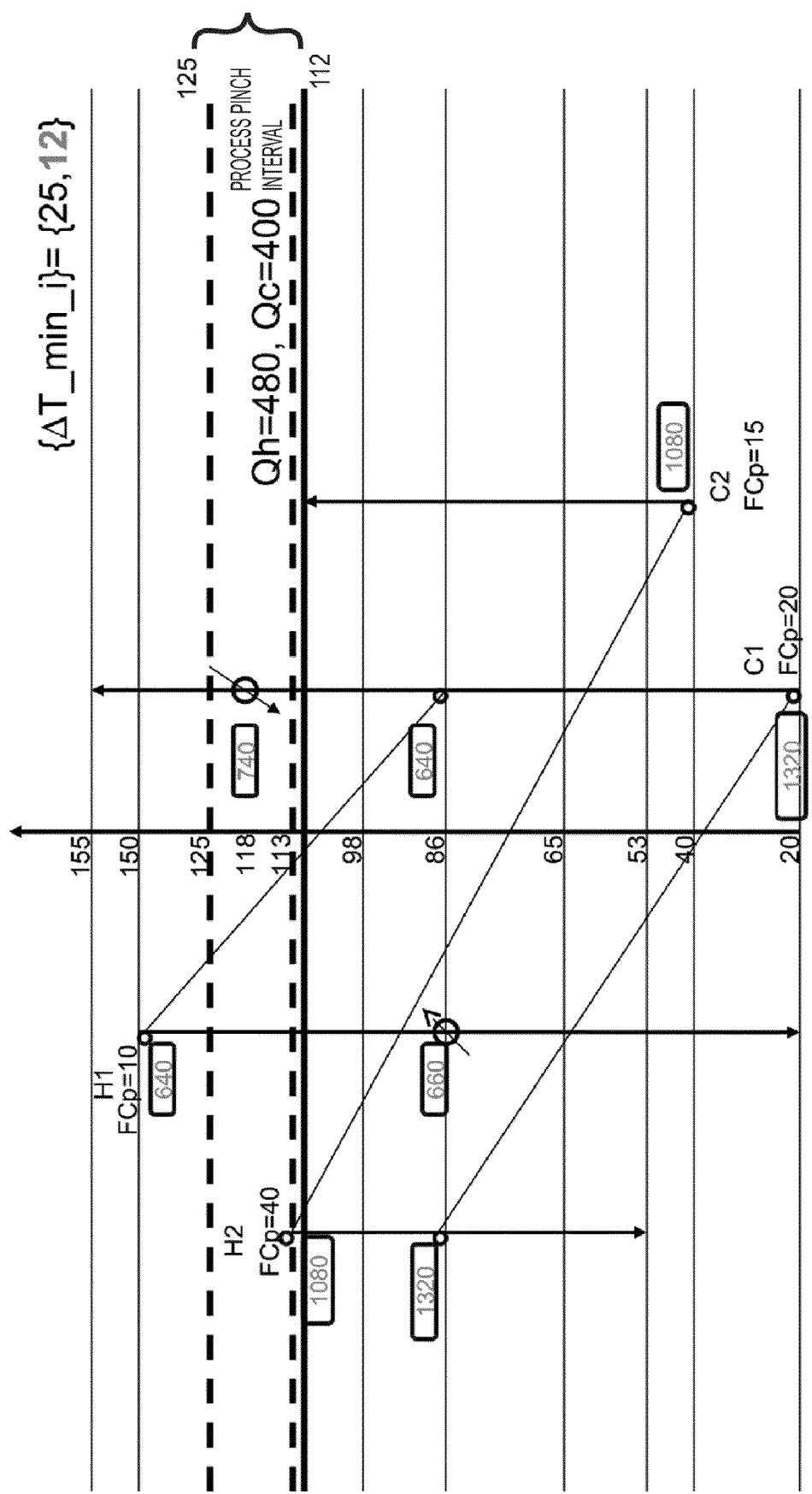
Figure 35:
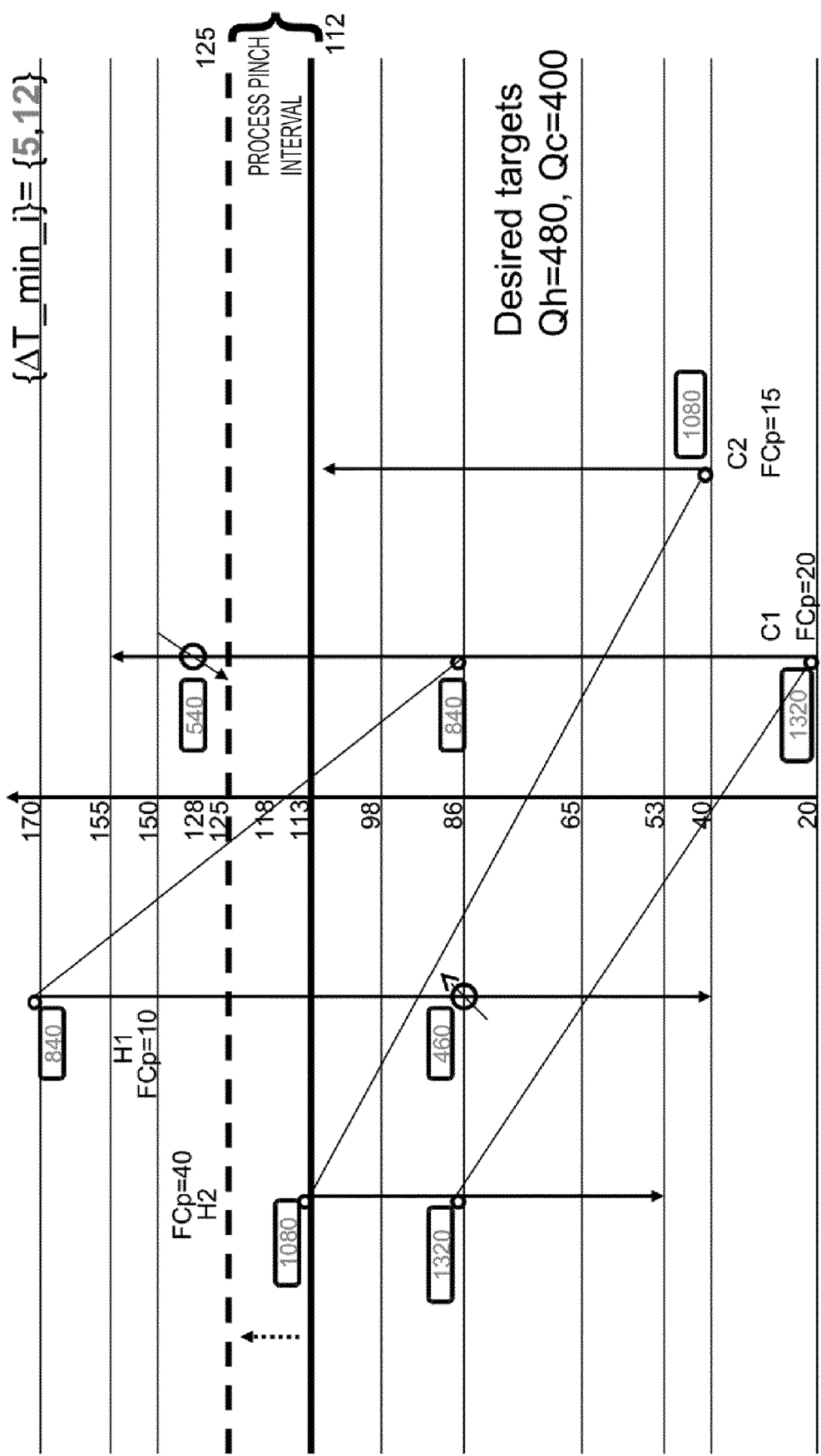
Figure 36:
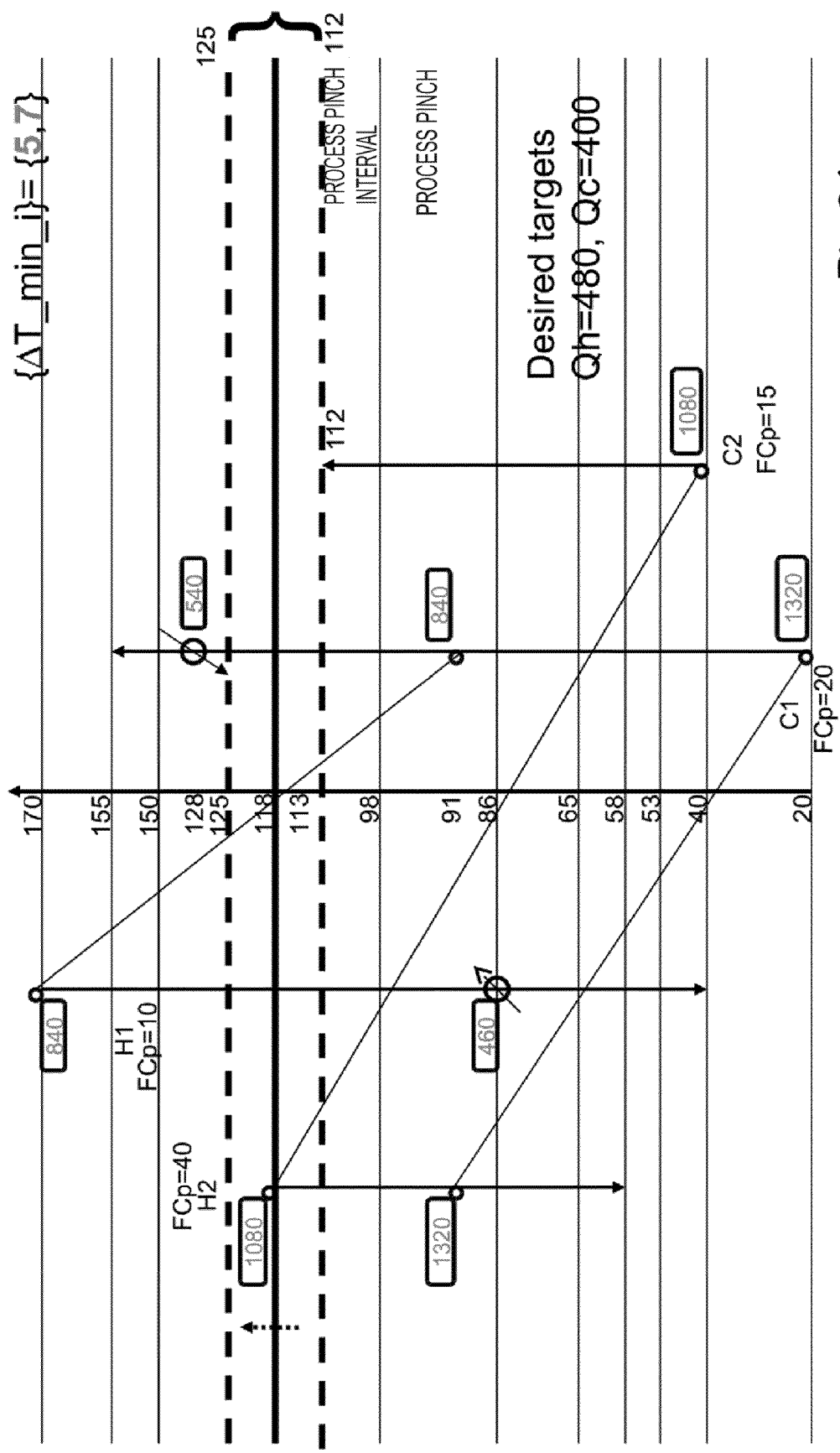

FIGS. 34-36 illustrate various steps from the "lab test results" and "insights" phases. For example, FIG. 34 illustrates, through the adjustment of $\Delta T\_min\_H2$, that H2 is controlling the pinch location and that the adjustment of $\Delta T\_min\_H2$ to 0° F. would result in a movement of the pinch from 112° F. to 125° F. FIG. 35 illustrates that a reduction in $\Delta T\_min\_H1$, here 5° F., would render the highest impact on waste heat recovery. FIG. 36 illustrates that moving the pinch point via a $\Delta T\_min\_H2$ reduction will not result in achieving the energy consumption targets using the current topology, and thus, this avenue should not be pursued for such purpose—streams splitting can instead be considered. Further, the figure illustrates that movement of the pinch upward reduces the cold load more than reducing the hot load above the pinch.

Figure 37:
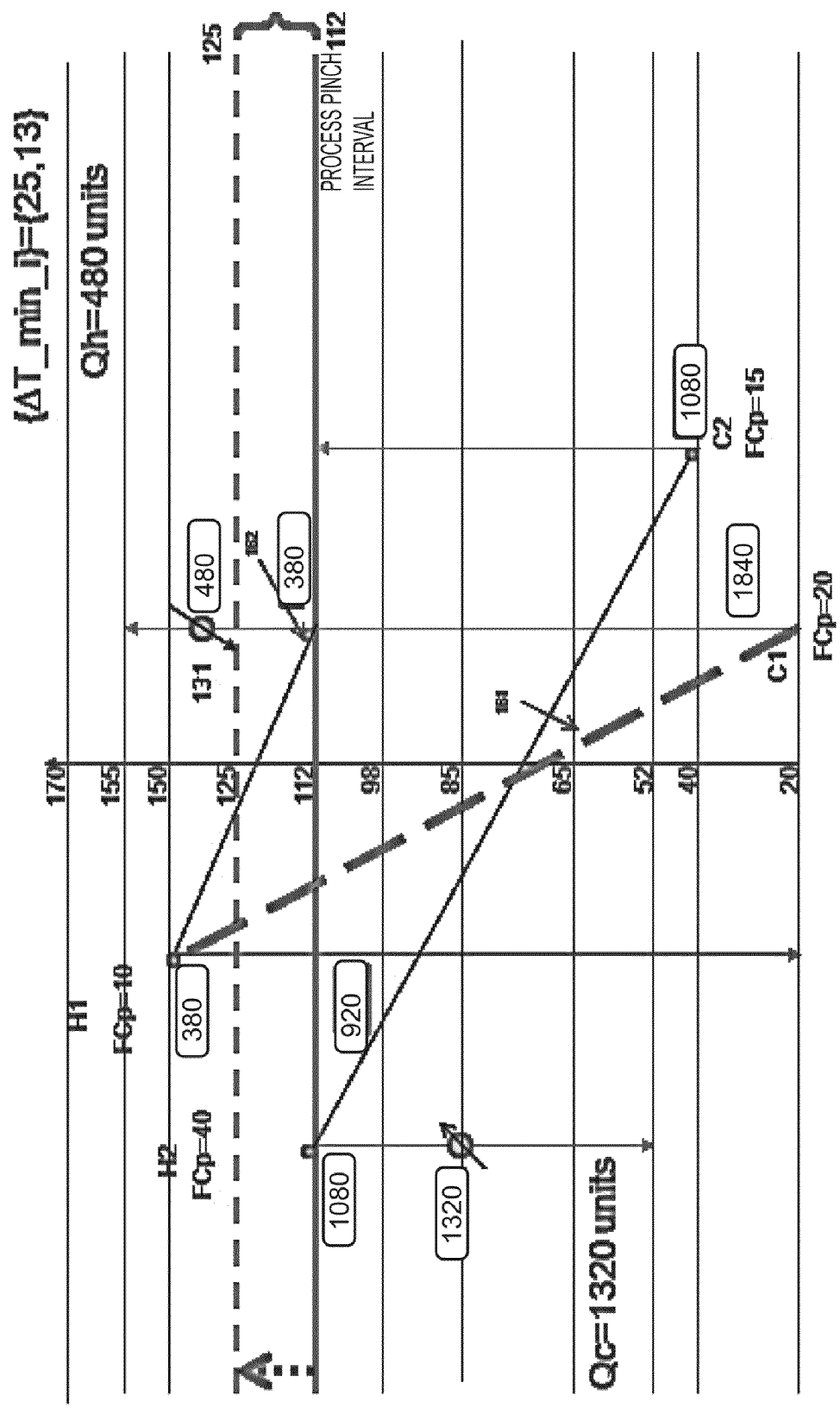
Figure 38:
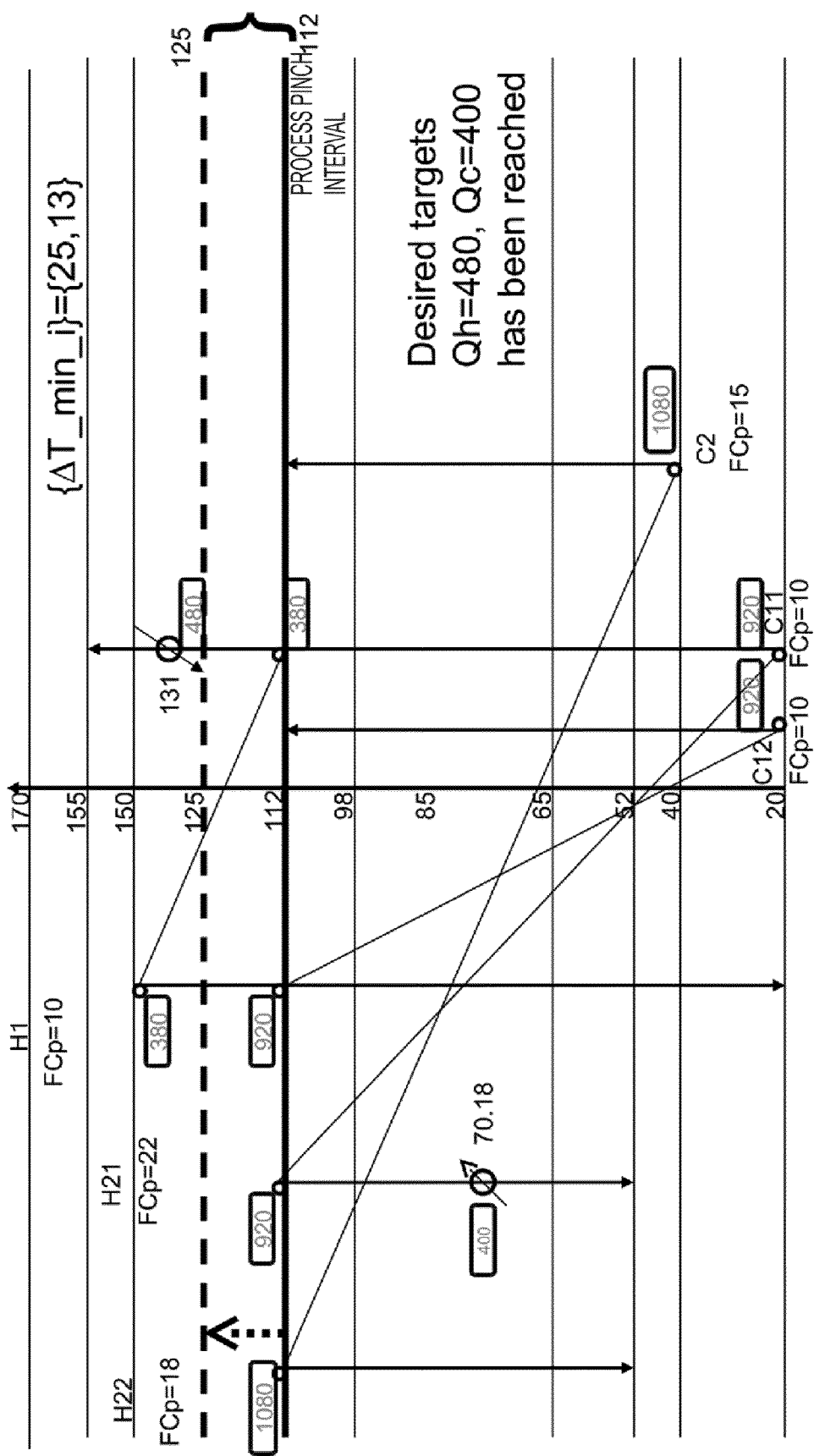

FIGS. 37-41 illustrate various steps from the "find solutions" phase. For example, FIG. 37 illustrates at 161, 162, reconfiguring the H1-C1 HE unit at 161 to the sink section at 162 so that the unit no longer crosses the current pinch. FIG. 38 illustrates application of streams splitting whereby C1 is split to reach the pinch and H2 is split below the pinch to have enough streams to match. Such streams splitting can correct the loss-in-topography due to failure to meet the minimum number of HE units.

Figure 39:
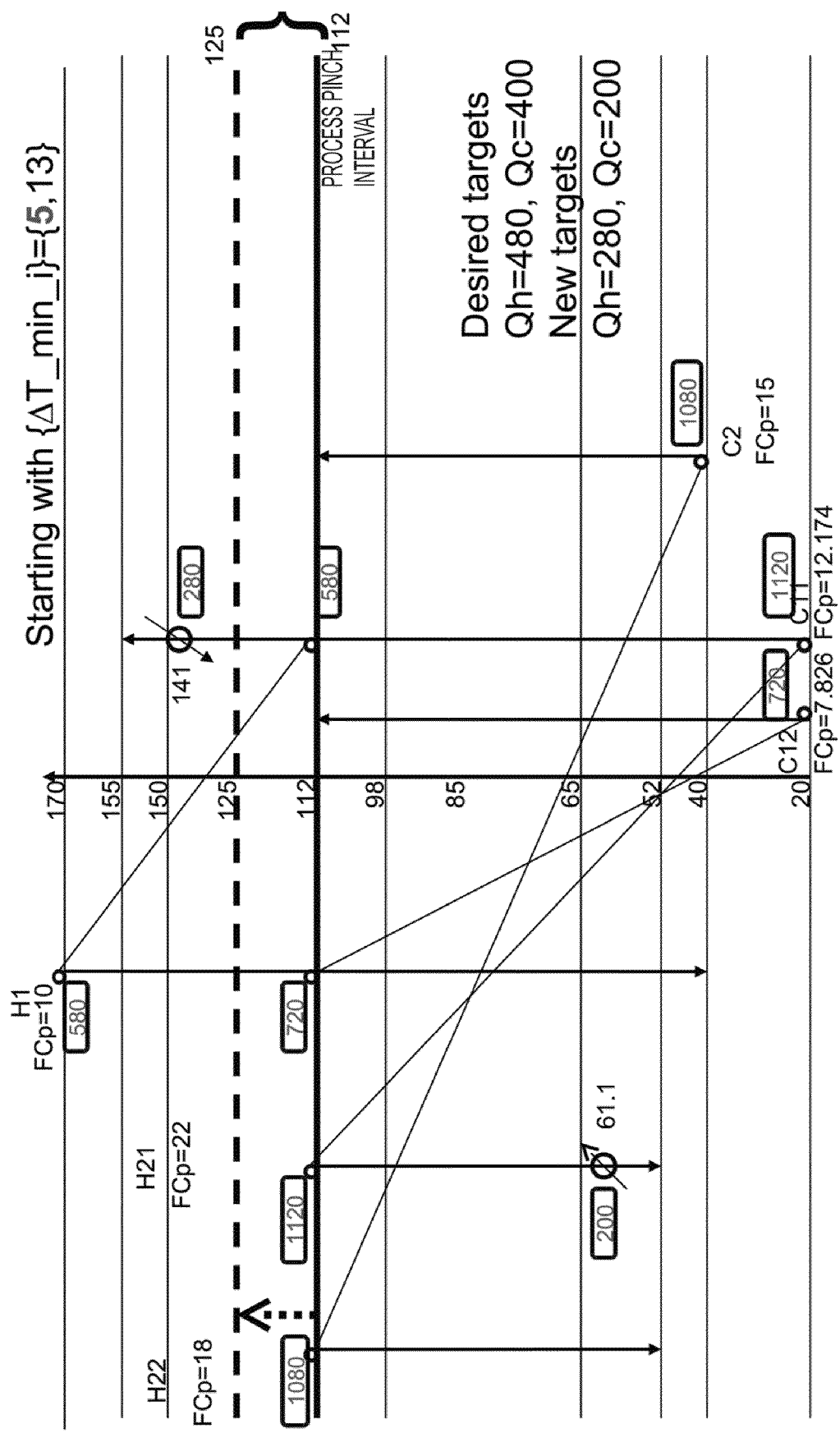
Figure 40:
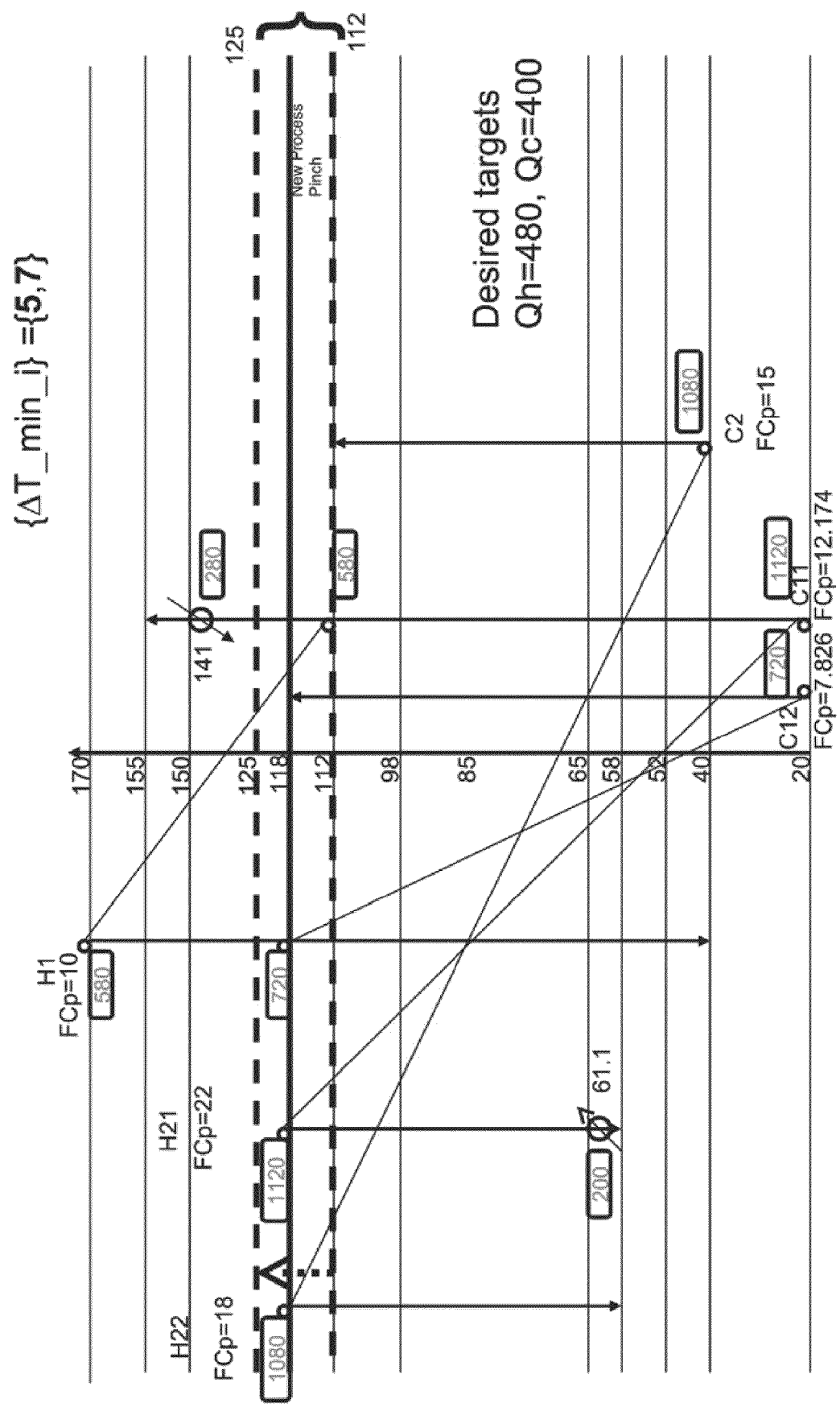

If the decision maker desires more energy savings, as shown in FIG. 39, $\Delta T\_min\_H1$ can be further reduced. Such reduction may be one-at-a-time and be in conjunction with adjustments of load and branches flow in order to analyze the effects of each reduction for each stream. Further, as shown in FIG. 40, $\Delta T\_min\_H2$ can be reduced to adjust the pinch location, here to a value roughly half of the original value so that $\{\Delta T\_min\_i\}=\{5, 7\}$, and the match connections, loads and branches will be configured to adjust for the new pinch crossing (e.g., 118° F.).

Figure 41:
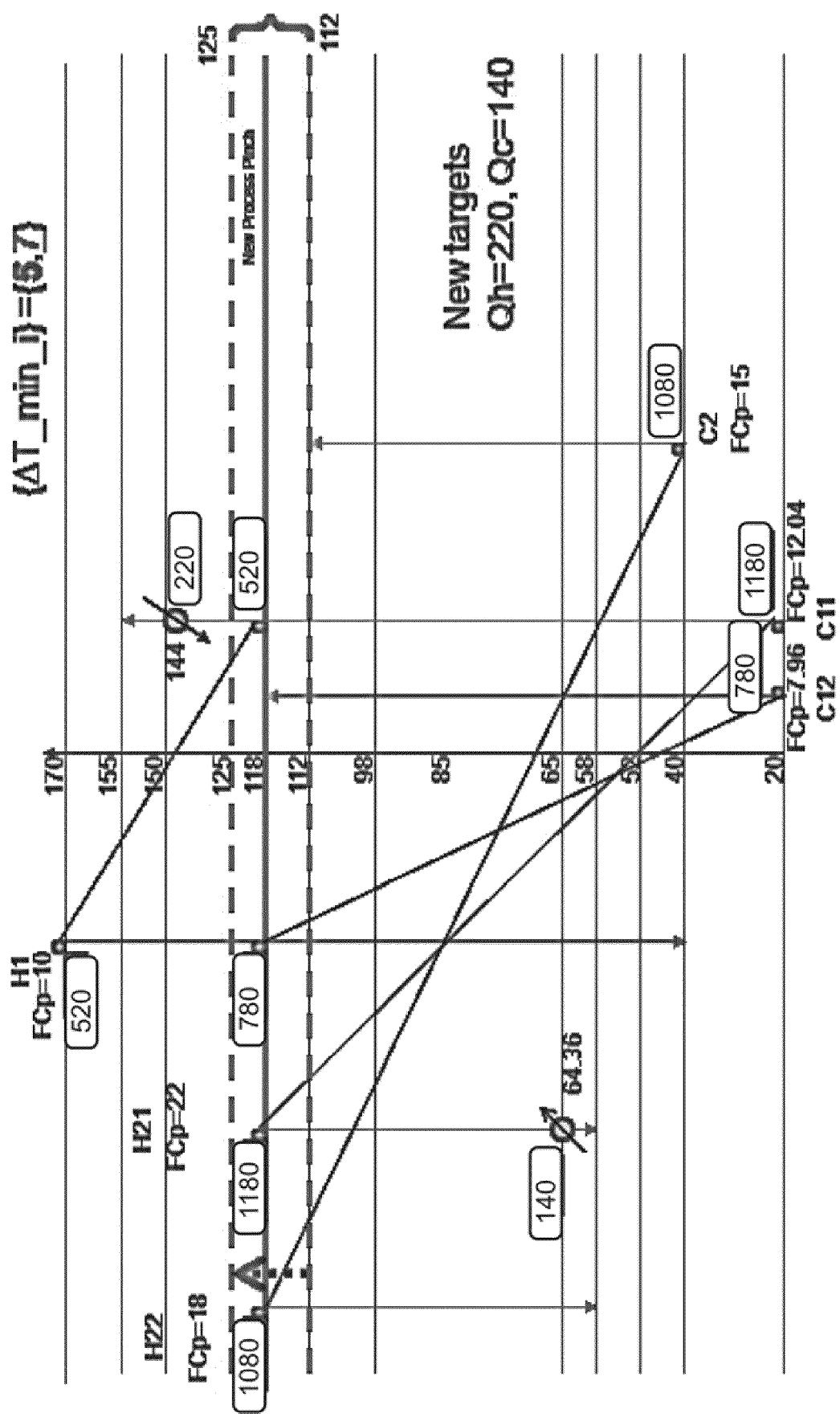

FIG. 41 illustrates adjustments after correcting processing pinch matches resulting from adjustment to the new pinch point, along with the corresponding substantial reduction in energy requirements. Note, according to a preferred configuration, $\Delta T\_min\_i$ reductions are made after modifying wrong matches and modifying the number of units used to meet the minimum required. That is, the preferred process dictates that changes to the $\Delta T\_min\_i$ that affects the pinch point location should be made prior to performing additional reductions in the other $\Delta T\_min\_i$.

Figure 42:
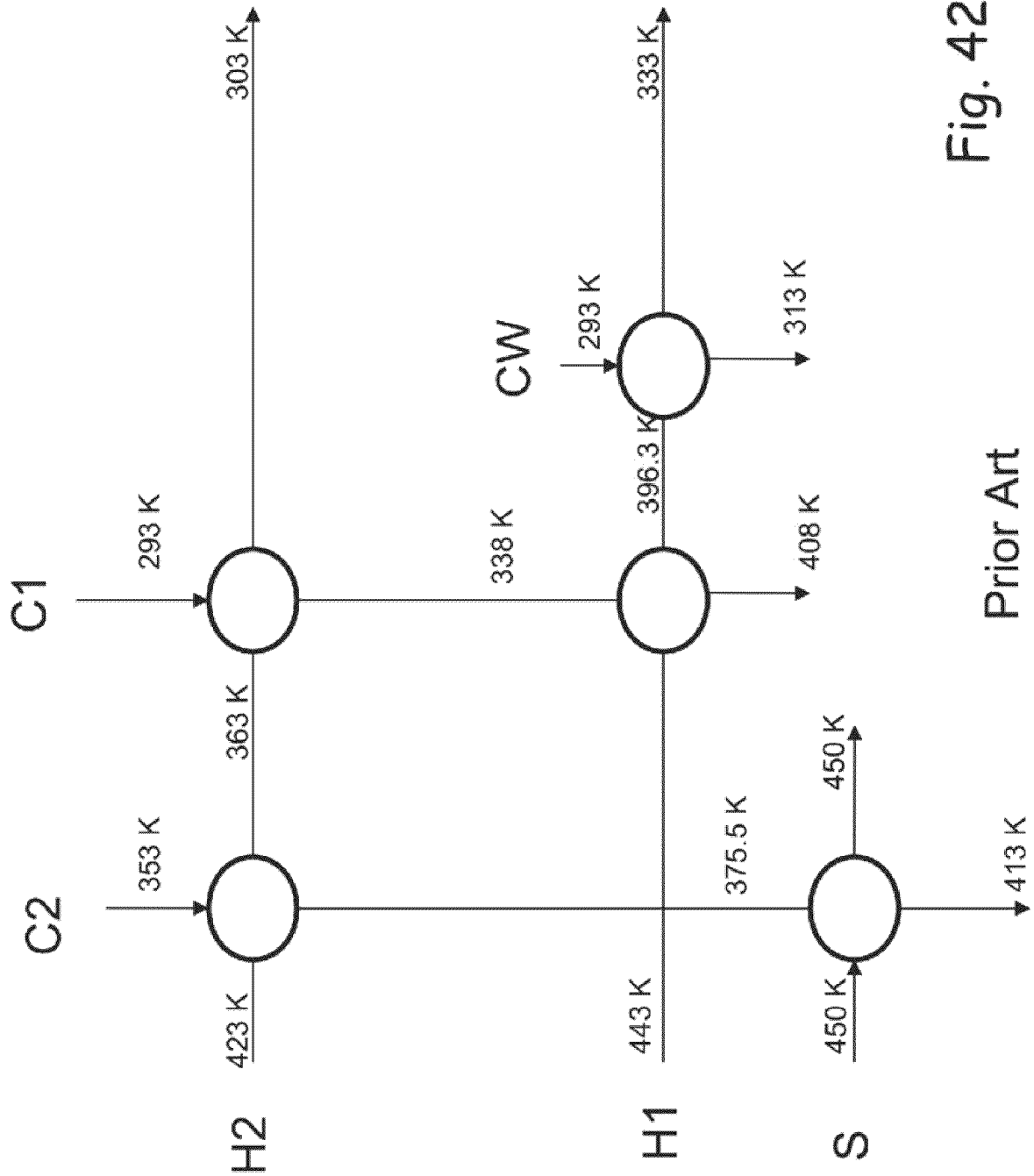
FIG. 42 is a schematic diagram of an existing HEN according to a software application using mathematical programming technology.
Figure 43:
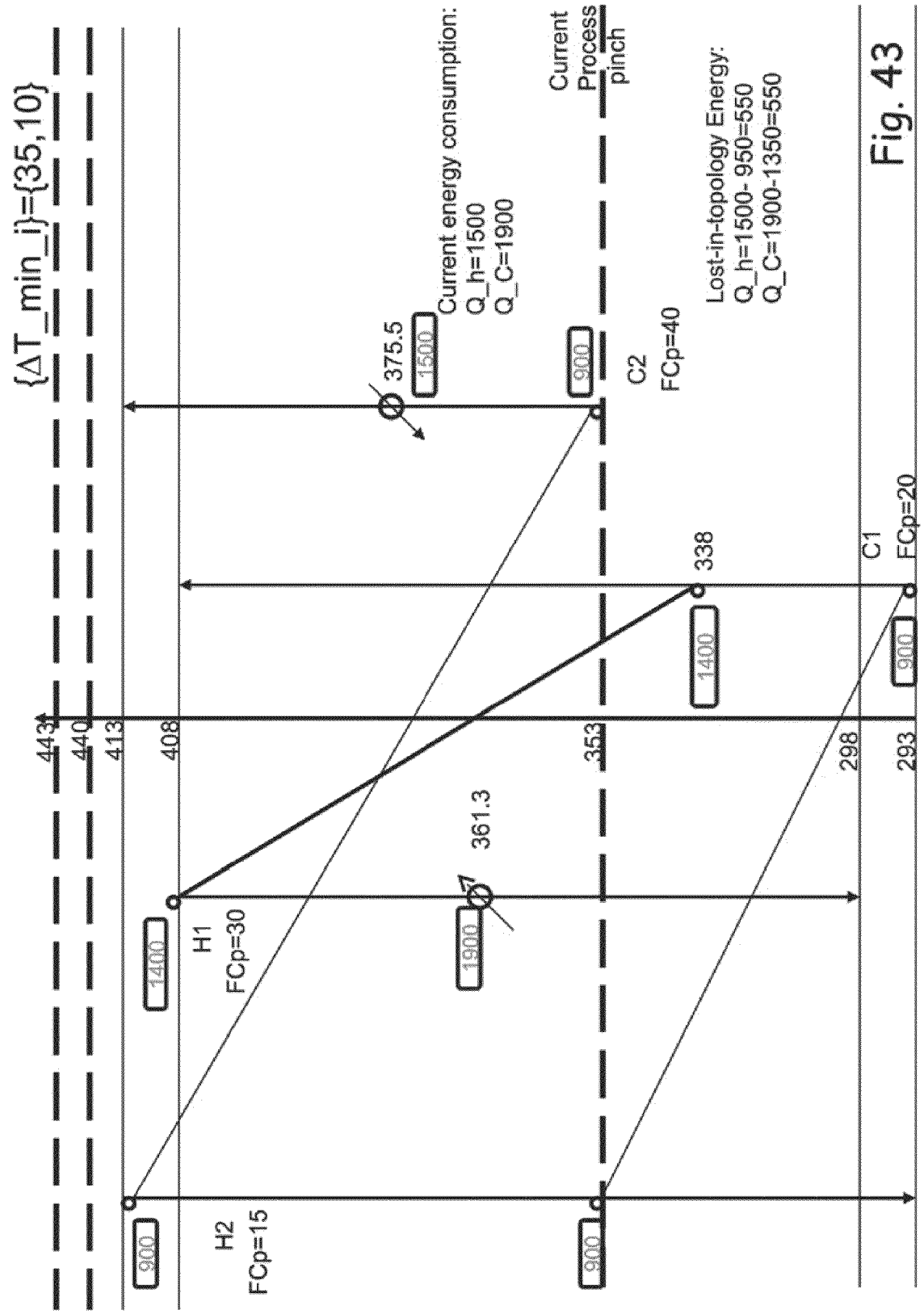
FIGS. 43-50 are a set of schematic diagrams illustrating a comparative HEN retrofit example performed on the HEN of FIG. 42 according to an embodiment of the present invention.

FIGS. 42-50 illustrate a comparative example of a solution according to an embodiment of the present invention with a conventional HEN representation and solution using mathematical programming described in Floudas et al., "A Mixed Integer Nonlinear Programming Model for Retrofitting Heat-Exchanger Networks" (1990). FIG. 42 illustrates a structure as depicted according to conventional mathematical programming techniques. FIG. 43, in contrast, illustrates a graphical depiction according to an embodiment of the present invention. From the results of a lab report performed on the corresponding structure, it can be determined and visualized in the figure that hot stream H1 controls the pinch location in a limited range and that C2 controls the pinch point location for any $\Delta T\_min\_H1>3°$ F. and $\Delta T\_min\_H2$ controls as is currently existing or when both $\{\Delta T\_min\_i\}<=5°$ F. The pinch-interval is discontinuous, starting at 353° F. and jumps to 440° F. upon $\Delta T\_min\_H1=3$. It can also be readily determined and visualized that the structure has lost-in-topology energy due to cross-pinch matching. It can also be readily determined and visualized that H1 has the highest impact on energy recovery, and thus, can be used to provide the best utility path.

Figure 44:
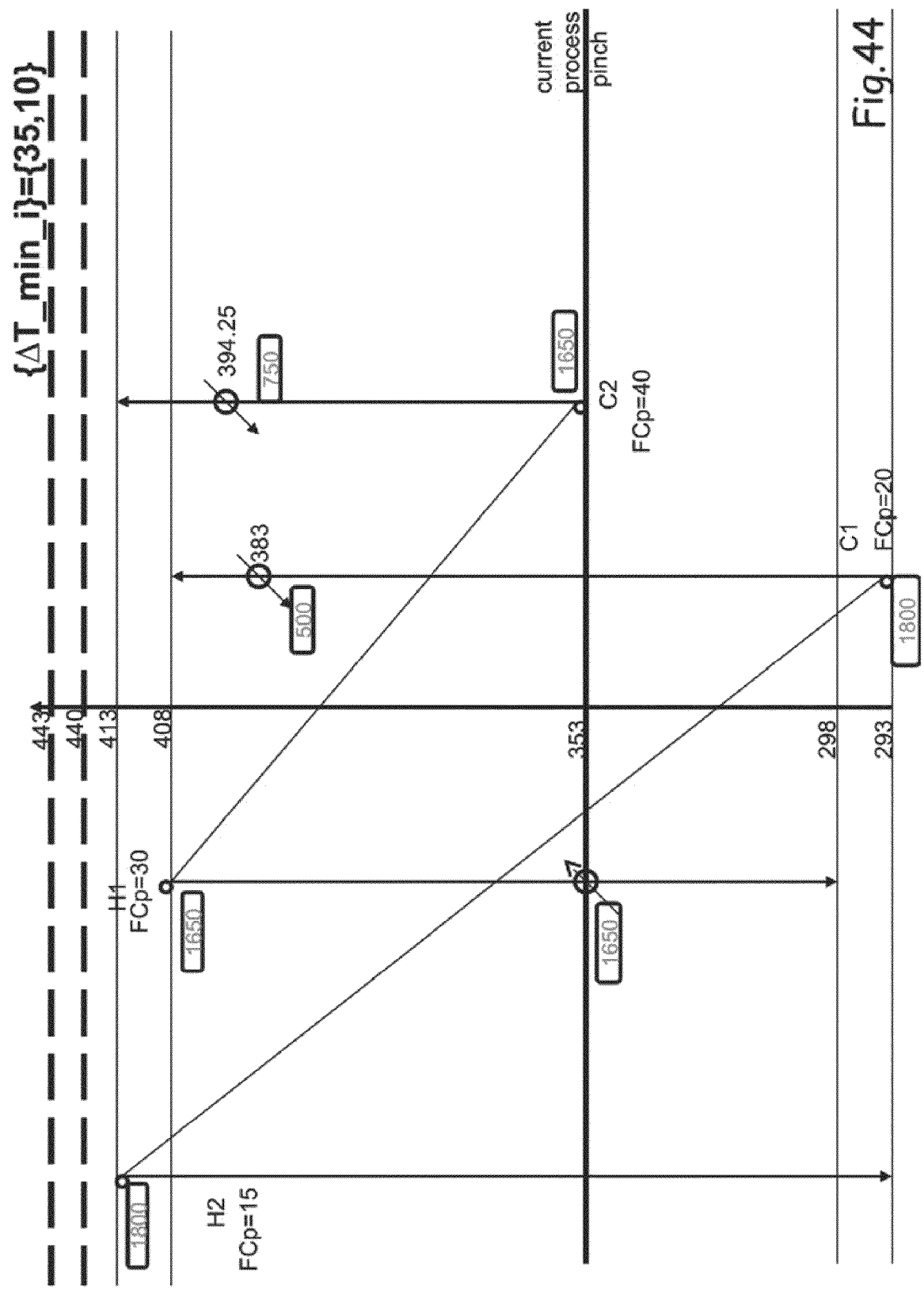
Figure 45:
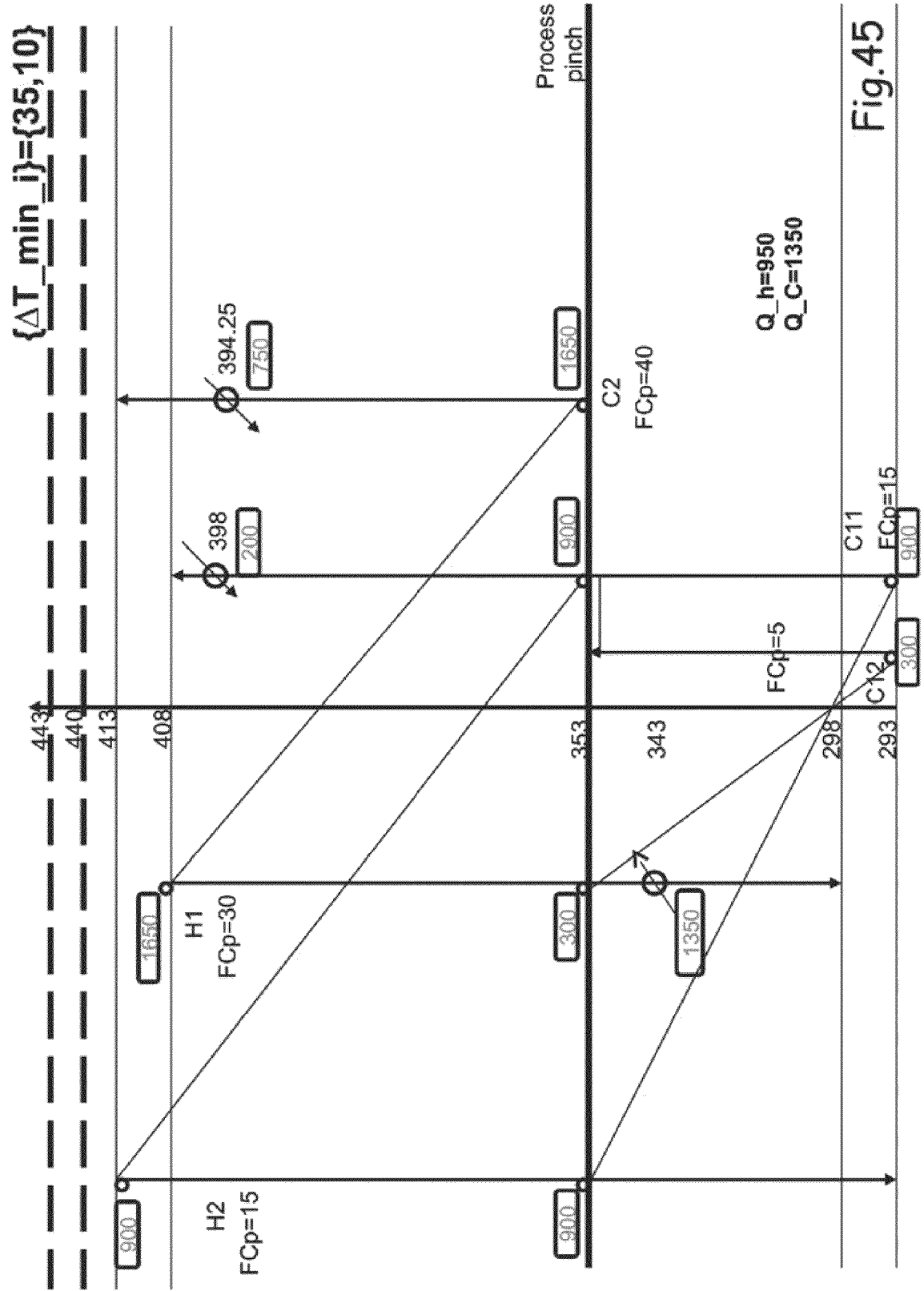

FIG. 44 illustrates the result of rematching hot stream H1 from a match with C1 to a match with C2, re-connecting the H2-C1 HE unit at a different location along the H2 pathway, and the addition of a new C1 heater. Notably, the H2-C1 rematch crosses the current process pinch. FIG. 45 illustrates the result of application of stream splitting to correct the cross-pinch matching. In particular, to move C1-H2 to the pinch, C1 can be split below pinch to C11 and C12.

Figure 46:
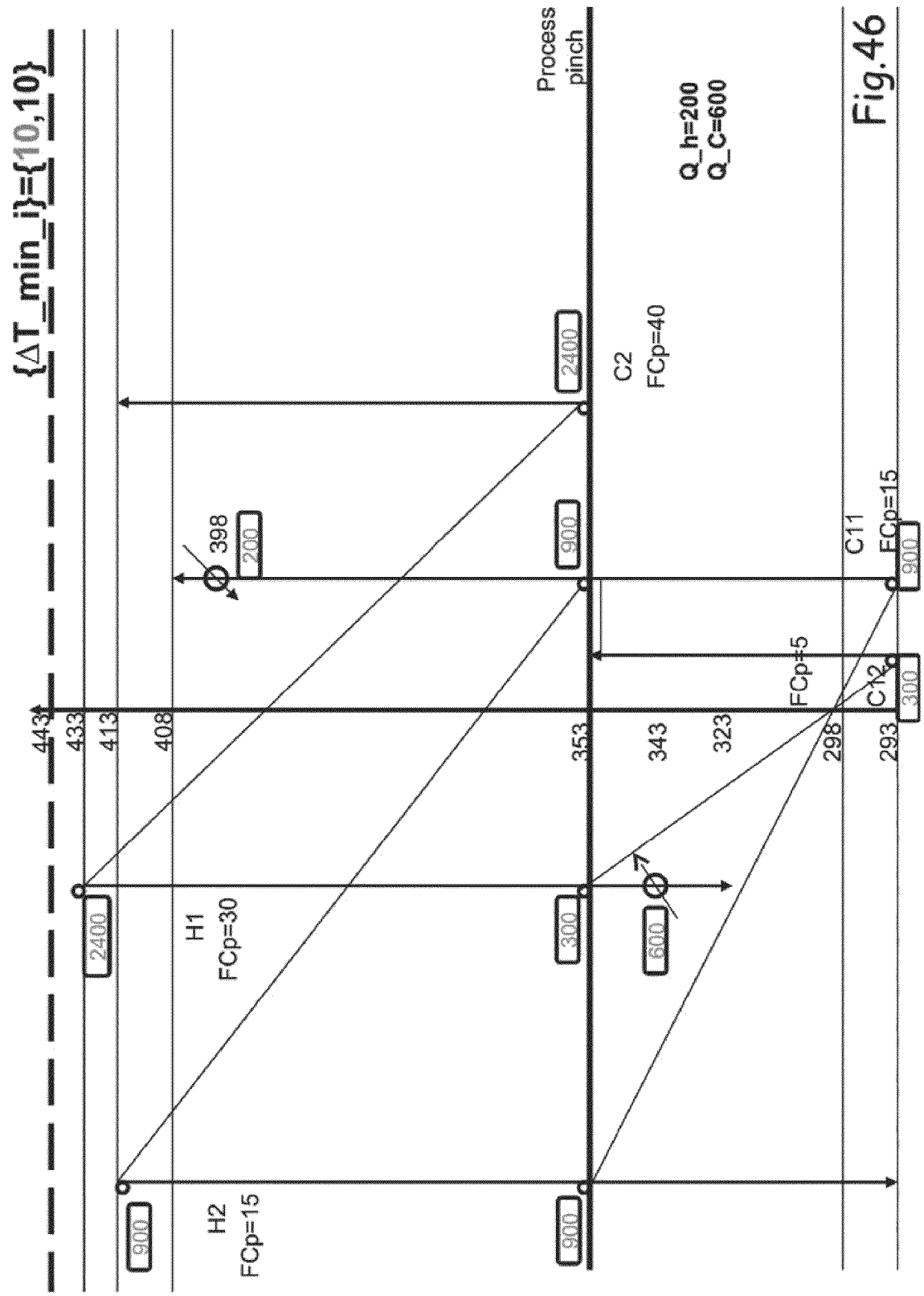
Figure 47:
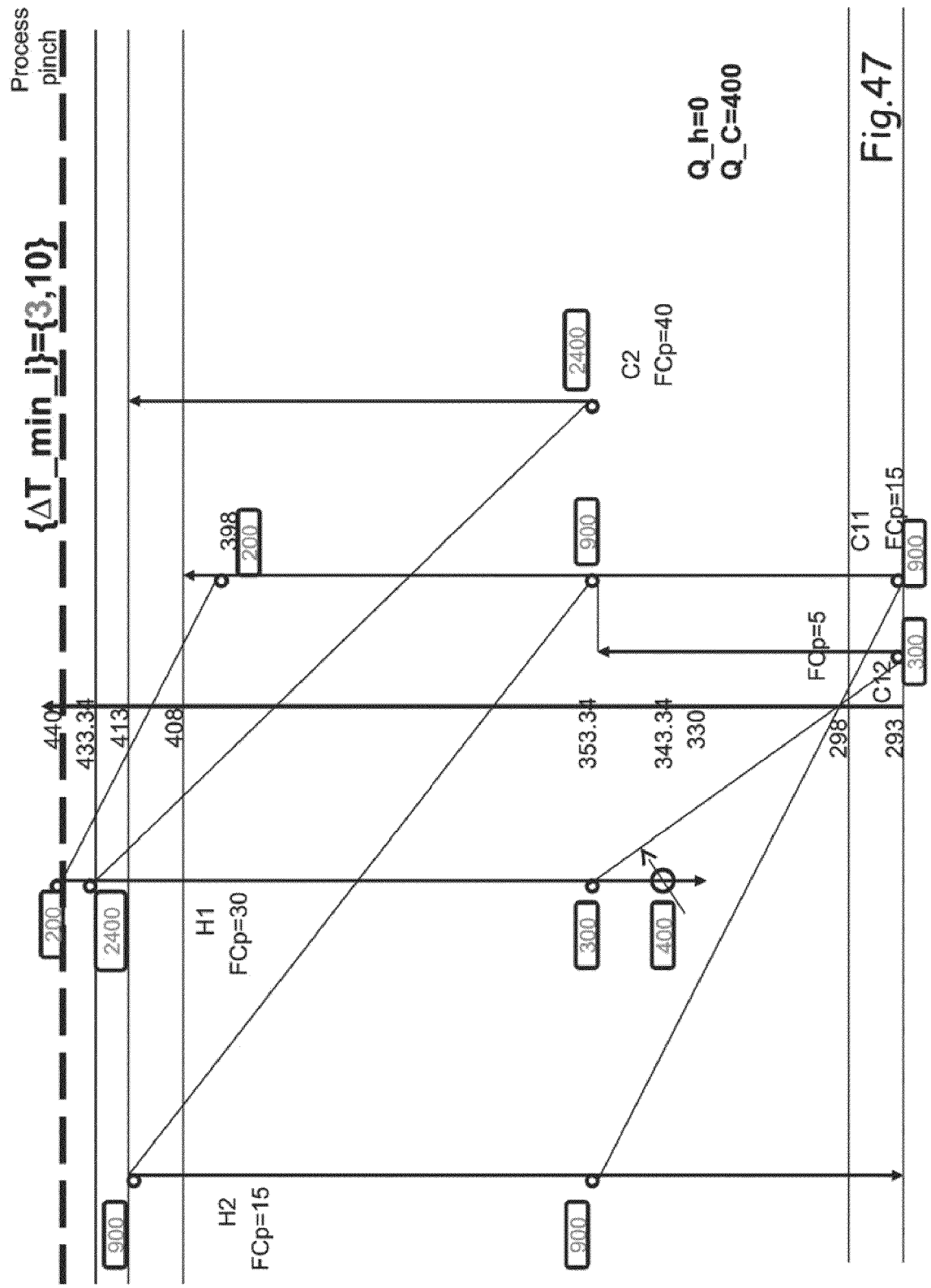

Having first completed rematching, utility pathways can be exploited via adding more areas/reducing H1. For example, FIG. 46 illustrates exploiting the utility path via adding more area or otherwise reducing H1 to 10° F. so that $\{\Delta T\_min\_i\}=\{10,10\}$ and removing the heater on C2. FIG. 47 illustrates the result of further exploitation via adding more area or otherwise reducing H1 to 3° F. so that $\{\Delta T\_min\_i\}=\{10,10\}$ and reusing the C2 exchanger for H1-C1.

FIG. 47 further illustrates that at the "end of the road" after several projects of retrofit in the future, the problem will be ultimately converted to threshold. Beneficially, knowing this fact from the beginning will resultingly provide a recommendation to the designer, today, not to use this solution route, as it adds one more heater in an early retrofit project, and then later on in a future retrofit project, calls for demolishing the added heater along with the old heater. Accordingly, an alternate solution should be selected for the process described in FIGS. 42 and 43.

Figure 48:
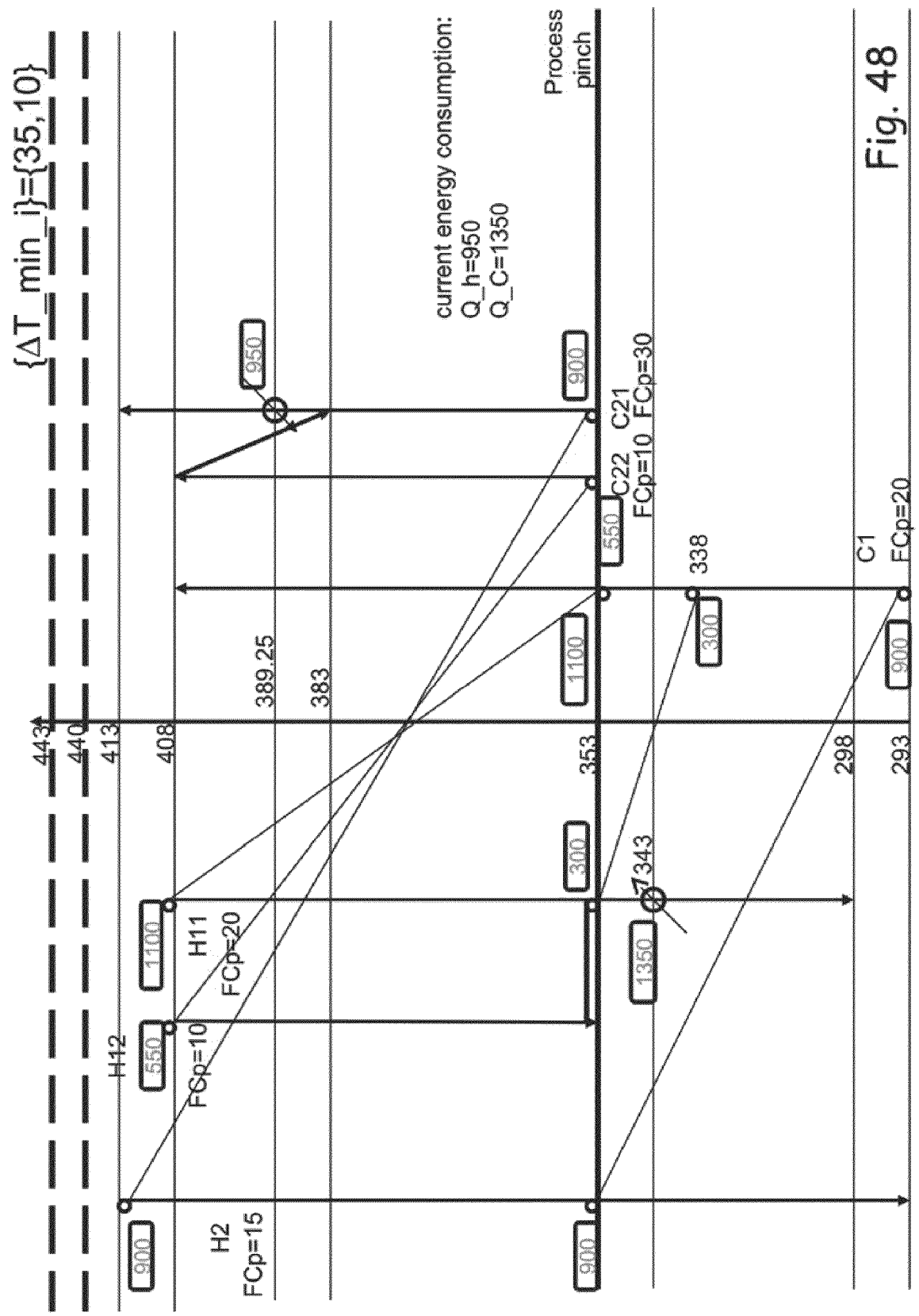

As before, the problem has a cross pinch match and a cooler in the process sink region above the process pinch temperature 353° F. As shown in FIG. 43, at the pinch point above the pinch the number of hot streams is equal to number of cold streams, but since FCp_hot for H1 is >FCp_cold for C1, as shown in FIG. 48, the process can split both H1 and C2 streams above pinch and match H12-C22 and C21 with H2.

Figure 49:
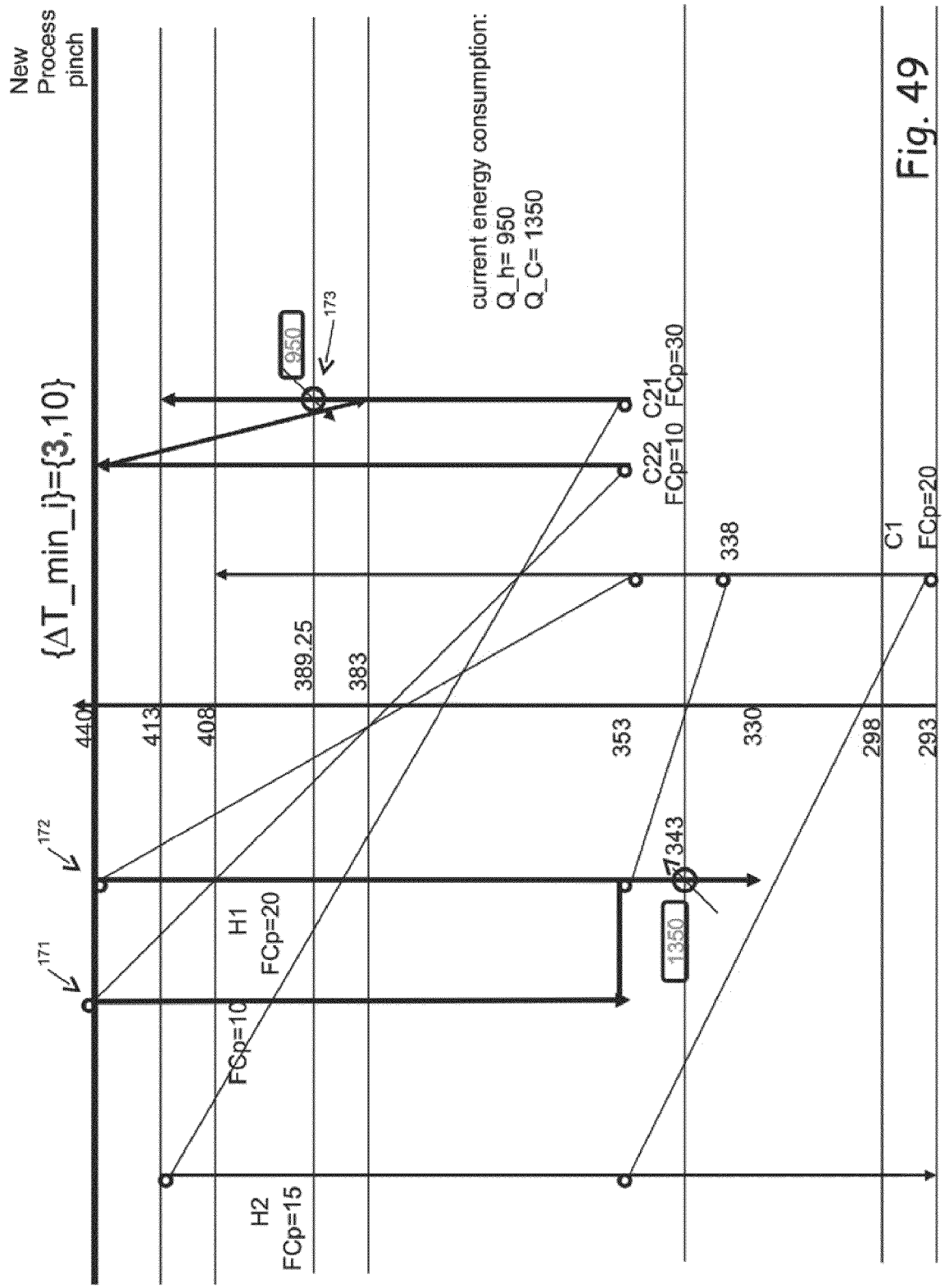
Figure 50:
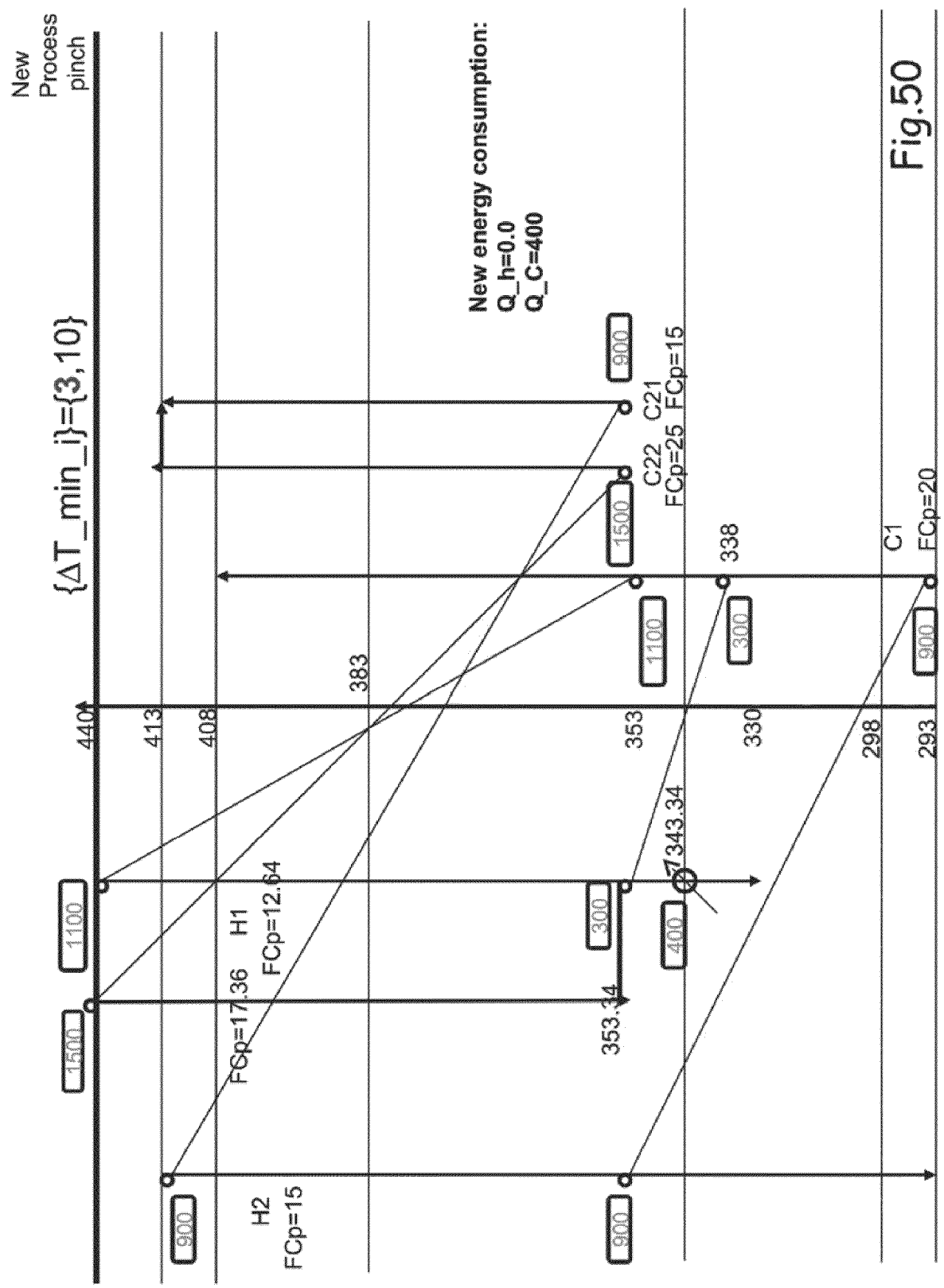

FIG. 49 further illustrates the effect of a reduction ΔT_min_H1 to 3° F. resulting in a jump in the pinch point as identified in advance during the lab test phase according to an embodiment of the present invention. In order to finalize such design, the process need only include a few load/branches flow optimization/reassignments for the split H1 pathways at 171, 173 plus demolishing the old heater 173 to provide the result shown in FIG. 50.

Figure 51:
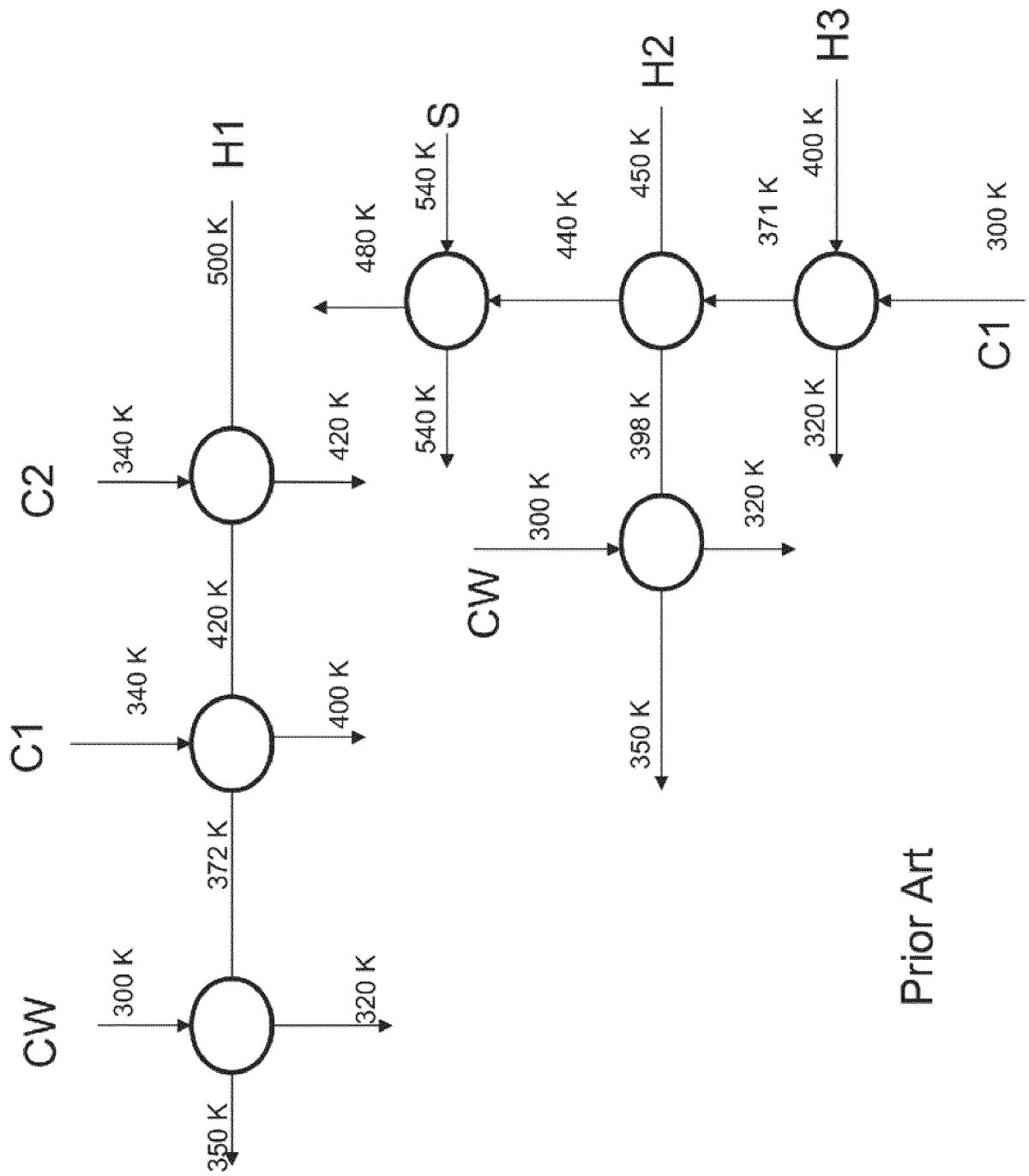
FIG. 51 is a schematic diagram of an existing HEN according to a software application using mathematical programming technology.
Figure 52:
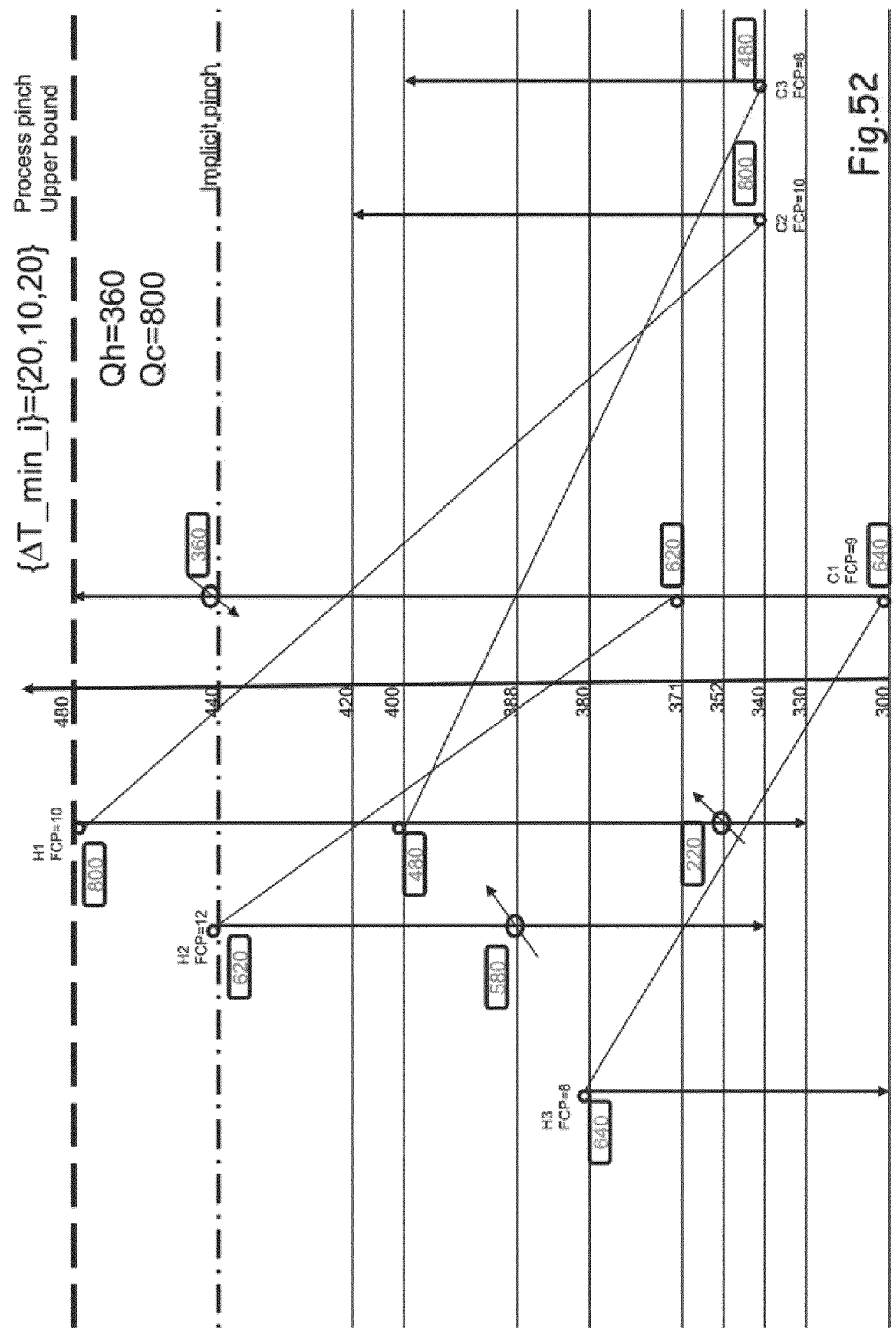
FIGS. 52-55 are a set of schematic diagrams illustrating a comparative HEN retrofit example performed on the HEN of FIG. 51 according to an embodiment of the present invention.

FIGS. 51-55 illustrate another comparative example of a solution according to an embodiment of the present invention with a conventional (Floudas et al.) HEN representation and solution using mathematical programming. FIG. 51 illustrates a structure as depicted according to conventional mathematical programming techniques. FIG. 52, in contrast, illustrates a graphical depiction according to an embodiment of the present invention. It can be readily seen that the H1 stream is controlling the pinch location, that the reduction of {ΔT_min_i} values will result in this example problem becoming a threshold problem, and that the lost-in-topology energy is 360 MW.

Figure 53:
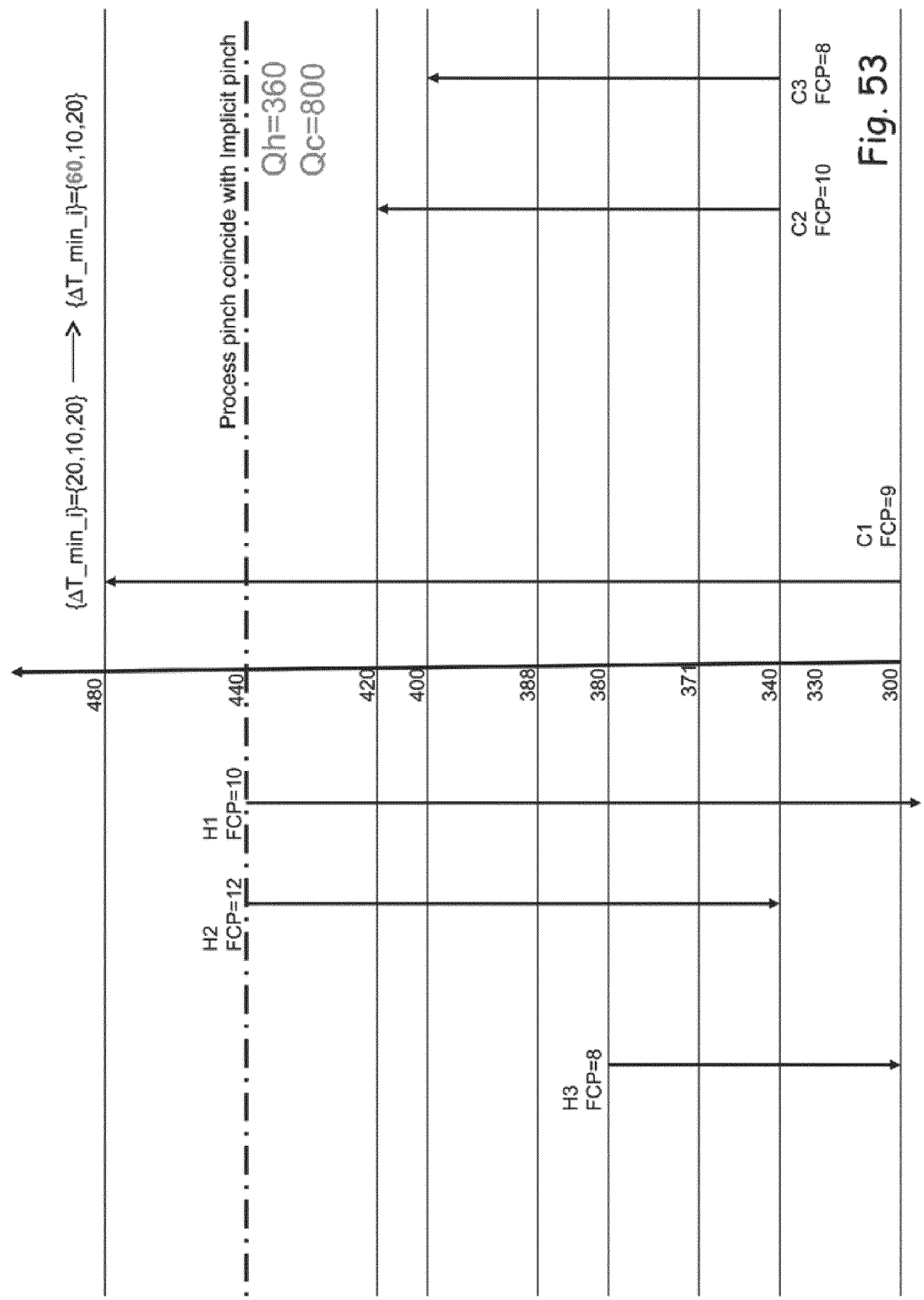
Figure 54:
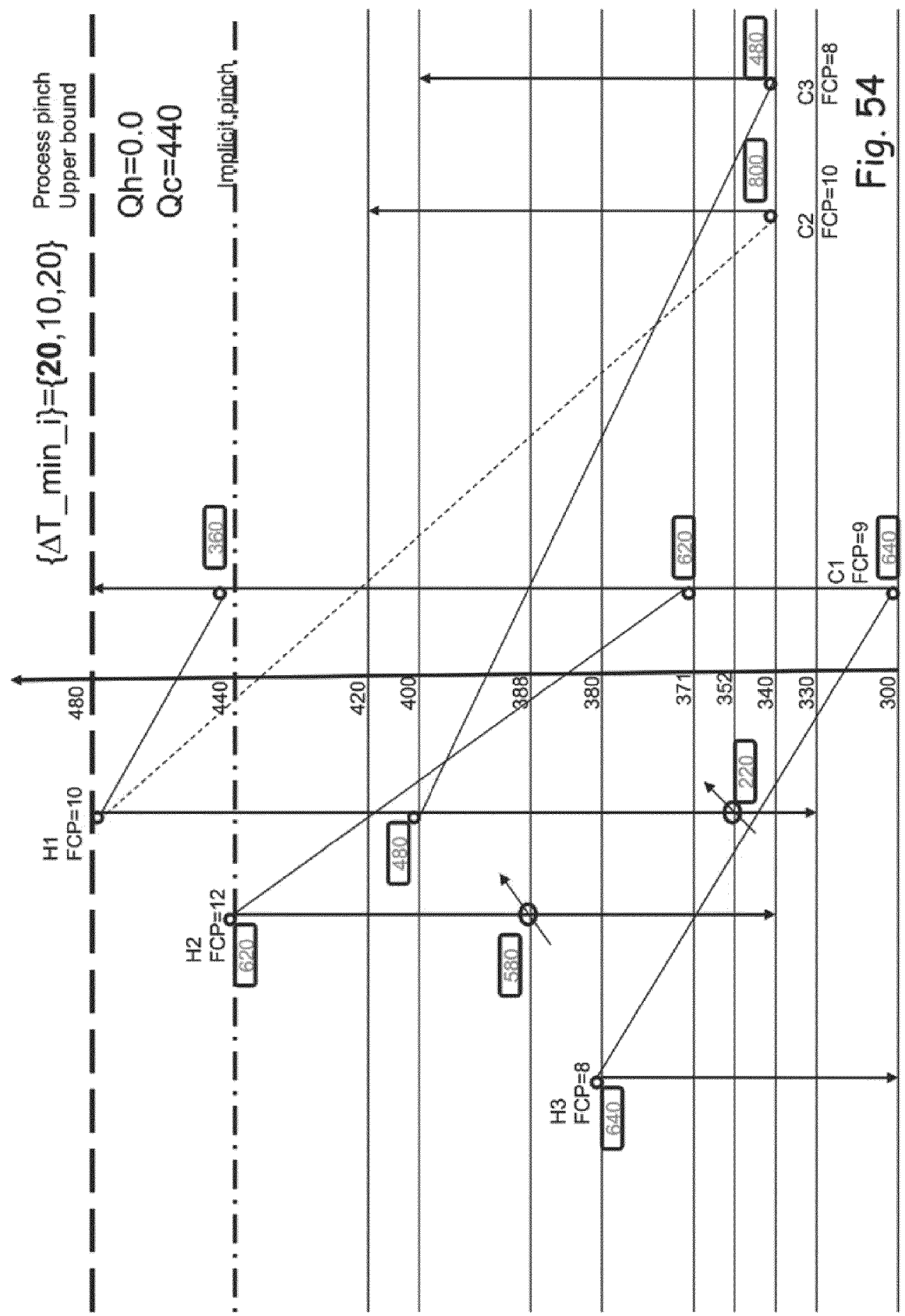
Figure 55:
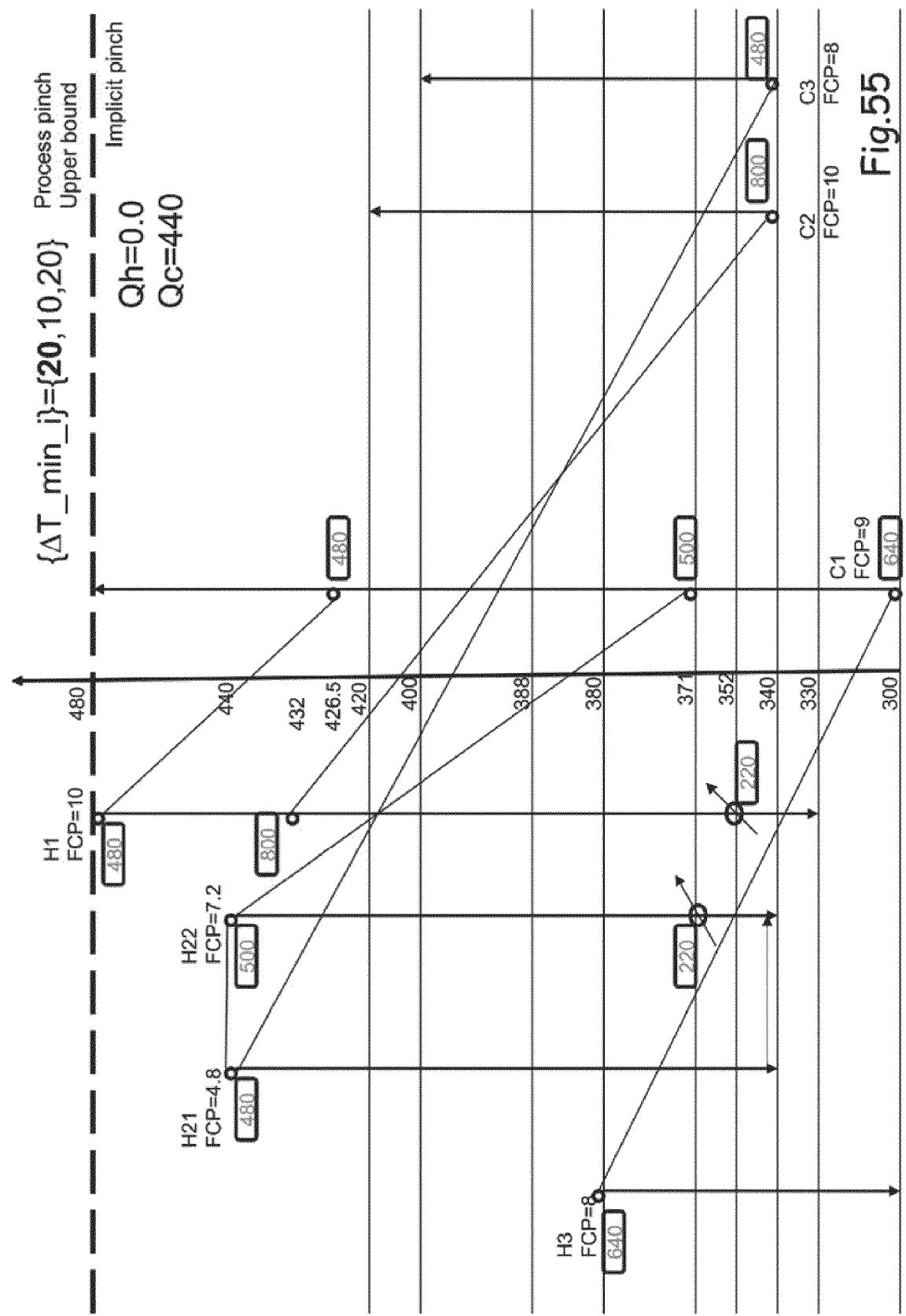

According to an embodiment of the present invention, to solve such problem the process implements an implicit pinch concept whereby the process first locates the process pinch before conversion of the problem to a threshold problem. FIG. 53 illustrates an initial conversion of the process from {ΔT_min_i}={20,10,20} to {ΔT_min_i}={60,10,20} to initially define the implicit pinch location at 440° F. FIG. 54 illustrates matching H1 with C1 above the implicit pinch, and deducting the H1 load used from other HE units along utility path(s) below the pinch. FIG. 55 further illustrates deducting 360 MW from H2 via re-matching C3-H2, but this deducts 480 MW. As such, the process can reduce the C1-H2 match by 120 MW and complete the heat balance by splitting H2 to satisfy H22-C1 and H21-C3 loads.

Figure 56:
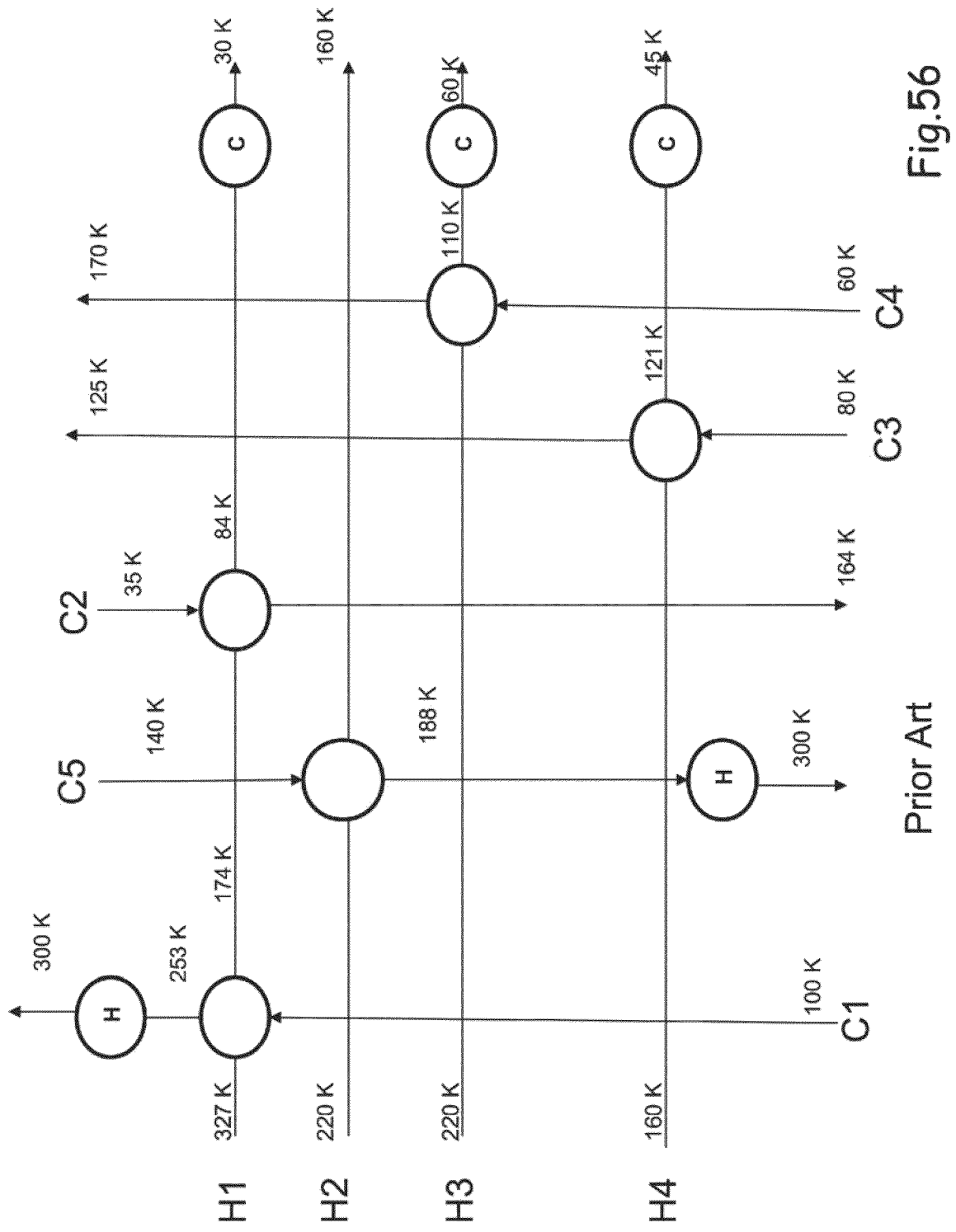
FIG. 56 is a schematic diagram of an existing HEN according to a software application using mathematical programming technology.
Figure 57:
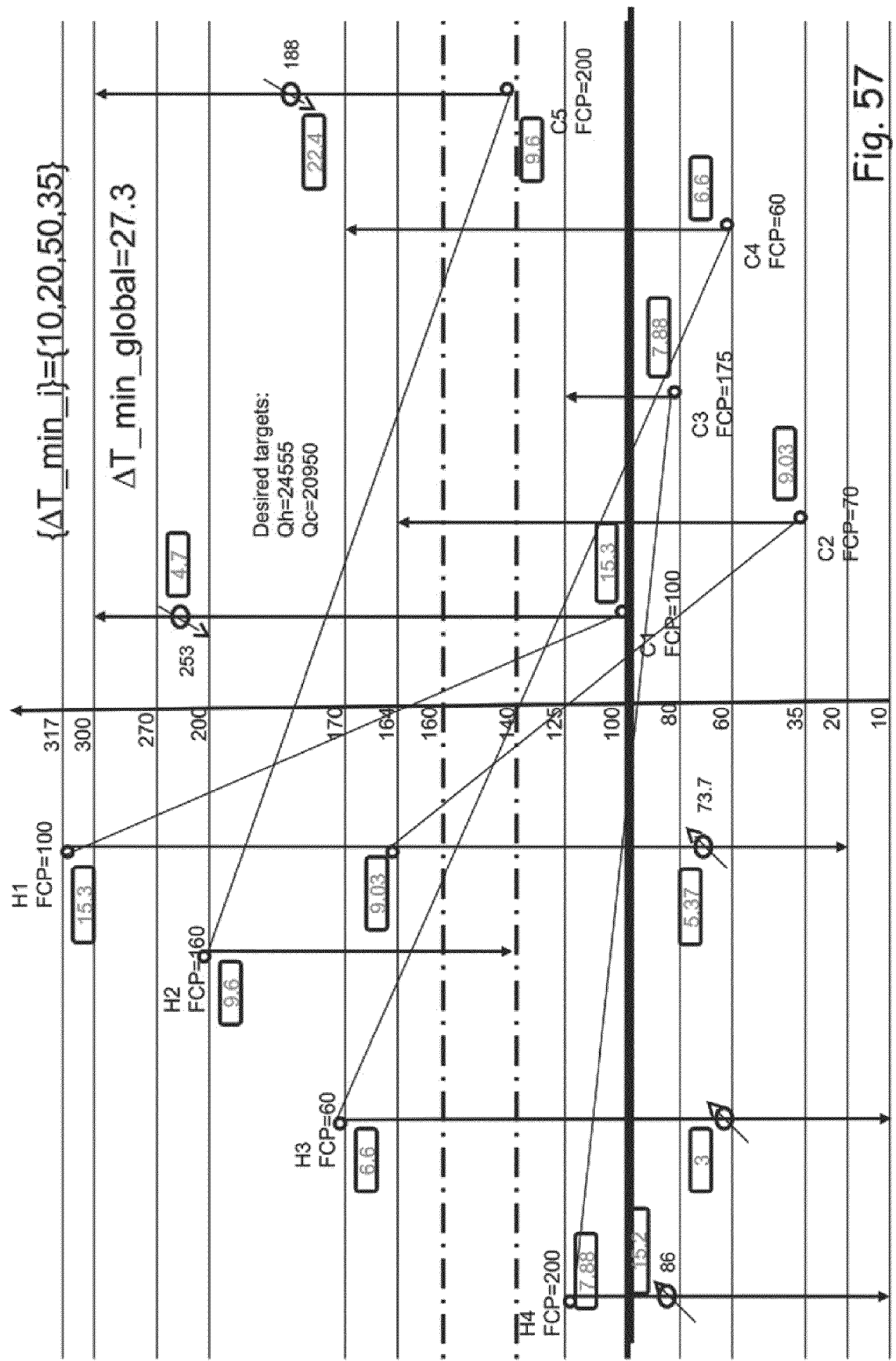
FIGS. 57-66 are a set of schematic diagrams illustrating a comparative HEN retrofit example performed on the HEN of FIG. 56 according to an embodiment of the present invention.
Figure 58:
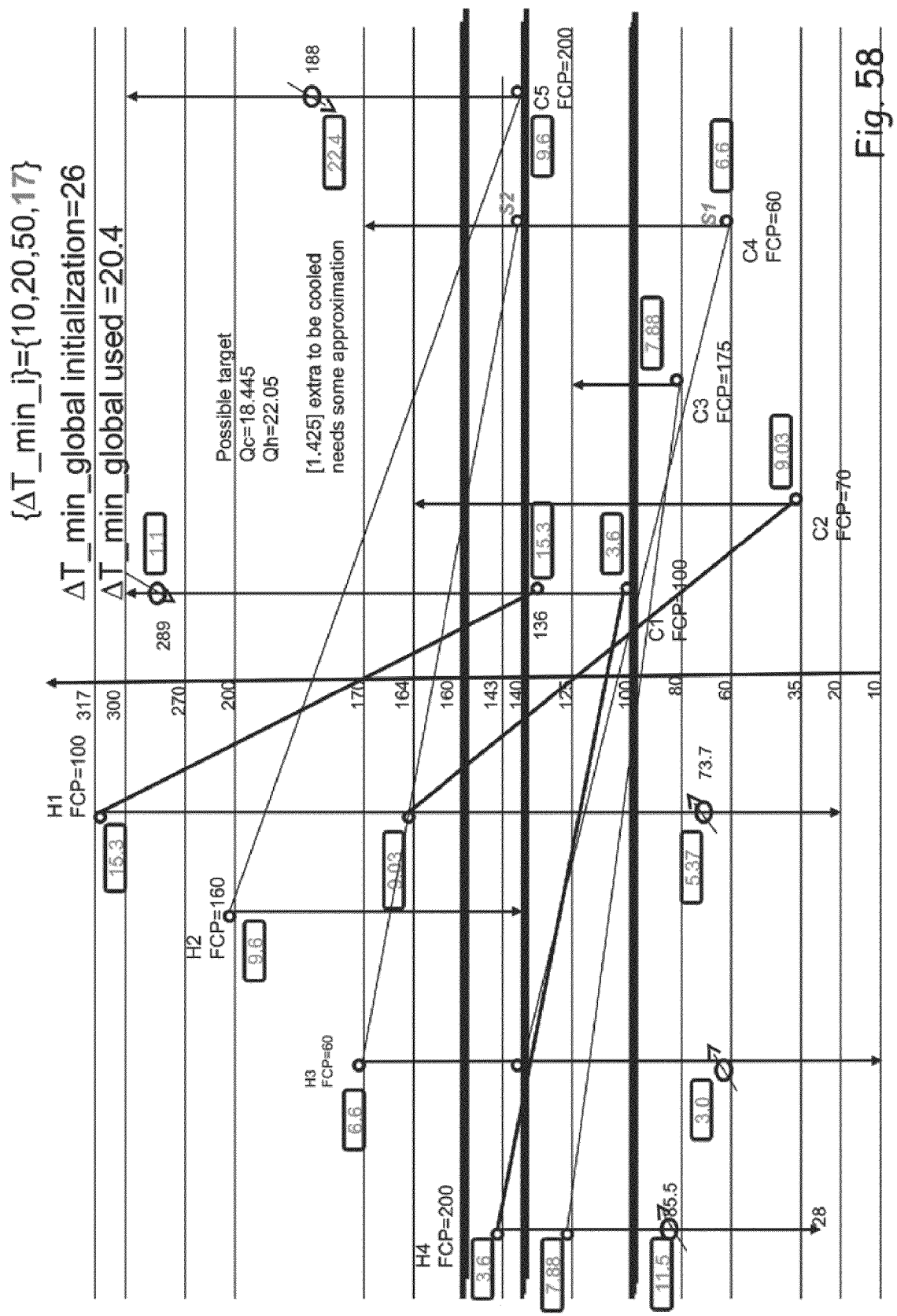

FIGS. 56-66 illustrate another comparative example of a solution according to an embodiment of the present invention with a conventional (Floudas et al.) HEN representation and solution using mathematical programming. FIG. 56 illustrates a structure as depicted according to conventional mathematical programming techniques. FIG. 57, in contrast, illustrates a graphical depiction according to an embodiment of the present invention, and FIG. 58 illustrates reduction of the minimum approach temperature for H4 and resulting structural configuration.

Referring primarily to FIG. 57, it can be readily seen that there are multiple HE units which cross the 100° F. pinch. Further, through employment of the lab test phase, it can be seen/determined that the ΔT_min_H4, ΔT_min_H2 and ΔT_min_C5 values are controlling pinch point locations, pinch points are located between 100° F. and 160° F., C1 controls pinch location at (100° F.) at the current existing conditions, C1 continues to control pinch location at ΔT_min_H4>26° F., while the rest are unchanged, and that H4 controls the pinch point location (according to its Ts) at any ΔT_min_H4<26° F., while the rest is unchanged, but upon reducing ΔT_min_H2 to zero, C5 controls the pinch location at (140° F.) for any combinations of ΔT_min_H4 and ΔT_min_H2 at their lower bounds (e.g. 5° F. and 11° F. respectively). It can also be seen/determined that ΔT_min_H4 value reduction has the highest impact on the problem waste heat recovery, that the optimal pinch for minimum number of units is at 140° F., and that the optimal pinch for heat recovery is also at 140° F. It can be further seen/determined that the two cross pinch matches (H4-C3, H1-C2) result in about a 10% lost-in-topology potential energy recovery.

Note, referring to hot stream H3 and cold stream C4, when we have this special case of such hot stream-cold stream combination having a hot stream minimum approach temperature that results in a hot stream supply temperature (Ths) equal to the cold stream target temperature (Tct) and equal hot stream and cold stream heat capacity flow rates (FCpH=FcpC), matching these two streams in one HE unit across the pinch temperature does not create a cross pinch situation, and thus, need not be corrected.

Figure 59:
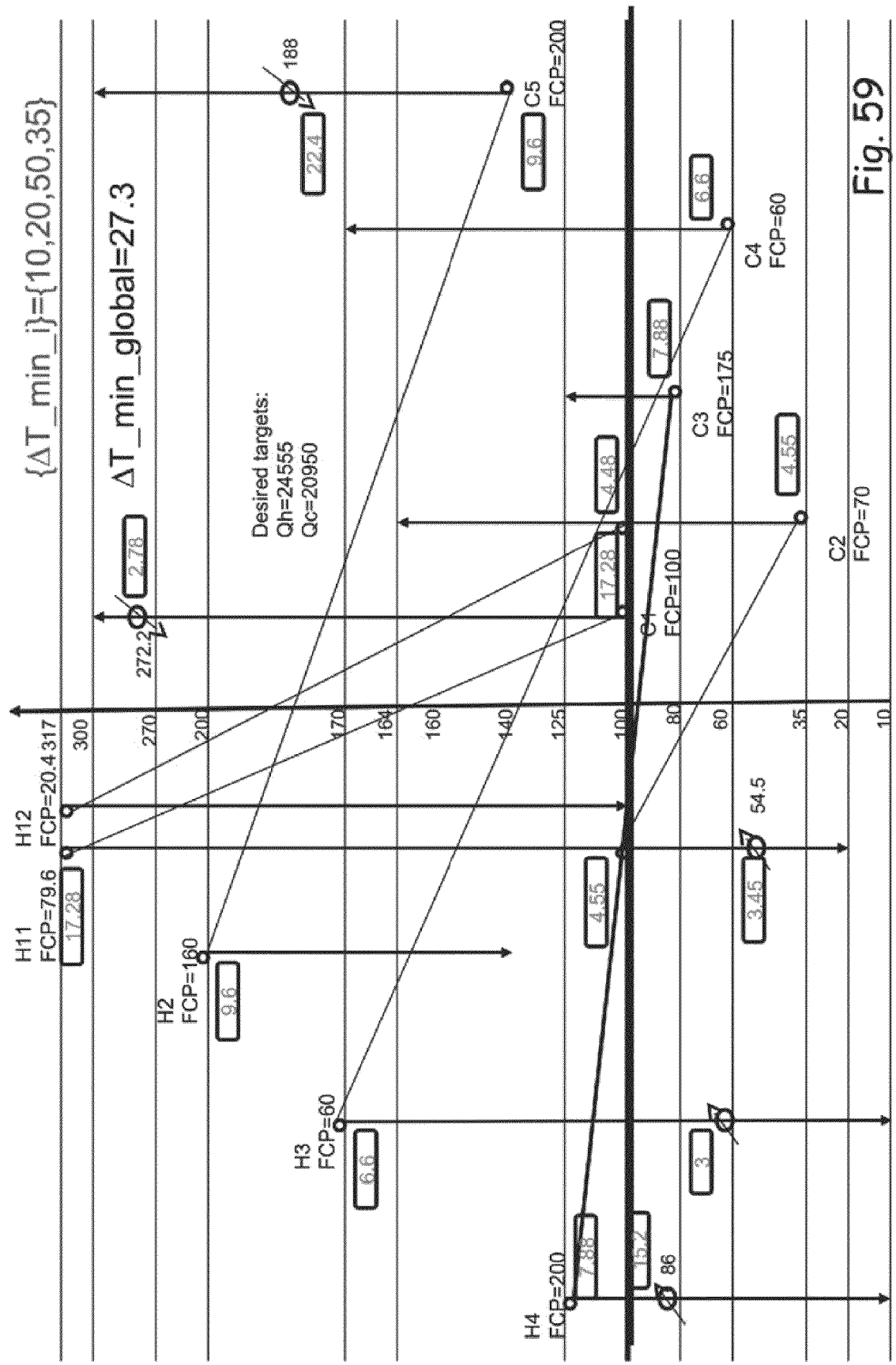
Figure 60:
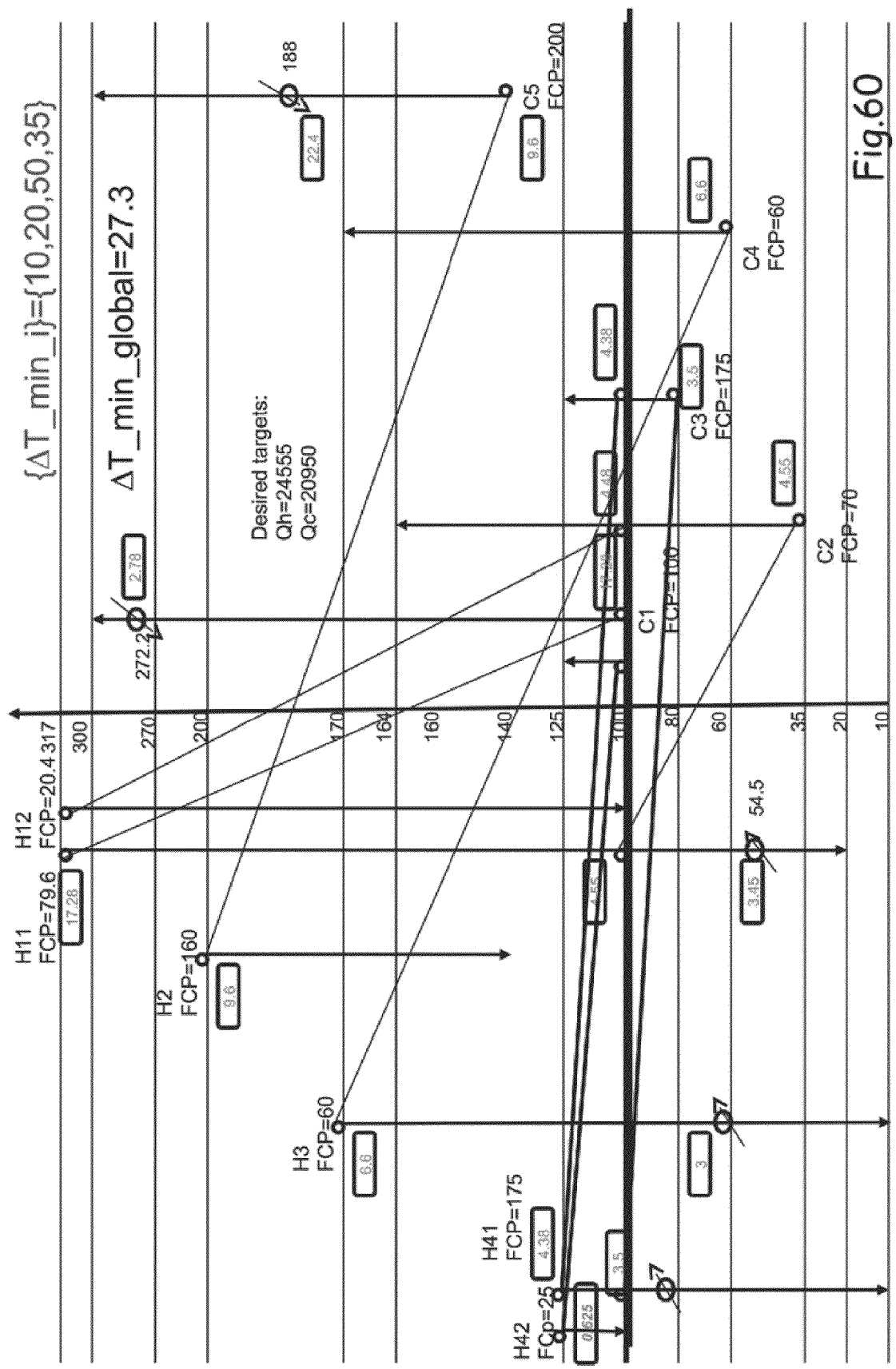

FIG. 59 illustrates correction of one of the cross-pinch matches (the H1-C2 match), splitting up stream H1, and the addition of a new HE unit (H12-C2) with no change in ΔT_min_i, for a resulting additional 1.92 MW in waste heat recovery. FIG. 60 illustrates correction of the H4-C3 cross pinch match through splitting H4 and reconnecting H41 to C3 both above and below the pinch. Note, the rest of desired saving (0.625 MW) can not be obtained fully according to this design direction because there is no available cold match for H42 at the pinch with utility path. Hence, major changes will be needed.

Figure 61:
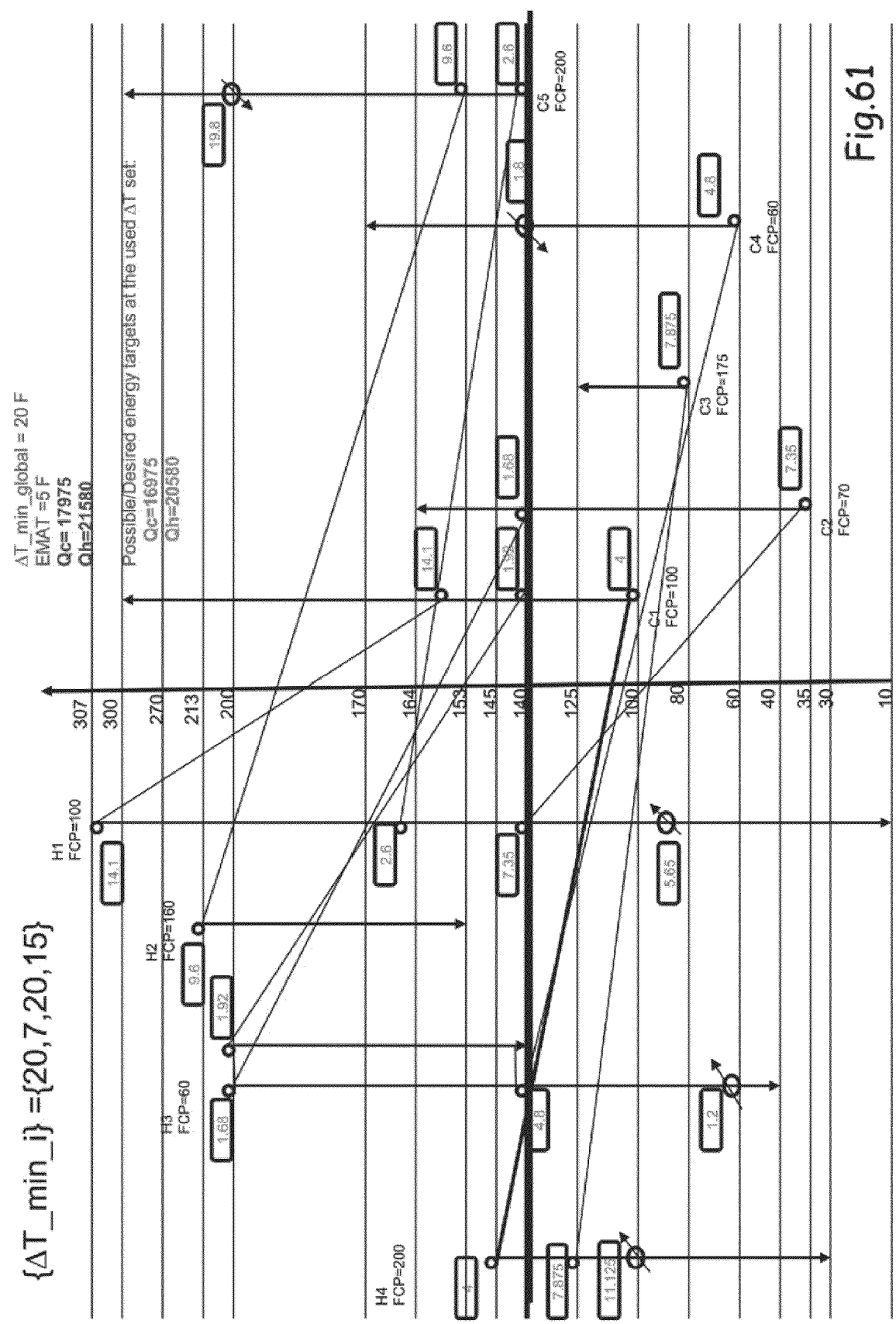

FIG. 61 illustrates another exemplary structure using an alternative set of ΔT_min_i and which results in repositioning of the pinch to 140° F. Note, the H4-C1 cross pinch heat transfer match would be difficult to correct in future retrofits to recover extra heat, as discussed above. Correspondingly, heat lost due to the wrong match across the pinch, even with a further reduction in and values within the {ΔT_min_i} set would be difficult to recover in future retrofits.

Figure 62:
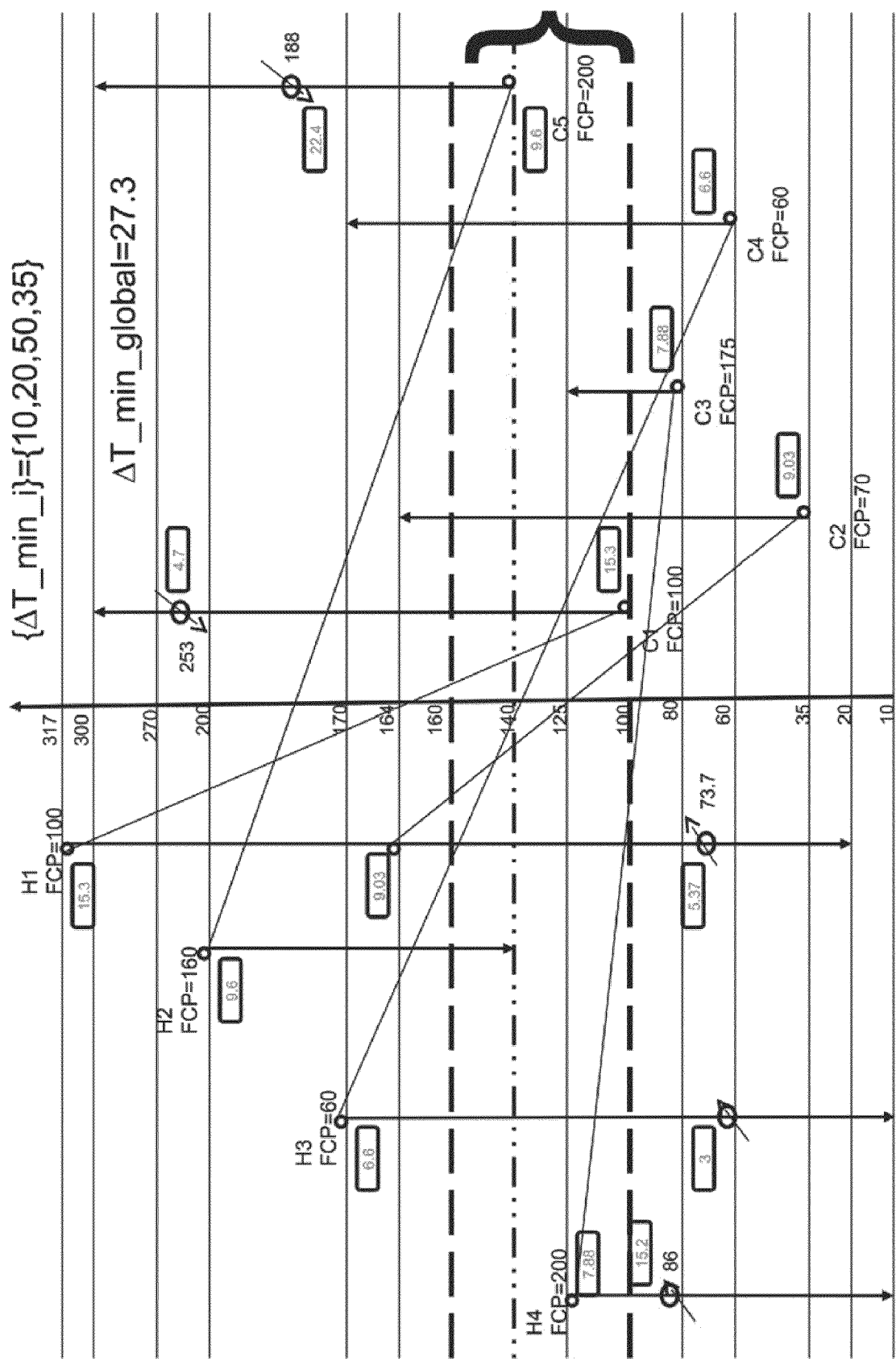

FIG. 62 illustrates the exemplary structure of FIG. 57 illustrating the Pinch interval extending between 100° F. and 160° F. determined according to the exemplary process. According to the exemplary process, the minimum number of HE units required can be determined as follows: 16 HE units for the 160° F. pinch, 14 HE units for the 140° F. pinch, and 15 HE units for the 100° F. According to an embodiment of the process, if and only if the current pinch location is the optimal one, mark the cross pinch and utility violators and adjust the structure to eliminate lost-in-topology energy as a result of due to using less than minimum number of units and wrong matching. In this example, however, the lab, test indicates that the optimal pinch location is 140° F. Note, this feature of being able to adjust the pinch point location to an ultimate selection, according to a preferred configuration, can be important as it enables the designer to be in control of the retrofit solutions selection The lack of this ability is a major drawback in the mathematical programming methods since as soon the model is formulated and the objective function and data base are in place, the designer has no control on the output.

Figure 63:
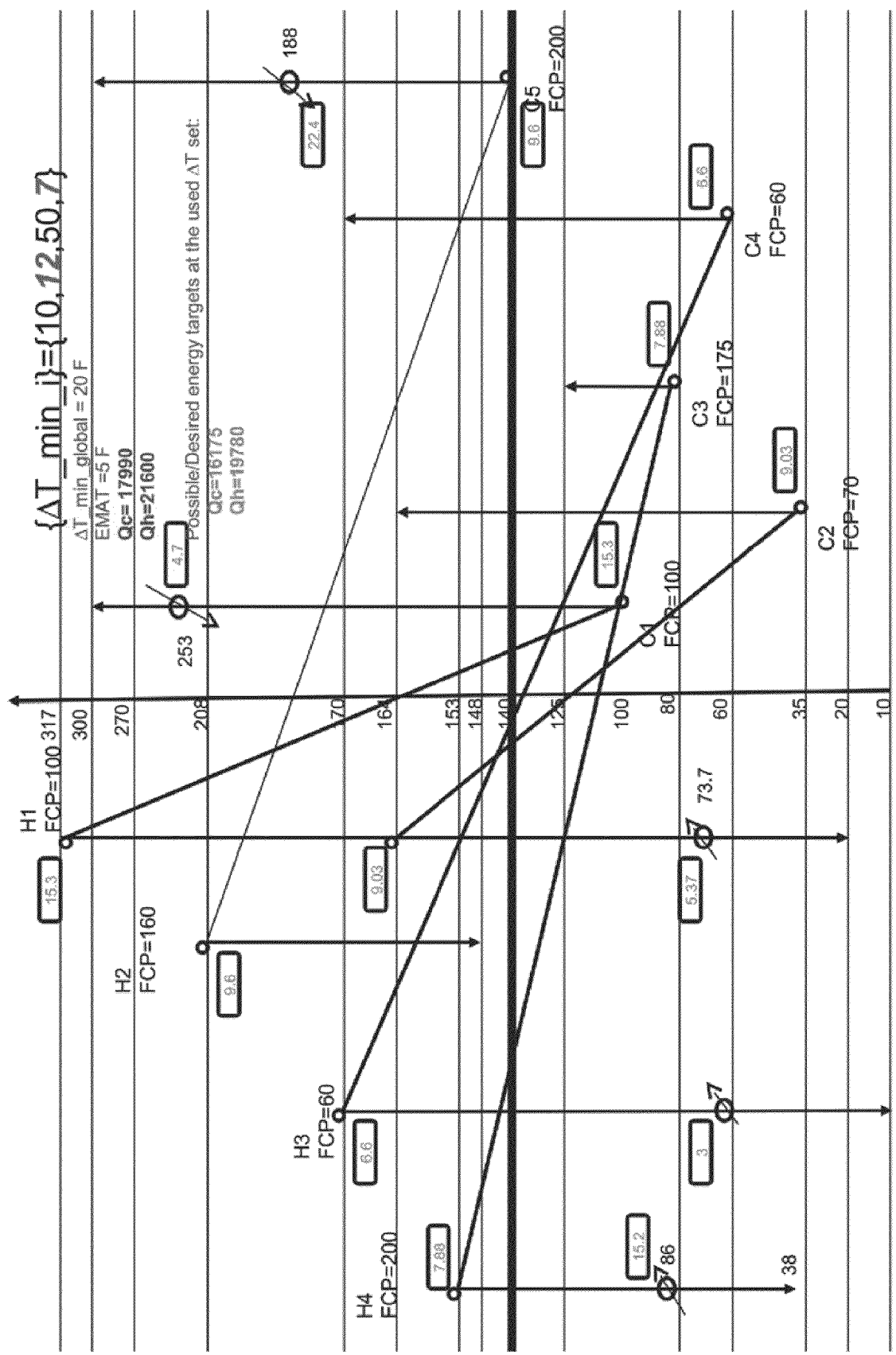

FIG. 63 illustrates the reduction in the ΔT_min_i values for H2 and H4 in order to shift the pinch location to 140° F. After selecting the optimal pinch location, the process, as before, functions to calculate new targets, mark cross the pinch and utility violators, and to eliminate lost-in-topology energy due to using less than the minimum w.r.t number of units and due to wrong matching. Note, currently the H3-C4 match is not considered a cross pinch match but maybe in future retrofits upon reducing ΔT_min_H3. Note also, the initial design according to an embodiment of the present invention uses 4 HE units less than the required minimum (14 HE units for the 140° F. pinch location). Further, the initial design uses the same ΔT_min_global as that used by Floudas.

Figure 64:
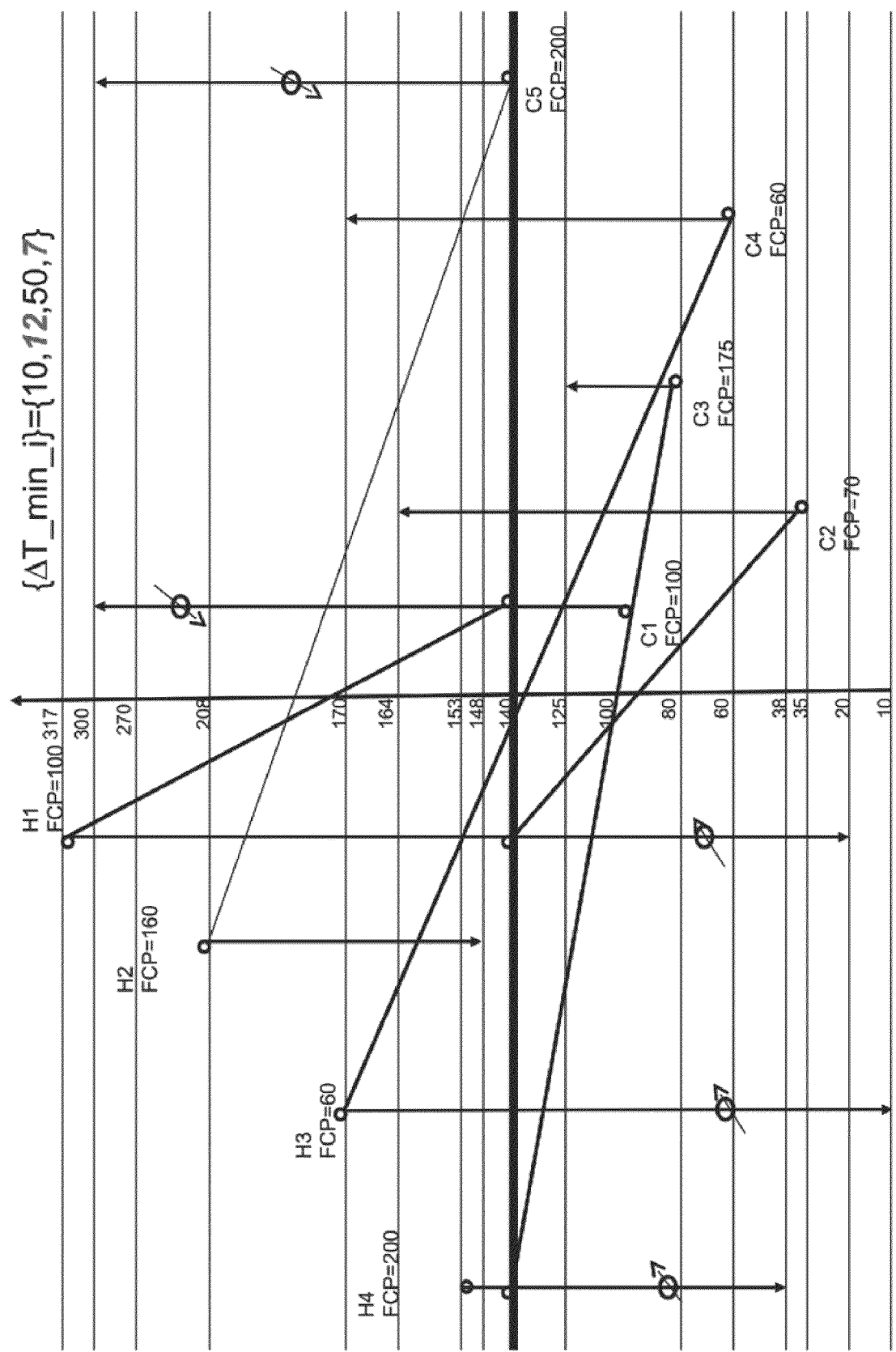
Figure 65:
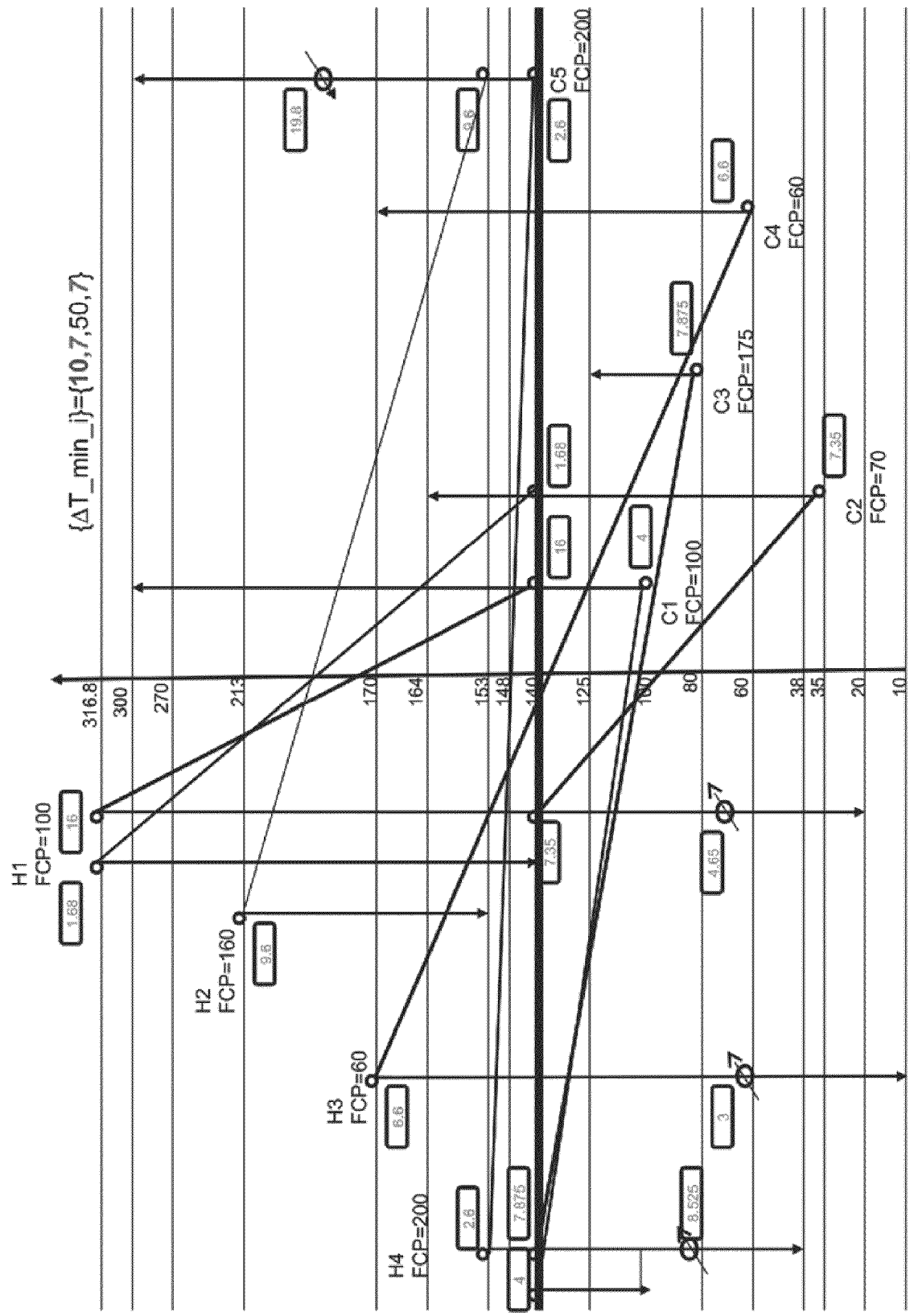

FIG. 64 illustrates modification of the connections between H4-C3, H1-C2, and H1-C1 to eliminate cross pinch matches, with future cross pinch matching of the H3-C4 match in mind. FIG. 65 further illustrates performing stream splitting (here, H1 and H4), change matching, and manipulation of $\Delta T\_min\_i$ (here, $\Delta T\_min\_H2$) to balance the loads using the above described rules, resulting in removal of one C1 heater, a 10% extra saving in cooling, an 8% extra saving in heating, utilization of 12 HE units instead of 14 HE units, and a retrofit-able topology for future retrofit projects. Note, the selected $\Delta T\_min\_i$ set almost provides the $\Delta T\_global$ used by Floudas.

Figure 66:
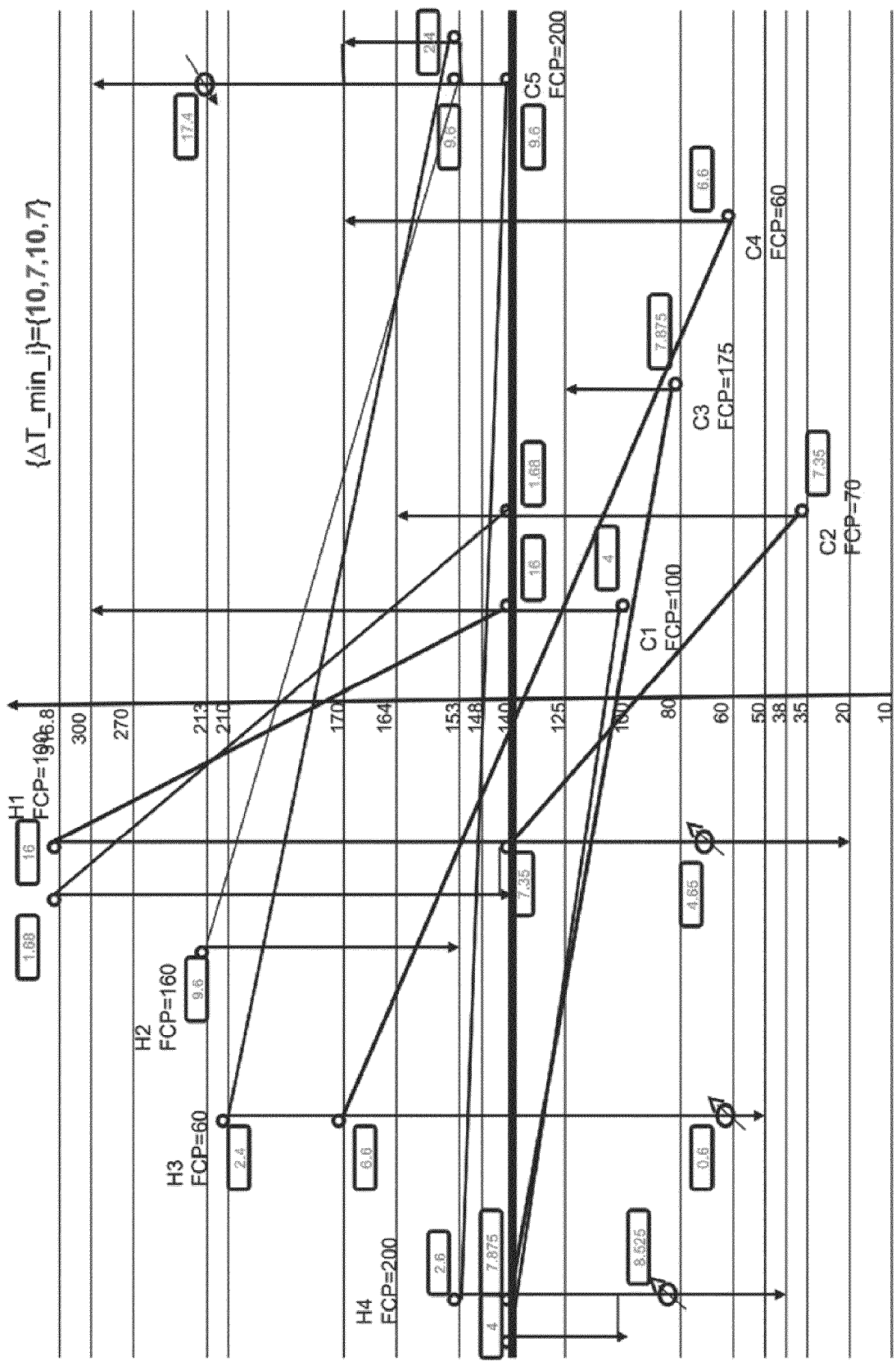

FIG. 66 illustrates a final retrofit whereby the $\Delta T\_min\_i$ for H3 is reduced, followed by performing stream splitting of C5 and the addition of a new H3-C5 HE unit, resulting in a 23% extra saving in cooling duty, 19.5% extra saving in heating duty, and utilization of 13 HE units instead of 14 required by Floudas.

Figure 67:
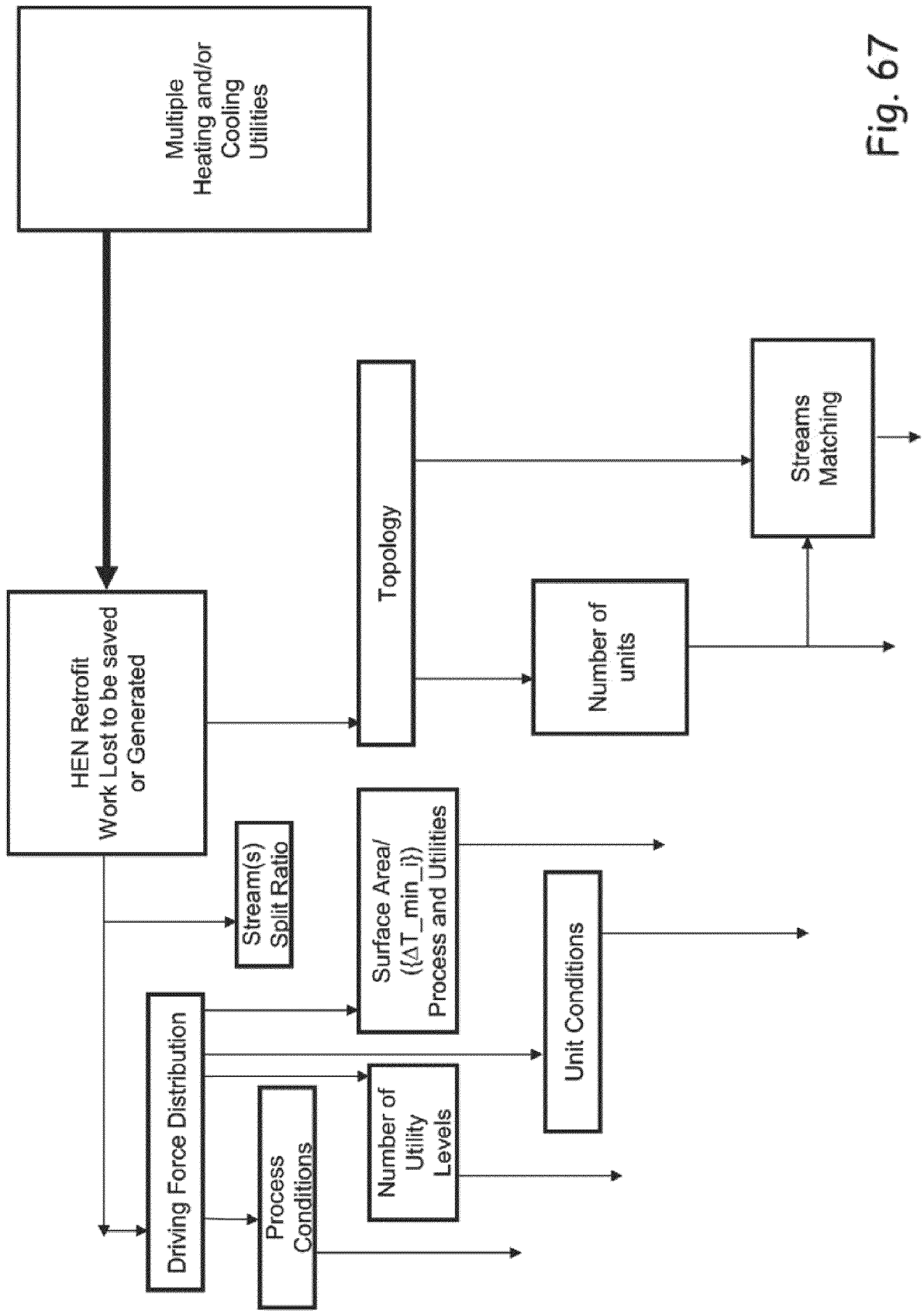
FIG. 67 is a schematic block diagram illustrating the energy loss anatomy for an existing multiple utility HEN according to an embodiment of the present invention.

FIGS. 67-72 illustrate HEN retrofit with retrofit in mind utilizing the above described revolutionary approach with decoupled evolutionary solutions for a multiple utility HEN. The prior examples generally referred the energy loss anatomy for an existing single utility HEN. FIG. 67 illustrates the energy loss anatomy for an existing multiple utility HEN. Although many principles described with respect to a single utility HEN are directly transportable to the multiple utility HEN analysis, there are some differences that should be discussed. For example, according to the exemplary configuration, the lost-in-topology energy quality/ideal work to be saved in the HEN retrofit=$T0*\{(\Sigma Q\_i/Tout\_i)\_before\ retrofit-(\Sigma Q\_i/Tout\_i)\ after\ retrofit\}$, where $T\_out\_i$=Refrigeration temperature at level i, $Q\_i$=Refrigeration duty at temperature level ($T\_out\_i$), and $T0$=Ambient temperature.

Figure 68:
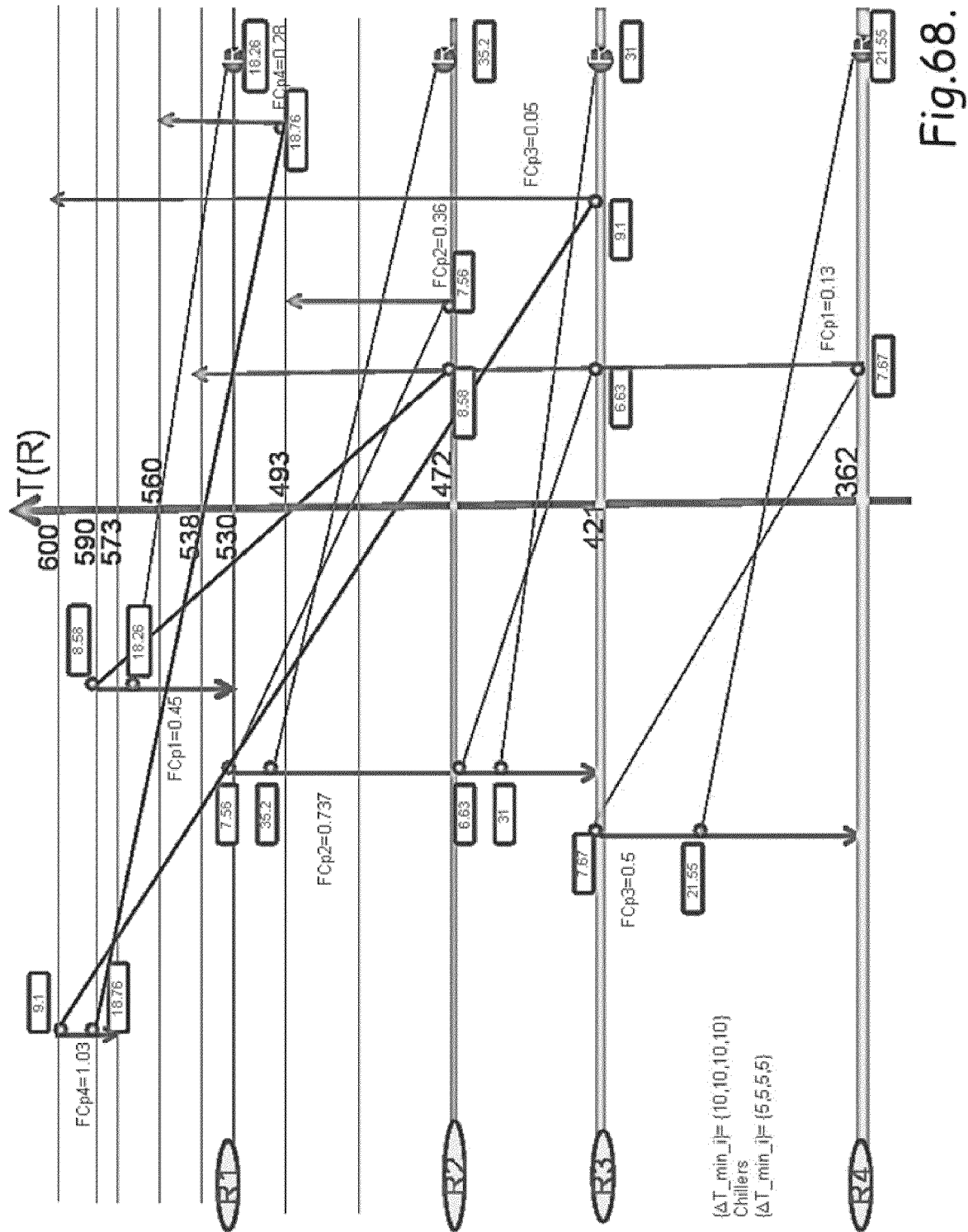
FIG. 68 is a schematic diagram illustrating a multiple utility HEN according to an embodiment of the present invention.
Figure 69:
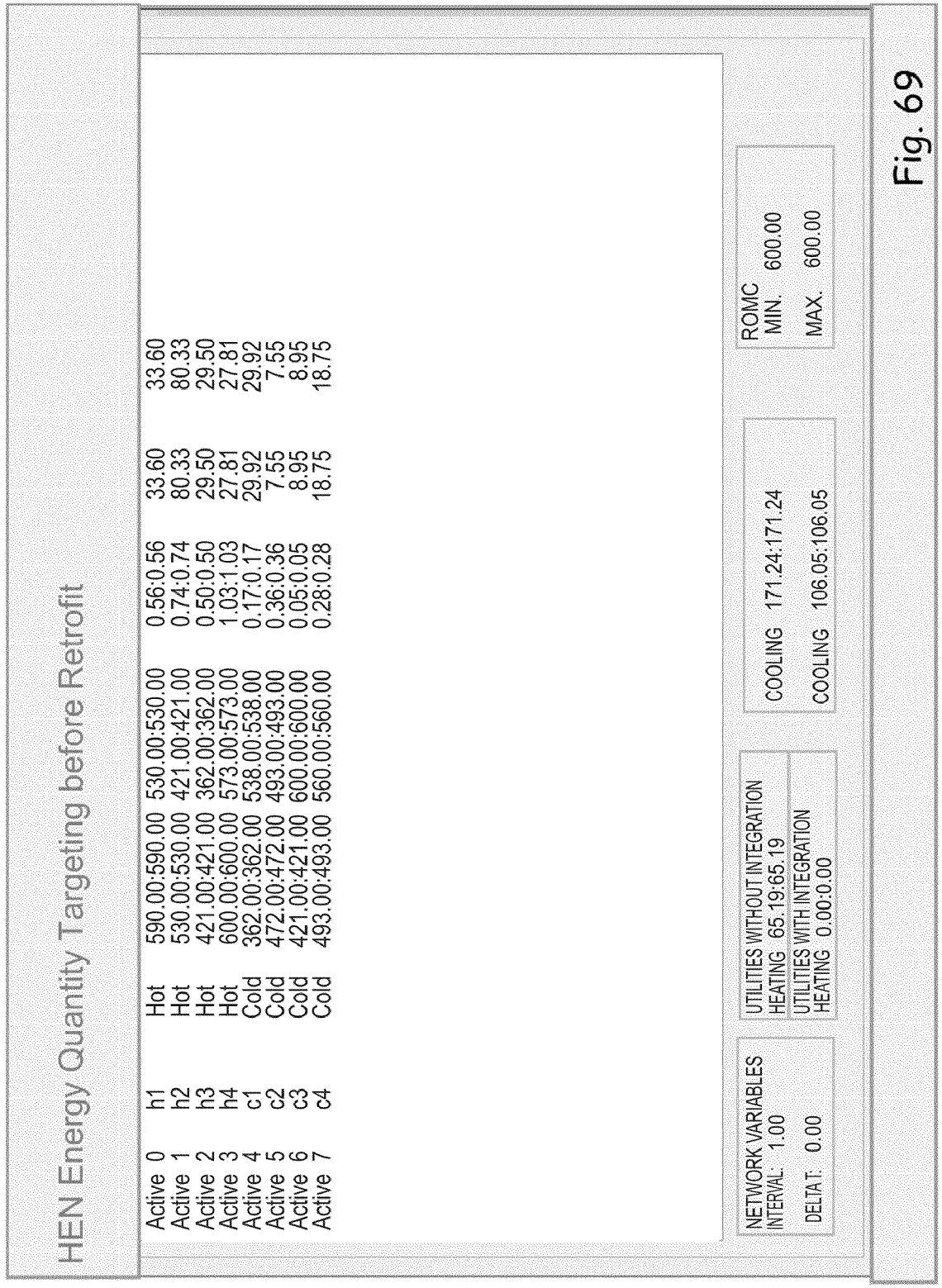
FIG. 69 is a graphical depiction of a data entry page for the network described in FIG. 68 according to an embodiment of the present invention.
Figure 70:
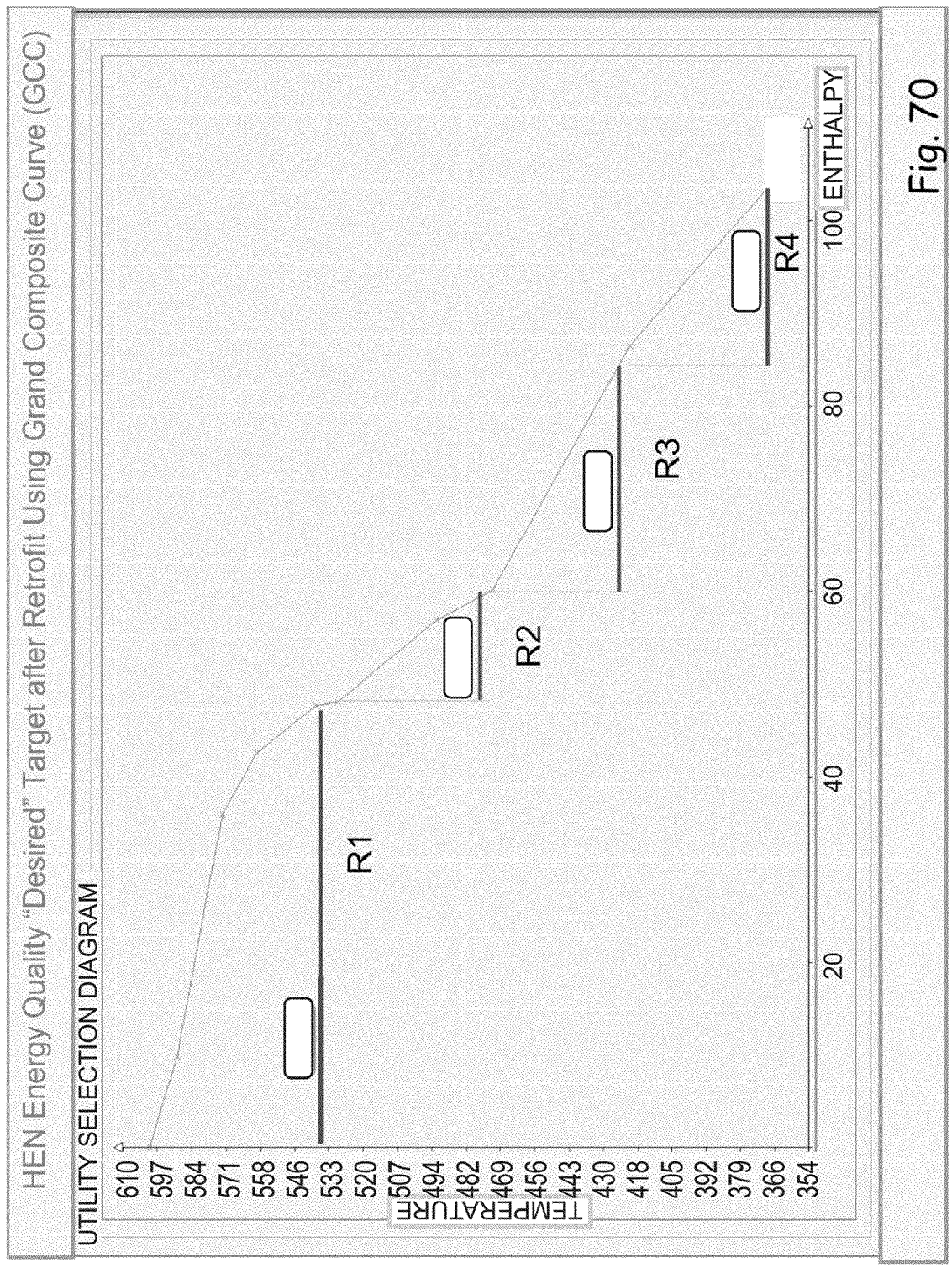
FIG. 70 is a graphical depiction of energy quality targets after retrofit using a grand composite curve.
Figure 71:
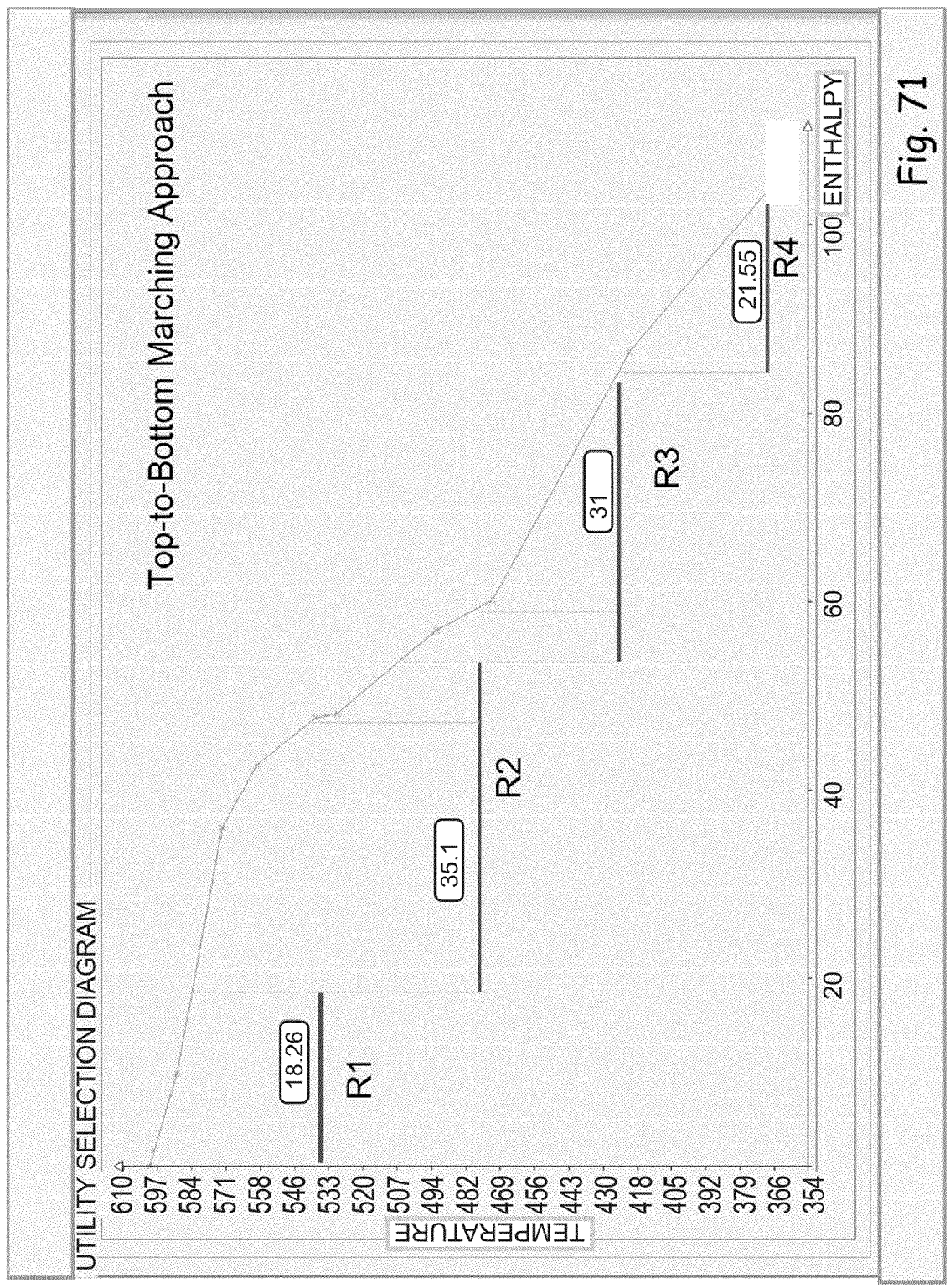
FIG. 71 is a graphical depiction of energy quality/work lost target after retrofit using a grand composite curve.
Figure 72:
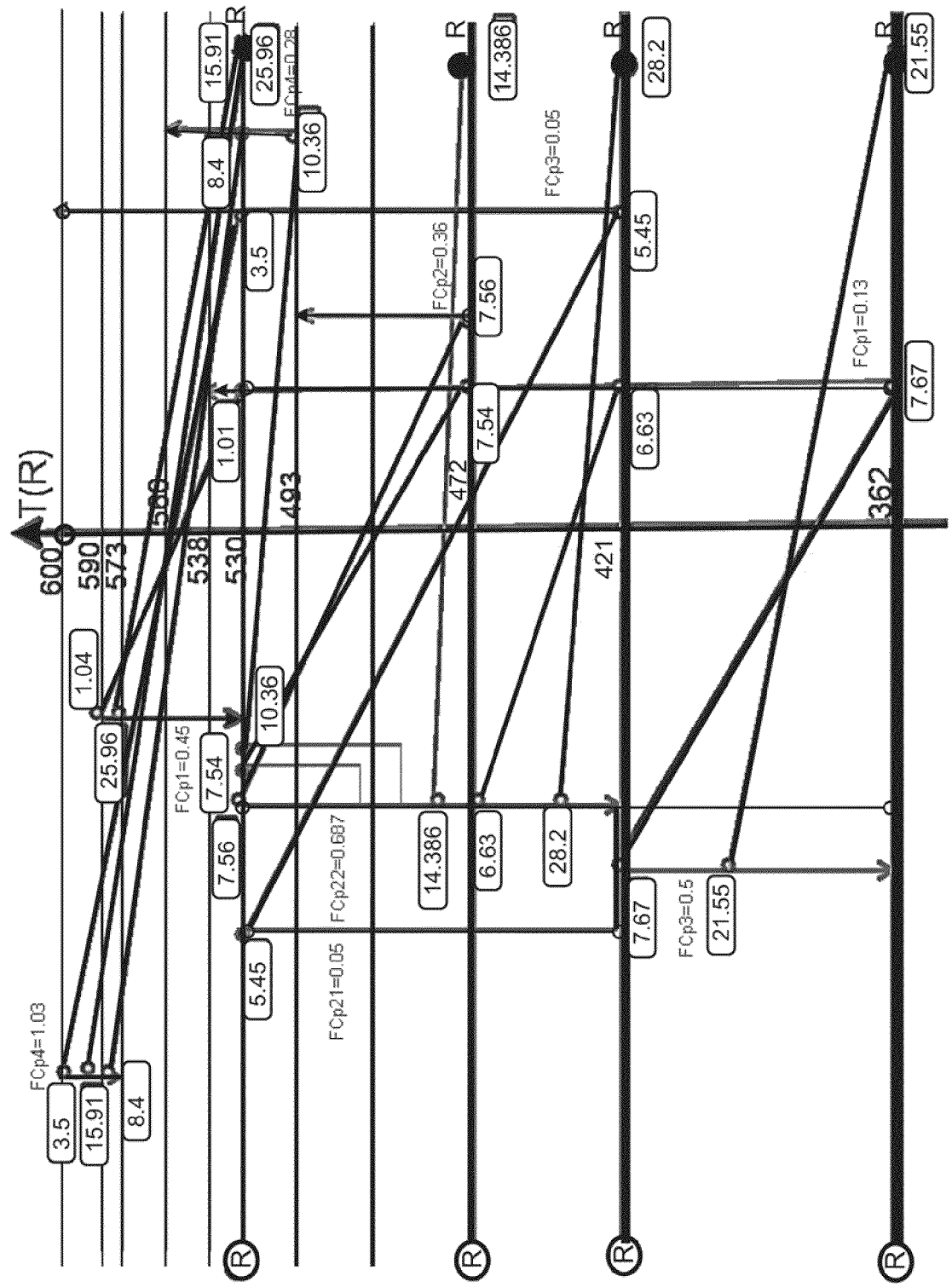
FIG. 72 is a graphical depiction of the HEN of FIG. 68 after further retrofitting to account for the multiple utility levels according to an embodiment of the present invention.

FIG. 68 illustrates an example simple network having four refrigeration levels, and FIG. 69 illustrates a data page for energy quality targeting prior to retrofit. As described above, the process first determines the existing network driving force distribution for lifetime decision. As perhaps best shown in FIGS. 70-71 illustrating desired energy quality targets after retrofit and energy quality/work lost, respectively, after such determination is made, the process performs a top-to-bottom marching approach. Finally, as shown in FIG. 72, treating each refrigeration level R as though it were a pinch, the streams are split and rematched. Note, although crossing the second refrigeration level, the split stream FCp21-FCp3 match does not present a problem as it is the special case of having matching flow capacities.

It is important to note that while the foregoing embodiments of the present invention have been described in the context of a fully functional system and process, those skilled in the art will appreciate that the mechanism of at least portions of the present invention and/or aspects thereof are capable of being distributed in the form of a computer readable medium in a variety of forms storing a set of instructions for execution on a processor, processors, or the like, and that embodiments of the present invention apply equally regardless of the particular type of media used to actually carry out the distribution. Examples of the computer readable media include, but are not limited to: nonvolatile, hard-coded type media such as read only memories (ROMs), CD-ROMs, and DVD-ROMs, or erasable, electrically programmable read only memories (EEPROMs), recordable type media such as floppy disks, hard disk drives, CD-R/RWs, DVD-RAMs, DVD-R/RWs, DVD+R/RWs, HD-DVDs, memory sticks, mini disks, laser disks, Blu-ray disks, flash drives, and other newer types of memories, and certain other types of transmission type media such as, for example, digital and analog communication links capable of storing the set of instructions. Such media can contain, for example, both operating instructions and the operations instructions related to the program product 51, and the computer executable portions of the method steps according to the various embodiments of a method of managing heat exchanger network energy efficiency and retrofits for an industrial facility.

Various embodiments of the present invention provide a process which implements a one-by-one reduction of minimum approach temperature values to a minimum values, such as zero, e.g., $\{\Delta T\_min\_i\}=0.0$, individually, and analyzes combinations of the $\{\Delta T\_min\_i\}=0.0$ to obtain insights about the one(s) with the highest impact on energy recovery and to identify the best possible targets, then compares a resulting network with the actual network to identify the lost-in-topology energy (i.e., due to wrong matching practices and using less than minimum no of units) and lost-in-area energy (capital-energy trade-off). The resulting network can be obtained by increasing the number of units to the minimum via adding new coolers and heaters as well as new HE units using streams split. The exemplary process provides the ability to exploit and/or correct current utility paths and create new ones, and if necessary, upon need for only a one time retrofit, to identify, adjust, replace, and/or modify the one that provides the highest impact on process heat recovery upon putting its $\Delta T\_min\_i=0.0$ K.

The exemplary process gives the designer the ability to find a rigorous structure independent process pinch-interval using two $\{\Delta T\_min\_i\}$ sets: the pinch used in the existing network to be retrofitted and a lower bound one. The process gives the designer an ability to move the pinch point (instead of removing the cross matches) to be completely above or below the two matched streams, if possible using process conditions changes and/or $\{\Delta T\_min\_i\}$ optimization in the middle of design if necessary. Beneficially, such feature can enable the designer to be in control of the retrofit solutions selection; the lack thereof being a major drawback in the mathematical programming methods whereby as soon the mathematical programming model is formulated and the objective function and data base are in place, the designer has no control over the output. Further, without such feature, if the designer changes his/her mind regarding some features in the final solution while he/she is seeing the solution progressing/evolving, with mathematical programming methods, the designer will generally be required to return to the beginning of the process.

The exemplary process also includes a lost-in-topology calculation which can give the designer the "pinching matches" impact on the HEN waste heat recovery efficiency under the actual used $\{\Delta T\_min\_i\}$, and the location of such matches network pinch for all pinching matches. Repeating this calculation for each new $\{\Delta T\_min\_i\}$ renders lost-in-topology energy target at each new $\{\Delta T\_min\_i\}$ for all pinching streams, simultaneously.

The exemplary process can depict the problem at two $\{\Delta T\_min\_i\}$ sets, one is the actual one and the second where $\{\Delta T\_min\_i\}=\{0.0\ or\ 1\}$; can select an optimal pinch point location from energy point of view, minimum number of units to be added point of view, or both; calculate the minimum number of HE units at the two cases using the n−1 pinch technology heuristic; utilize a marching technique to discover rigorous retrofit targets upon $\{\Delta T\_min\_i\}$ systematic reduction; discover and correct wrong matching via creating new utilities path(s); and once the topography is defined, to utilize nonlinear programming or other techniques for handling load distribution and streams splits to minimize total additional HEN area.

Various embodiments of the present invention provide several advantages/additional advantages. Such advantages can include introduction of a systematic technique with future retrofit in mind/sight for plant HEN lifetime retrofit. The systematic technique can adapt dynamic programming philosophy to guarantee long term plant retrofit projects are not contradicting each others. This technique can include a long term targeting method for both energy recovery and number of units to be added, conducted under all possible combinations of process parametric and structural modifications, and can provide the analysis of results of an assessment phase and identify rigorous targets and insights for a finding solution phase ahead of any retrofit project initiation. Notably, this is in contrast to process pinch methods which use ad hoc global $\Delta T\_min$ and solutions that are packaged, not inclusive, that do not consider future retrofit, are not robust, and are conducted such that each ad hoc change in global $\Delta T\_min$ changes the whole scheme of solutions without a clear connection among solutions.

The systematic technique can include exhaustion of current utility path(s) systematically, if needed, to be used in an evolutionary mode using re-matching to create optimal utilities paths whereby the best path can be selected systematically via setting $\{\Delta T\_min\_i\}=0.0$, for each hot stream, one by one. Energy targets can be determined for $\{\Delta T\_min\_i\} = \{[\{\Delta T\_min\_i\_lower: \{\Delta T\_min\_i\_Upper\}]\}$, where the upper $\{\Delta T\_min\_i\}$ is the energy target currently attainable in the existing network before first retrofit project and the lower $\{\Delta T\_min\_i\}$ set is a lower bound set or a new set determined for the last retrofit project conducted in the future along the lifetime of the facility, are calculated. Evolutionary implementation of the desired modifications, using repeated simulation approach to select the phased modification that renders highest benefit/cost ratio can now become easy since the end game is defined. Such a revolutionary-based approach with next move(s) in mind/sight for a known number of steps is possible as all the moves of the pinch location can be captured ahead of the retrofit project finding solutions phase at the method targeting phase. Even the one-time only retrofit project is also doable using the same rules of this systematic technique.

The systematic technique can also include identifying best process changes for enhanced waste heat recovery with and without topology constraints and at each topology change as well as under all possible combinations of process and topology changes for existing HEN. The systematic technique can also include identifying and targeting for each topology constraint (if more than one exists) and define the ones with the best and worst impact on waste energy recovery (e.g., identify lost-in-topology energy components). The systematic technique can also include $\{\Delta T\_min\_i\}$ set values optimization, and development of a process pinch locations map for all problem possible $\{\Delta T\_min\_i\}$ set.

The systematic technique can also include the provision of a new abstract graphical representation/drawing of the current network, that enable the designer find retrofit solutions just via visual inspection. The unique graphical display can facilitate the identification of the hot stream(s) and/or the cold stream(s) that controls the pinch point location. Knowing such stream(s) ahead of deciding any modification can be considered a priori for any successful modification in both process conditions and HEN topology. The locating of the problem process pinch map is also useful to complete the picture of the process pinch interval especially when there is no process pinch (in threshold applications) and in cases like CDU in which we have non-process-pinch points. The stream(s) having highest impact on energy recovery upon reducing its $\Delta T\_min\_i$ can be located and/or re-located on utility path(s), via re-matching.

Various embodiments of the present invention include methods for HEN waste energy quantity or quality recovery for plant lifetime retrofit, which include: new HEN representation methods that enable plant engineers check the energy efficiency of the existing HEN from the first sight; new representation methods that enable the process designer to check HEN new grassroots design energy efficiency from the first sight; and new HEN assessment and find solution methods that draw the map of stream(s) controlling pinch point locations and identify the right sequence of retrofit projects that do not lead to contradiction in the future projects with the today projects. The new HEN representation, assessment, and find solution methods can include those to identify the stream(s) that have the highest impact on the problem waste energy recovery to create the best $\{\Delta T\_min\_i\}$ set; and provide guidelines for HEN retrofit solutions in an evolutionary sequence that guarantee no future violation, provide procedures for HEN multiple-utilities retrofit for waste energy quality targeting and HEN multiple-utilities retrofit solutions finding.

Various embodiments of the methods include those that render a revolutionary solution approach but with decoupled evolutionary modifications to enable the designer to implement a bounded part of the solution in sequence without harming future retrofit projects. Where none of the conventional methods consider that plant life-time retrofit is needed sometimes for more than 30 years, a preferred implementation considers and handles lifetime retrofit problems systematically. Where conventionally there are no assurances or guarantees that retrofit actions taken now at the current retrofit project will not contradict with that needed later in future retrofit projects, according to the preferred implementation, such actions are anticipated and accounted for. Where the future plot plan is not considered in both pinch method and network pinch methods, according to the preferred implementation, a plot plan is provided to and used by the designer before any retrofit projects solution to enable him/her to decide on/select the maximum number of HE units to be added along the lifetime of the plant retrofit.

Further, where targeting for systematic reduction of $\{\Delta T\_min\_i\}$ is not considered in both pinch method and network pinch retrofit methods, the preferred implementation utilizes such methodology in conjunction of the marching technique described in U.S. Pat. No. 7,698,022. Where the fact that the pinch point changes its locations due to $\Delta T\_min$ modifications is not considered in both process pinch and network pinch methods, making the method a "shooting in the dark" approach, the preferred implementation not only considers pinch location changes but targets for the optimal pinch point location and finds retrofit solutions that take into consideration all possible pinch point location changes. Where none of the conventional methods identify the optimal pinch point from both energy consumption and minimum-number-of-units points of view is not done, according to the preferred implementation, such identification is made to enhance the design analysis. Also, where conventional methods fail to identify stream(s) that control the pinch point location, according to the preferred implementation, such identification is made to guide the future retrofit projects. In fact, according to the preferred implementation, both pinch interval and optimal pinch identification can be made, simultaneously, under all possible combinations of changes in parametric and structural process conditions.

Where the impact of using less than the right number of units on energy recovery is not considered during the targeting and find retrofit solutions phases in both pinch method and network pinch method, it is considered in this invention.

Where there is no conventional targeting step or systematic methodology to target for impact of wrong matches and its correction, in a preferred implementation targeting is complete and includes all possible modifications such as process changes, reductions in ({$\Delta T\_min\_i$}), correction of wrong matches and adding of new minimum number of units. Where the network pinch method is not systematically applicable at all threshold problems, embodiments of the present invention can work for any possible problem/application, pinched or threshold. Where none of the conventional methods do not consider systematic process conditions modifications (parametric and structural) for HEN retrofit, simultaneously, such conditions are analyzed according to the or implementation.

Due to the various combinations of the above described features, decoupled evolutionary solutions are possible with an implementation strategy that enables future retrofit projects. Such approaches can cover different types of HEN retrofitting projects, such as: revolutionary-based solution-evolutionary-based retrofit projects implementation with limited number of pre-defined retrofits; evolutionary-based approaches with all next retrofit/move(s) in mind; one-time evolutionary retrofit projects; and one-time revolutionary approach project. Beneficially, the various combinations also provide a systematic process of addressing wrong matching, minimum number of units used, and process conditions and ({$\Delta T\_min\_i$}) used to provide a lifetime planning/retrofit management capability.

This patent application is a continuation-in-part of U.S. patent application Ser. No. 12/898,475, filed Oct. 5, 2010, titled "Systems, Program Product, and Methods For Synthesizing Heat Exchanger Networks That Account For Future Higher Levels of Disturbances and Uncertainty and identifying Optimal Topology For Future Retrofit," which claims priority to the benefit of U.S. Provisional Patent Application No. 61/356,900, filed Jun. 21, 2010, titled "Systematic Synthesis Method and Program Product For Heat Exchanger Network Life-Cycle Switchability and Flexibility Under All Possible Combinations of Process Variations" and U.S. Provisional Application No. 61/256,754, filed Oct. 30, 2009, titled "System, Method, and Program Product for Synthesizing Non-Constrained and Constrained Heat Exchanger Networks and Identifying Optimal Topoloy for Future Retrofit," and which is a continuation-in-part of U.S. patent application Ser. No. 12/715,255, filed Mar. 1, 2010, titled "System, Method, and Program Product for Targeting and Optimal Driving Force Distribution in Energy Recovery Systems" which is a continuation of U.S. patent application Ser. No. 11/768,084, filed on Jun. 25, 2007, now U.S. Pat. No. 7,698,022, titled "System, Method, and Program Product for Targeting and Optimal Driving Force Distribution in Energy Recovery Systems," which claims priority to and the benefit of U.S. Provisional Patent Application No. 60/816,234, filed Jun. 23, 2006, titled "Method and Program Product for Targeting and Optimal Driving Force Distribution in Energy Recovery Systems," U.S. patent application Ser. No. 12/767,217, filed Apr. 26, 2010, titled "System, Method, and Program Product for Synthesizing Non-Constrained and Constrained Heat Exchanger Networks," U.S. patent application Ser. No. 12/767,275, filed Apr. 26, 2010, titled "System, Method, and Program Product for Synthesizing Non-Thermodynamically Constrained Heat Exchanger Networks," and U.S. patent application Ser. No. 12/767,315, filed Apr. 26, 2010, titled "System, Method, and Program Product for Synthesizing Heat Exchanger Networks and Identifying Optimal Topology for Future Retrofit," and U.S. patent application Ser. No. 12/575,743, filed Oct. 8, 2009, titled "System, Method, and Program Product for Targeting and Identification of Optimal Process Variables in Constrained Energy Recovery Systems; and is a continuation-in-part of U.S. patent application Ser. No. 12/767,315, filed Apr. 26, 2010, titled "System, Method, and Program Product for Synthesizing Heat Exchanger Networks and Identifying Optimal Topology for Future Retrofit," which claims priority to U.S. Provisional Patent Application No. 61/256,754, filed Oct. 30, 2009, titled "System, Method, and Program Product for Synthesizing Non-Constrained and Constrained Heat Exchanger Networks and Identifying Optimal Topology for Future Retrofit; and is related to U.S. patent application Ser. No. 12/480,415, filed Jun. 8, 2009, titled "System, Program Product, and Related Methods for Global Targeting of Process Utilities Under Varying Conditions" and U.S. patent application Ser. No. 13/041,087, filed Mar. 4, 2001, titled "Methods for Heat Exchanger Network Energy Efficiency Assessment and Lifetime Retrofit," each incorporated herein by reference in its entirety.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification.

That claimed is:

1. A system to manage heat exchanger network energy efficiency and retrofits for an industrial facility having a plurality of process streams comprising a plurality of hot process streams and a plurality of cold process streams, the system comprising:

a heat exchanger network analysis and design computer having a processor and memory in communication with the processor to store software and database records therein;

at least one database stored in memory accessible to the heat exchanger network analysis and design computer; and heat exchange network analysis and design program product stored in the memory of the heat exchange network analysis and design computer to manage heat exchanger network energy efficiency and retrofits for an industrial facility, the program product including instructions that when executed by the heat exchange network analysis and design computer cause the computer to perform the operations of:

identifying one or more process streams that primarily control a pinch point location for an existing heat exchanger network, determining an optimal pinch point location that provides one or more of the following: a maximum waste energy recovery and a minimum number of required heat exchanger units for a given set of process conditions, and determining an optimal heat exchanger network retrofit projects sequence extending between a current heat exchanger network retrofit project satisfying a current desired waste energy recovery goal and a future heat exchanger network retrofit project satisfying a final waste energy recovery goal.

2. A system as defined in claim 1, wherein the operation of determining an optimal heat exchanger network retrofit projects sequence comprises:

establishing a continuum of a plurality of sequential retrofit plans based upon an increase in utility costs exceeding a corresponding increase in capital expenditures to increase energy efficiency which do not conflict with each respective prior retrofit plan within the sequence, the continuum of the plurality of sequential retrofit plans extending between a current retrofit plan describing a currently desired level of waste energy recovery energy efficiency and a projected desired level of waste energy recovery energy efficiency associated with a time at or near an end of a service life of the facility.

3. A system as defined in claim 1, wherein the operation of determining an optimal heat exchanger network retrofit projects sequence comprises:

determining a continuum of a plurality of prospective incremental pinch point location moves for a corresponding plurality of heat exchanger network retrofit design variations, the plurality of possible incremental pinch point location moves associated with an incremental decrease in stream specific minimum temperature approach values applied to one or more of the plurality of hot process streams, the continuum extending between a pinch point location associated with a heat exchanger network retrofit design satisfying the current desired waste energy recovery goal and a heat exchanger network retrofit design satisfying the final desired waste energy recovery goal, the final desired waste energy recovery goal requiring a larger amount of waste energy recovery than the current desired waste energy recovery goal, each of the corresponding plurality of heat exchanger network retrofit designs providing a progressively larger amount waste energy recovery.

4. A system has defined in claim 1, wherein the operation of determining an optimal sequence of heat exchanger network retrofit includes:

determining a pinch point location map providing an ordered description of a plurality of prospective incremental pinch point location moves associated with a corresponding plurality of heat exchanger network retrofit design variations, the plurality of incremental pinch point location moves resulting from an incremental decrease in stream specific minimum temperature approach values applied to one or more of the plurality of hot process streams, the pinch point location moves extending between a pinch point location associated with a heat exchanger network retrofit design satisfying the current desired waste energy recovery goal and a heat exchanger network retrofit design satisfying the final desired waste energy recovery goal, the final desired energy recovery goal requiring a larger amount of waste energy recovery than the current desired waste energy recovery goal, each of the plurality of incremental pinch point location moves associated with a corresponding heat exchanger network retrofit design providing a progressively larger amount of waste energy recovery.

5. A system as defined in claim 4, wherein the pinch point location map provides a heat exchanger network retrofit projects sequence identifying a plurality of heat exchanger network retrofit projects sequentially to define the optimal heat exchanger network retrofit projects sequence, each subsequent heat exchanger network retrofit project configured so as to not contradict any previous projects in the heat exchanger network retrofit projects sequence.

6. A system as defined in claim 1, wherein the operations further comprise:

incrementally decreasing stream specific minimum temperature approach values applied to one or more of the plurality of hot process streams to identify a plurality of incremental pinch point location moves to thereby define a plurality of heat exchanger network retrofit designs;

identifying each hot process stream-cold process stream combination in each respective heat exchanger network design that is exchanging heat across an optimal pinch point defining one or more cross-pinch heat exchange conditions;

performing one or more of the following rematching techniques to remove any cross-pinch heat exchange condition in each respective heat exchanger network design: connecting an affected hot to a different cold process stream and adding additional heat exchanger units above and below the pinch point;

performing one or more of the following after performing the one or more rematching techniques to remove any cross-pinch heat exchange condition in each respective heat exchanger network design:

rematching one or more of the plurality of process streams to account for one or more non-process-pinch points when existing, and rematching one or more of the plurality of process streams to account for multiple refrigeration levels when existing; and analyzing the resulting structure in each respective heat exchanger network design to determine feasibility of continued retrofits to thereby form the optimal heat exchanger network retrofit projects sequence.

7. A system as defined in claim 1, wherein the operations further comprise performing the following for each of a plurality of heat exchanger network designs:

incrementally decreasing stream specific minimum temperature approach values applied to one or more of the plurality of hot process streams to identify a plurality of incremental pinch point location moves defining a plurality of pinch point locations;

identifying a hot process stream-cold process stream combination in the respective heat exchanger network design exchanging heat across a selected one of the plurality of pinch point locations defining a cross-pinch heat exchange condition; and performing process condition manipulation, minimum temperature approach value manipulation, or both process condition manipulation and minimum temperature approach value manipulation to move the pinch point location to be completely above or completely below the hot stream and cold stream temperatures associated with the cross-pinch heat exchange condition.

8. A system as defined in claim 1, wherein the operations further comprise:

identifying one or more of the plurality of process streams that control one or more pinch point location moves associated with a current heat exchanger network design that satisfies a desired increase in waste energy recovery prior to constructing a corresponding prospective heat exchanger network design that satisfies the desired waste energy recovery; and identifying each of one or more streams specific turning point temperatures associated with the one or more pinch point location moves.

9. A system has defined in claim 1, wherein the operation of determining an optimal heat exchanger network retrofit projects sequence includes:

receiving minimum temperature approach value data indicating an upper and a lower range of a set of stream-specific minimum temperature approach values, the upper range of stream-specific minimum temperature approach values being a value attainable according to a current structure of the existing heat exchanger network, the lower range of stream-specific minimum temperature approach values being a lower bound set associated with a last retrofit project to be conducted at a future date at an end of the serviceable life of the heat exchanger network for the facility defining the future heat exchanger network retrofit project; and determining a process pinch range interval identifying a ranges of process pinch locations for all anticipated combinations of process conditions and heat exchanger network design modifications responsive to the minimum temperature approach value data.

10. A system as defined in claim 1, wherein the operations further comprise:

incrementally decreasing stream specific minimum temperature approach values applied to one or more of the plurality of hot process streams to identify a plurality of incremental pinch point location moves defining a plurality of different pinch point locations to thereby define a plurality of heat exchanger network retrofit design variations for a heat exchanger network design problem;

determining a minimum number of required heat exchanger units associated with each separate one of the plurality of heat exchanger network retrofit design variations having corresponding different pinch point locations; and determining an optimal pinch point location that provides the minimum number of heat exchanger units.

11. A system as defined in claim 1, wherein the operations further comprise:

incrementally decreasing stream specific minimum temperature approach values applied to one or more of the plurality of hot process streams to identify a plurality of incremental pinch point location moves defining a plurality of different pinch point locations; and determining an optimal pinch point location that provides the maximum waste energy recovery for a given set of process conditions.

12. A system as defined in claim 1, wherein the operations further comprise:

determining a minimum number of required heat exchanger units in a certain heat exchanger network design;

determining an impact on waste energy recovery of using less than a minimum number of required heat exchanger units;

determining the impact on waste energy recovery of wrong matches between one or more of the plurality of hot process streams and one or more of the plurality of cold process streams according to the certain heat exchanger network design; and determining the impact on waste energy recovery of heat exchanger units having a less than optimal heat exchanger unit surface area for the certain heat exchanger network design with respect to capital costs.

13. A system as defined in claim 1, wherein the operations further comprise:

determining a minimum number of heat exchanger units that need to be added to a certain heat exchanger network design to attain a current waste energy recovery capability under existing process conditions and stream specific minimum temperature approach values.

14. A system as defined in claim 1, wherein the operations further comprise performing one or more of the following:

moving a pinch point location for a certain heat exchanger network design through process condition modification of one or more process streams identified as controlling the pinch point location; and moving the pinch point location through minimum temperature approach value modification of the one or more process streams identified as controlling the pinch point location.

15. A system as defined in claim 1, wherein the operations further comprise one or more of the following:

defining an implicit pinch point when desired energy goals dictate a heat exchanger network design having only one but not both of the following classes of utility: a heating utility and a cooling utility; and identifying design enhancement scenarios where a heat exchanger network design problem applied to the existing heat exchanger network and presented to satisfy the final energy recovery retrofit goal becomes a threshold problem during an optimization analysis.

16. Heat exchanger network analysis and design program product to manage heat exchanger network energy efficiency and retrofits for an industrial facility having a plurality of process streams comprising a plurality of hot process streams and a plurality of cold process streams, the program product comprising a set of instructions, stored on a tangible computer readable medium, that when executed by a computer, cause the computer to perform the operations of:

identifying one or more process streams that primarily control a pinch point location for an existing heat exchanger network;

determining an optimal pinch point location that provides one or more of the following: a maximum waste energy recovery and a minimum number of required heat exchanger units for a given set of process conditions; and determining an optimal heat exchanger network retrofit projects sequence extending between a current heat exchanger network retrofit project satisfying a current desired waste energy recovery goal and a future heat exchanger network retrofit project satisfying a final waste energy recovery goal.

17. Program product as defined in claim 16, wherein the operation of determining an optimal heat exchanger network retrofit projects sequence comprises:

establishing a continuum of a plurality of sequential retrofit plans based upon an increase in utility costs exceeding a corresponding increase in capital expenditures to increase energy efficiency which do not conflict with each respective prior retrofit plan within the sequence, the continuum of the plurality of sequential retrofit plans extending between a current retrofit plan describing a currently desired level of waste energy recovery energy efficiency and a projected desired level of waste energy recovery energy efficiency associated with a time at or near an end of a service life of the facility.

18. Program product as defined in claim 16, wherein the operation of determining an optimal heat exchanger network retrofit projects sequence comprises:

determining a continuum of a plurality of prospective incremental pinch point location moves for a corresponding plurality of heat exchanger network retrofit design variations, the plurality of possible incremental pinch point location moves associated with an incremental decrease in stream specific minimum temperature approach values applied to one or more of the plurality of hot process streams, the continuum extending between a pinch point location associated with a heat exchanger network retrofit design satisfying the current desired waste energy recovery goal and a heat exchanger network retrofit design satisfying the final desired waste energy recovery goal, the final desired waste energy recovery goal requiring a larger amount of waste energy recovery than the current desired waste energy recovery goal, each of the corresponding plurality of heat exchanger network retrofit designs providing a progressively larger amount waste energy recovery.

19. Program product has defined in claim 16, wherein the operation of determining an optimal sequence of heat exchanger network retrofit includes:

determining a pinch point location map providing an ordered description of a plurality of prospective incremental pinch point location moves associated with a corresponding plurality of heat exchanger network retrofit design variations, the plurality of incremental pinch point location moves resulting from an incremental decrease in stream specific minimum temperature approach values applied to one or more of the plurality of hot process streams, the pinch point location moves extending between a pinch point location associated with a heat exchanger network retrofit design satisfying the current desired waste energy recovery goal and a heat exchanger network retrofit design satisfying the final desired waste energy recovery goal, the final desired energy recovery goal requiring a larger amount of waste energy recovery than the current desired waste energy recovery goal, each of the plurality of incremental pinch point location moves associated with a corresponding heat exchanger network retrofit design providing a progressively larger amount of waste energy recovery.

20. Program product as defined in claim 19, wherein the pinch point location map provides a heat exchanger network retrofit projects sequence identifying a plurality of heat exchanger network retrofit projects sequentially to define the optimal heat exchanger network retrofit projects sequence, each subsequent heat exchanger network retrofit project configured so as to not contradict any previous projects in the heat exchanger network retrofit projects sequence.

21. Program product as defined in claim 16, wherein the operations further comprise:

incrementally decreasing stream specific minimum temperature approach values applied to one or more of the plurality of hot process streams to identify a plurality of incremental pinch point location moves to thereby define a plurality of heat exchanger network retrofit designs;

identifying each hot process stream-cold process stream combination in each respective heat exchanger network design that is exchanging heat across an optimal pinch point defining one or more cross-pinch heat exchange conditions;

performing one or more of the following rematching techniques to remove any cross-pinch heat exchange condition in each respective heat exchanger network design:
connecting an affected hot to a different cold process stream and adding additional heat exchanger units above and below the pinch point;

performing one or more of the following after performing the one or more rematching techniques to remove any cross-pinch heat exchange condition in each respective heat exchanger network design:
rematching one or more of the plurality of process streams to account for one or more non-process-pinch points when existing, and
rematching one or more of the plurality of process streams to account for multiple refrigeration levels when existing; and analyzing the resulting structure in each respective heat exchanger network design to determine feasibility of continued retrofits to thereby form the optimal heat exchanger network retrofit projects sequence.

22. Program product as defined in claim 16, wherein the operations further comprise performing the following for each of a plurality of heat exchanger network designs:

incrementally decreasing stream specific minimum temperature approach values applied to one or more of the plurality of hot process streams to identify a plurality of incremental pinch point location moves defining a plurality of pinch point locations;

identifying a hot process stream-cold process stream combination in the respective heat exchanger network design exchanging heat across a selected one of the plurality of pinch point locations defining a cross-pinch heat exchange condition; and performing process condition manipulation, minimum temperature approach value manipulation, or both process condition manipulation and minimum temperature approach value manipulation to move the pinch point location to be completely above or completely below the hot stream and cold stream temperatures associated with the cross-pinch heat exchange condition.

23. Program product as defined in claim 16, wherein the operations further comprise:

identifying one or more of the plurality of process streams that control one or more pinch point location moves associated with a current heat exchanger network design that satisfies a desired increase in waste energy recovery prior to constructing a corresponding prospective heat exchanger network design that satisfies the desired waste energy recovery; and identifying each of one or more streams specific turning point temperatures associated with the one or more pinch point location moves.

24. Program product has defined in claim 16, wherein the operation of determining an optimal heat exchanger network retrofit projects sequence includes:

receiving minimum temperature approach value data indicating an upper and a lower range of a set of stream-specific minimum temperature approach values, the upper range of stream-specific minimum temperature approach values being a value attainable according to a current structure of the existing heat exchanger network, the lower range of stream-specific minimum temperature approach values being a lower bound set associated with a last retrofit project to be conducted at a future date at an end of the serviceable life of the heat exchanger network for the facility defining the future heat exchanger network retrofit project; and determining a process pinch range interval identifying a ranges of process pinch locations for all anticipated combinations of process conditions and heat exchanger network design modifications responsive to the minimum temperature approach value data.

25. Program product as defined in claim 16, wherein the operations further comprise:

incrementally decreasing stream specific minimum temperature approach values applied to one or more of the plurality of hot process streams to identify a plurality of incremental pinch point location moves defining a plurality of different pinch point locations to thereby define a plurality of heat exchanger network retrofit design variations for a heat exchanger network design problem;

determining a minimum number of required heat exchanger units associated with each separate one of the plurality of heat exchanger network retrofit design variations having corresponding different pinch point locations; and determining an optimal pinch point location that provides the minimum number of heat exchanger units.

26. Program product as defined in claim 16, wherein the operations further comprise:

incrementally decreasing stream specific minimum temperature approach values applied to one or more of the plurality of hot process streams to identify a plurality of incremental pinch point location moves defining a plurality of different pinch point locations; and determining an optimal pinch point location that provides the maximum waste energy recovery for a given set of process conditions.

27. Program product as defined in claim 16, wherein the operations further comprise:

determining a minimum number of required heat exchanger units in a certain heat exchanger network design;

determining an impact on waste energy recovery of using less than a minimum number of required heat exchanger units;

determining the impact on waste energy recovery of wrong matches between one or more of the plurality of hot process streams and one or more of the plurality of cold process streams according to the certain heat exchanger network design; and determining the impact on waste energy recovery of heat exchanger units having a less than optimal heat exchanger unit surface area for the certain heat exchanger network design with respect to capital costs.

28. Program product as defined in claim 16, wherein the operations further comprise:

determining a minimum number of heat exchanger units that need to be added to a certain heat exchanger network design to attain a current waste energy recovery capability under existing process conditions and stream specific minimum temperature approach values.

29. Program product as defined in claim 16, wherein the operations further comprise performing one or more of the following:

moving a pinch point location for a certain heat exchanger network design through process condition modification of one or more process streams identified as controlling the pinch point location; and moving the pinch point location through minimum temperature approach value modification of the one or more process streams identified as controlling the pinch point location.

30. Program product as defined in claim 16, wherein the operations further comprise one or more of the following:

defining an implicit pinch point when desired energy goals dictate a heat exchanger network design having only one but not both of the following classes of utility: a heating utility and a cooling utility; and identifying design enhancement scenarios where a heat exchanger network design problem applied to the existing heat exchanger network and presented to satisfy the final energy recovery retrofit goal becomes a threshold problem during an optimization analysis.

31. Heat exchanger network analysis and design program product to manage heat exchanger network energy efficiency and retrofits for an industrial facility having a plurality of process streams comprising a plurality of hot process streams and a plurality of cold process streams, the program product comprising a set of instructions, stored on a tangible computer readable medium, that when executed by a computer, cause the computer to perform the operations of:

receiving data indicating a current heat transfer structure of an existing heat exchanger network for an industrial facility;

identifying one or more process streams that primarily control pinch point location for the existing heat exchanger network;

identifying a set of one or more hot process streams having a highest impact on waste energy recovery upon reducing its respective stream specific minimum temperature approach value;

identifying a maximum desired waste energy recovery goal anticipated over a life of the heat exchanger network defining a final waste energy recovery goal; and determining an optimal heat exchanger network retrofit projects sequence identifying a plurality of heat exchanger network retrofit projects sequentially, the heat exchanger network retrofit projects sequence extending between a current heat exchanger network retrofit project satisfying a current desired waste energy recovery goal and a future heat exchanger network retrofit project satisfying the final waste energy recovery goal, the final waste energy recovery goal requiring a larger amount of waste energy recovery than the current desired waste energy recovery goal, the heat exchanger network retrofit projects sequence configured so that each subsequent project within the heat exchanger network retrofit projects sequence does not contradict any of the previous projects within the heat exchanger network retrofit projects sequence.

* * * * *